(12) United States Patent
Liao et al.

(10) Patent No.: US 11,299,581 B2
(45) Date of Patent: Apr. 12, 2022

(54) CONJUGATED POLYMER AND APPLICATION THEREOF

(71) Applicant: RAYNERGY TEK INC., Hsinchu (TW)

(72) Inventors: Chuang-Yi Liao, Hsinchu (TW); Wei-Long Li, Hsinchu (TW); Chia-Hao Lee, Hsinchu (TW)

(73) Assignee: RAYNERGY TEK INC., Hsinchu (TW)

(*) Notice: Subject to any disclaimer, the term of this patent is extended or adjusted under 35 U.S.C. 154(b) by 48 days.

(21) Appl. No.: 16/668,782

(22) Filed: Oct. 30, 2019

(65) Prior Publication Data

US 2020/0140605 A1    May 7, 2020

Related U.S. Application Data

(60) Provisional application No. 62/752,791, filed on Oct. 30, 2018.

(51) Int. Cl.
*C08G 61/12* (2006.01)

(52) U.S. Cl.
CPC ..... *C08G 61/126* (2013.01); *C08G 2261/124* (2013.01); *C08G 2261/149* (2013.01); *C08G 2261/3223* (2013.01); *C08G 2261/3243* (2013.01); *C08G 2261/3246* (2013.01); *C08G 2261/91* (2013.01)

(58) Field of Classification Search
CPC ............ C08G 61/126; C08G 2261/124; C08G 2261/149; C08G 2261/3223; C08G 2261/3243; C08G 2261/3246; C08G 2261/91
See application file for complete search history.

(56) References Cited

U.S. PATENT DOCUMENTS

2013/0048075 A1* 2/2013 Leclerc ................ C08G 61/124
                                                                 136/263

FOREIGN PATENT DOCUMENTS

TW            201518336 A        5/2015

OTHER PUBLICATIONS

Taiwan Intellectual Property Office, "Office Action", dated Mar. 24, 2020.
Taiwan Intellectual Property Office, "Office Action", dated Nov. 3, 2020.

* cited by examiner

*Primary Examiner* — Shane Fang
(74) *Attorney, Agent, or Firm* — WPAT, PC

(57) ABSTRACT

The present invention discloses a conjugated polymer, which is a random copolymer, and with Formula I:

Figure 1:
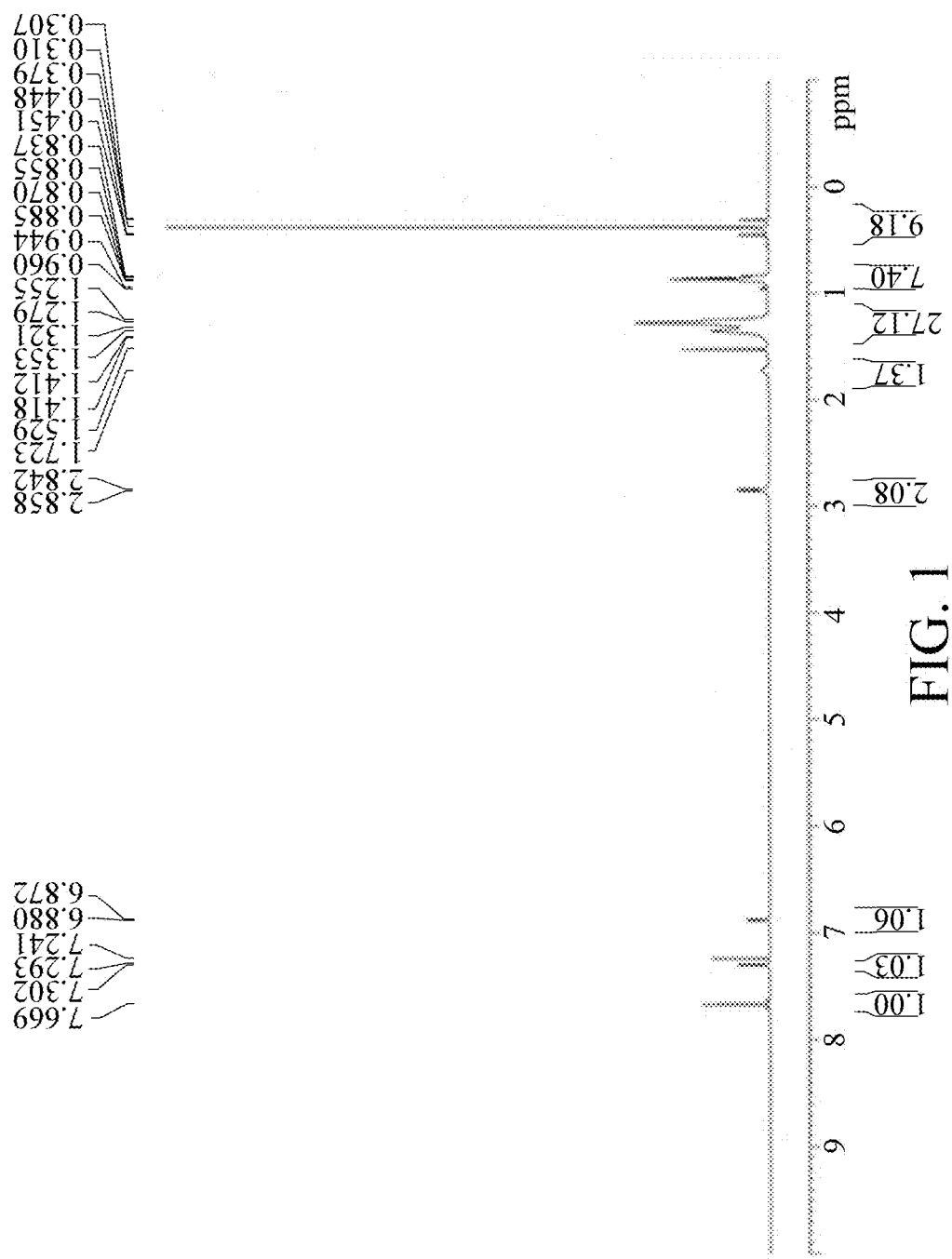

$$-\left[\text{D1}-\pi-\text{A1}-\pi\right]_m-\left[\text{D2}-\pi-\text{A2}-\pi\right]_n-$$

Additionally, the present invention also discloses an organic photovoltaic device comprising the conjugated polymer.

7 Claims, 4 Drawing Sheets

CONJUGATED POLYMER AND APPLICATION THEREOF

The present application is based on, and claims priority from, America provisional patent application No. U.S. 62/752,791, filed on 2018 Oct. 30, the disclosure of which is hereby incorporated by reference herein in its entirety.

BACKGROUND OF THE INVENTION

Field of the Invention

The present invention relates to a novel conjugated polymer, a preparation process and application thereof, and in particular, to an organic photovoltaic device made from the said conjugated polymer.

Description of the Prior Art

Compared to existing silicon solar cells, organic photovoltaic devices have the advantages of lower cost, flexibility, lower toxicity, and large area production. These advantages enhance the competitive advantage of organic photovoltaic devices (also known as macromolecule solar cells or polymer solar cells) in the solar field, thereby addressing the energy and environmental crisis.

Improvements in active layer materials play an important role in high efficiency polymer solar cells. The active layer materials are divided into two parts: donors and acceptors. For acceptor materials, most of them are mainly fullerene derivatives [6,6]-phenyl-C61-butyric acid methyl ester (PCBM) in the early stage, and in recent years, they are mainly non-fullerene materials (IC-based ladder molecules, and IC is an abbreviation for 1,1-dicyanomethylene-3-indanone).

For donor materials, the development of D-A type conjugated polymer is the mainstream, and push-pull electron effect of multi-electron units and electron-deficient units in the conjugated polymer can be used to regulate the energy level and energy gap of the conjugated polymer. Different D-A type conjugated polymers are used to cooperate with different acceptors. A light absorption range of PCBM is in a range from 400 to 600 nm, which is suitable for low energy gap conjugated polymers. A light absorption range of the IC-based ladder molecules are in the range from 700 to 900 nm, which is suitable for cooperating with medium energy gap conjugated polymers. Both of the above combinations can reach photoelectric conversion efficiency more than 10%.

The current state of technological development is that there are many research results of low energy gap conjugated polymers. However, the medium energy gap conjugated polymer materials are still scarce, and they need to be developed by the academic community and the industry to cooperate with a non-fullerene acceptor to reach the photoelectric conversion efficiency more than 10%.

SUMMARY OF THE INVENTION

Traditionally, a conjugated polymer of a donor material is dominated by an alternating conjugated polymer. Different from the prior art, the present invention discloses a random conjugated polymer which is a random copolymer. The advantage of the random conjugated polymer is that different multi-electron units or electron-deficient units can be added to the random conjugated polymer. According to the different ratios of the multi-electron units or electron-deficient units added into the random conjugated polymer, the light absorption range and electron energy level can be slightly adjusted, the solubility can be improved, the carrier mobility can be increased, and the advantages of the original alternating conjugated polymer can be preserved, so as to cooperating the acceptor material well to obtain a higher photoelectric conversion efficiency.

Among numerous materials, N-alkylthieno[3,4-c]pyrrole-4,6-dione (TPD) is a structurally symmetrical and planar material with a functional group containing imide. It is widely used as an acceptor unit with strong electron pulling capability in the field of photovoltaic materials. The polymer containing a TPD unit has high electron mobility, excellent electrochemical reduction properties, and the like. At the same time, the nitrogen atom of TPD has chemical modification, to introduce different alkyl groups to effectively improve the solubility, and then TPD can be used as a building unit of the donor material to show good performance in the solar cell. In addition, the synthesis of TPD is simple for mass production, and it is very helpful for commercialization.

An object of the present invention is to provide a random conjugated polymer containing TPD and a preparation method thereof.

Another object of the present invention is to provide a medium energy gap conjugated polymer material which is a conjugated polymer donor having an optical energy gap ranging from 1.85 to 2.5 eV. Photoelectric conversion efficiency of the conjugated polymer donor cooperating with a non-fullerene acceptor can easily reach more than 10% to improve the problem of low conversion efficiency of polymer solar cells.

BRIEF DESCRIPTION OF THE APPENDED DRAWINGS

Figure 2:
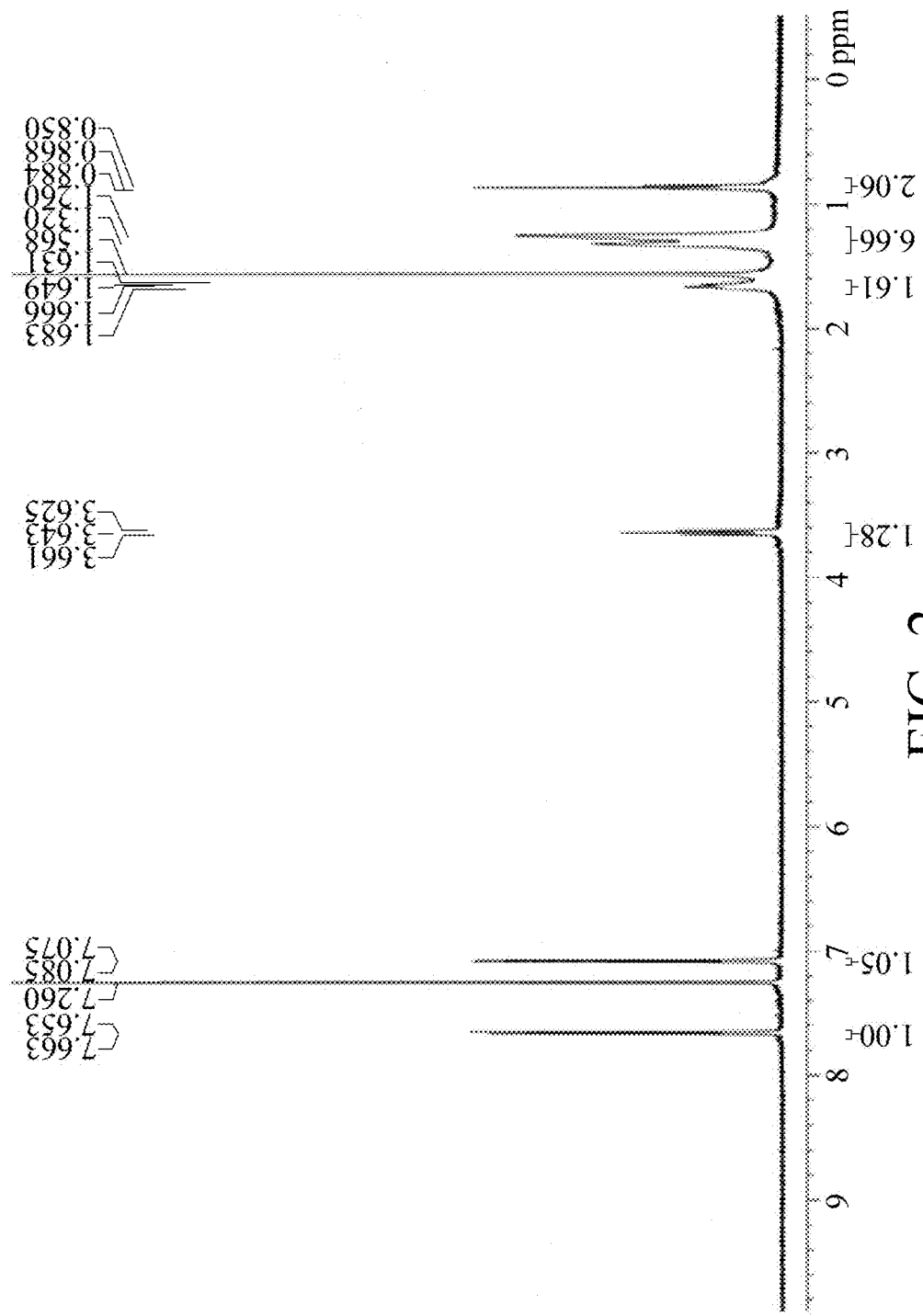
Figure 3:
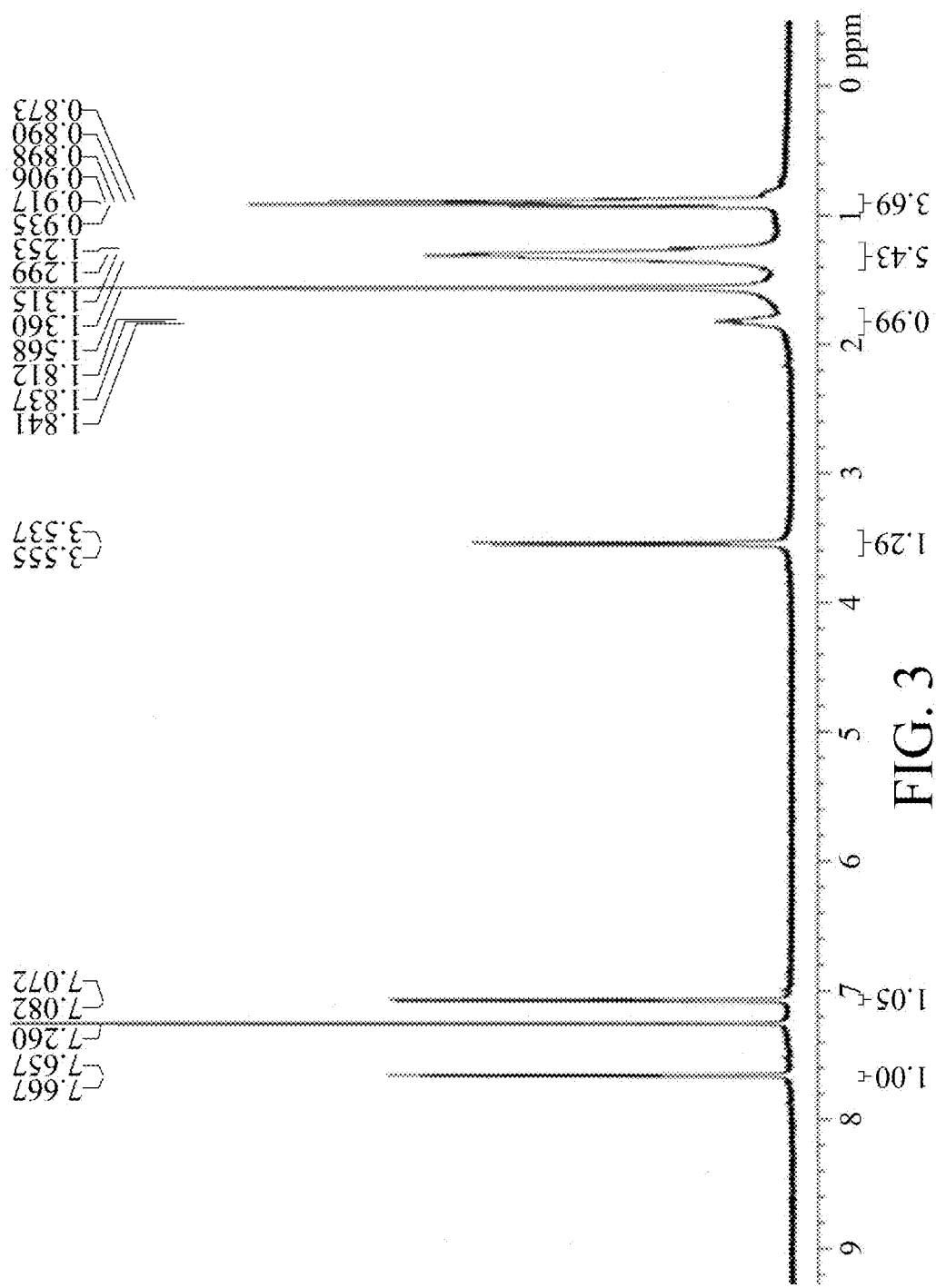
Figure 4:
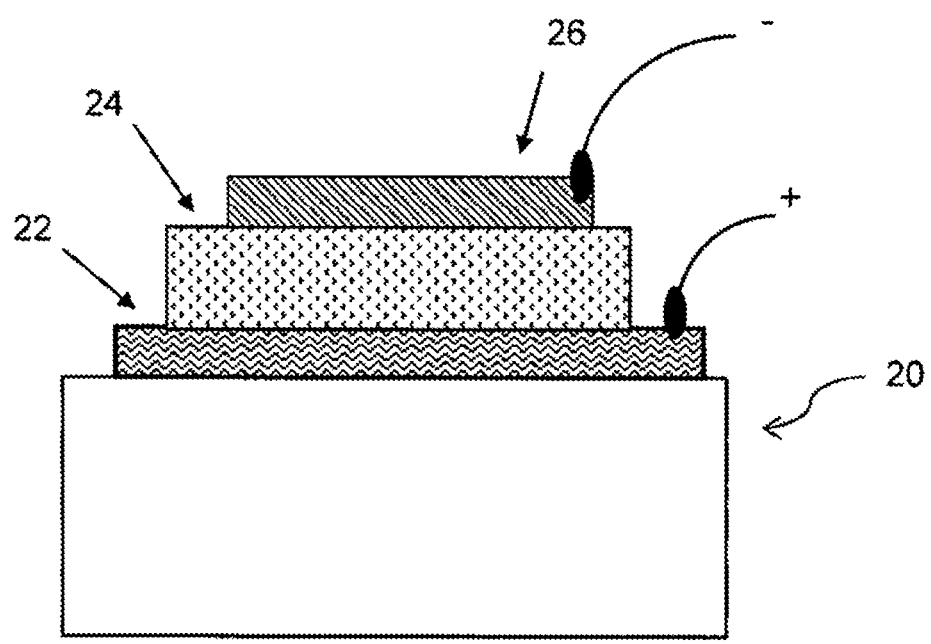

Some of the embodiments will be described in detail, with reference to the following figures, wherein like designations denote like members, wherein:

FIG. 1 shows a $^1$H NMR spectrum of material M3.
FIG. 2 shows a $^1$H NMR spectrum of material M6.
FIG. 3 shows a $^1$H NMR spectrum of material M9.
FIG. 4 shows a representative configuration of an organic photovoltaic device using the conjugated polymer of the present invention as an active layer material.

The advantages, spirits, and features of the present invention will be explained and discussed with embodiments and figures as follows.

DETAILED DESCRIPTION OF THE INVENTION

Definition

As used herein, "donor" material refers to a semiconductor material, such as an organic semiconductor material, having electron holes as a primary current or charge carrier. In some embodiments, when a p-type semiconductor material is deposited on a substrate, it can provide the electron holes with a hole mobility greater than about 10-5 cm$^2$/Vs. In the case of field effect devices, current on/off ratio of the p-type semiconductor material exhibits more than about 10.

As used herein, "acceptor" material refers to the semiconductor material, such as the organic semiconductor material, having electrons as the primary current or the charge carrier. In some embodiments, when a n-type semiconductor material is deposited on a substrate, it can provide the electrons with an electron mobility greater than about 10-5 cm²/Vs. In the case of field effect devices, current on/off ratio of the n-type semiconductor material exhibits more than about 10.

As used herein, "mobility" refers to a speed rate of the charge carrier moving through the material under the influence of an electric field. The charge carrier is the electron hole (positive charge) in the p-type semiconductor material and the electron (negative charge) in the n-type semiconductor material. This parameter depends on architecture of component and can be measured by field effect component or space charge limiting current.

The compound as used herein is considered as"environmentally stable" or "stabilized under ambient conditions" and refers to that the carrier mobility of the transistor of the semiconductor material utilized the compound is maintained at initial value while the transistor has been exposed to an environmental condition such as air, environmental temperature and humidity for a duration. For example, a compound may be considered to be environmentally stable if the change in carrier mobility of a transistor incorporating the compound is less than 20% 10% of the initial value after being exposed to the environmental conditions including air, humidity and temperature for 3, 5 or 10 days.

Fill factor (FF) used herein refers to the ratio of the actual maximum available power (Pm or $V_{mp}*J_{mp}$) to the theoretical (non-actually available) power ($J_{sc}*V_{oc}$). Therefore, the fill factor can be determined by the following formula:

$$FF=(V_{mp}*J_{mp})/(V_{oc}*J_{sc})$$

Wherein, the $J_{mp}$ and $V_{mp}$ respectively represent the current density and voltage at the maximum power point ($P_m$), which is obtained by varying the resistance in the circuit to the maximum value of $J*V.J_{sc}$ and $V_{oc}$ represent open circuit current and open circuit voltage, respectively. The fill factor is a key parameter for evaluating solar cells. The fill factor of commercial solar cells typically is greater than about 0.60%.

The open circuit voltage ($V_{oc}$) used herein is the potential difference between the anode and the cathode of the component without connecting the external load.

The power conversion efficiency (PCE) of solar cells used herein refers to the conversion percentage of power from the incident light to the electricity power. The power conversion efficiency (PCE) of solar cells can be calculated by dividing the maximum power point ($P_m$) by the incident light irradiance (E; W/m²) under the standard test conditions (STC) and the surface area (Ac; m²) of the solar cells. STC generally refers to the conditions of temperature of 25° C., irradiance of 1000 W/m², and air mass (AM) 1.5 spectrum.

The member (e.g., a thin film layer) as used herein can be considered as "photoactive" if it contains one or more compounds capable of absorbing photons to generate excitons for producing photocurrents.

As used herein, "solution proceeding" refers to a process in which a compound (e.g., a polymer), material, or composition can be used in a solution state, such as spin coating, printing (e.g., inkjet printing, gravure printing, lithography printing, etc.), spray coating, slit coating, drop casting, dip coating, and knife coating.

As used herein, "annealing" refers to a post-deposition heat treatment to a semi-crystalline polymer film for a duration of more than 100 seconds in general environment or under decompressed or pressurized environment. "Annealing temperature" means the maximum temperature at which the polymer film is exposed for at least 60 seconds during the annealing process. Without limitation by any particular theory, it is believed that annealing may result in increasing the crystallinity in the polymer film, thereby increasing field effect mobility. The increase in crystallinity can be detected by several methods, such as comparing the measurements of deposited and annealed members by differential scanning calorimetry (DSC) or by x-ray diffraction analysis (XRD).

As used herein, "polymeric compound" (or "polymer") refers to a molecule comprising a plurality of one or more repeating units bonded by covalent bond. A polymeric compound (polymer) can be represented by the following general formula (I).

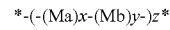   general formula (I)

wherein each of Ma and Mb is a repeating unit or a monomer. The polymer may comprise only one type of repeating units and comprise two or more than two types of repeating units. When the polymeric compound comprises only one type of repeating units, it may be referred to as a homopolymer. When the polymeric compound comprises two or more than two types of repeating units, it may be referred to as "copolymer" or "copolymeric compound". For example, the copolmeric compound can comprise different repeating units Ma and Mb. Unless otherwise indicated, the assembly of the repeating units in the copolymer can be head to tail, head to head or tail to tail. Further, the copolymer may be a random copolymer, an alternating copolymer or a block copolymer unless otherwise indicated. For example, the general formula (I) can be used to represent the copolymer having Ma with x molar fraction and Mb with y mole fraction, wherein the comonomers of Ma and Mb can be repeated in alternately, irregular, regional regiorandom, regional rules or blocks, and the comonomers of Ma and Mb can exist up to z comonomers. In addition to its composition, a polymeric compound, according to measurement techniques, can be described by degree of polymerization (n) or molar mass (e.g., number average molecular weight (Mn), and/or weight average molecular weight (Mw)).

As used herein, "halo" or "halogen" means fluoro, chloro, bromo and iodo.

As used herein, "alkyl" refers to a straight or branched saturated hydrocarbon. For example, alkyl includes methyl (Me), ethyl (Et), propyl (e.g. n-propyl and iso-propyl), butyl (e.g. n-butyl, iso-butyl, t-butyl, tert-butyl), pentyl (e.g. n-pentyl, iso-pentyl), hexyl, and the like. In various embodiments, the alkyl can have 1 to 40 carbon atoms (i.e., C1-40 alkyl), such as 1 to 30 carbon atoms (i.e., C1-30 alkyl). In some embodiments, the alkyl can have 1 to 6 carbon atoms and can be referred to as a "lower alkyl." For example, the lower alkyl includes methyl, ethyl, propyl (e.g., n-propyl and iso-propyl), and butyl (e.g., n-butyl, iso-butyl, t-butyl, and tert-butyl), In some embodiments, alkyl can be substituted as described herein. Generally, Alkyl would not be substituted by another alkyl, alkenyl or alkynyl.

As used herein, "alkenyl" refers to straight or branched carbon chain having one or more carbon-carbon double bonds. For example, alkenyl includes vinyl, propenyl, butenyl, pentenyl, hexenyl, butadienyl, pentadienyl, hexadienyl and the like. One or more carbon-carbon double bond may be located in internal (e.g., 2-butene) or terminal (e.g., 1-butene). In various embodiments, alkenyl can have 2 to 40 carbon atoms (i.e., C2-40 alkenyl) or 2 to 20 carbon atoms (i.e., C2-20 alkenyl). In some embodiments, alkenyl can be substituted as described herein. Generally, Alkenyl would not be substituted by another alkenyl, alkyl or alkynyl.

As used herein, "fused ring" or "fused ring group" refers to a polycyclic system having at least two rings, and at least one of which is aromatic ring, wherein the aromatic ring (carbocyclic or heterocyclic) shares a bond with at least one aromatic or non-aromatic ring (carbocyclic or heterocyclic). The polycyclic systems can be highly π-conjugated systems as described herein, or be selectively substituted as described herein.

As used herein, "heteroatom" means an atom of any element other than carbon and hydrogen, such as nitrogen, oxygen, helium, sulfur, phosphorus, and selenium.

As used herein, "aryl" refers to an aromatic monocyclic hydrocarbon ring system, or polycyclic system which is fused by one or more aromatic hydrogen rings, or fused by at least one aromatic monocyclic hydrocarbon ring with one or more cycloalkyl rings and/or heterocyclic rings. The aryl may contain 6 to 24 carbon atoms (e.g., C6-C24 aryl) and may include a plurality of fused rings. In some embodiments, the polycyclic aromatic group can have 8 to 24 carbon atoms. Any suitable ring position in the aryl can be covalently bonded to a defined chemical structure. Examples of the aromatic groups having an aromatic carbocyclic ring include phenyl, 1-naphthyl (bicyclic), 2-naphthyl (bicyclic), fluorenyl (tricyclic), phenanthryl (tricyclic), and pentacyl (five rings) and so on. Examples of the polycyclic system in which at least one aromatic monocyclic hydrocarbon ring is fused to one or more cycloalkyl rings and/or heterocyclic rings, comprises benzene derivatives containing cyclopentane (i.e., fluorenyl, and 5,6-bicycloalkyl/aromatic ring system), benzene derivatives containing cyclohexane (i.e., tetrahydronaphthyl, and 6,6-biscycloalkane/aromatic ring system), benzene derivatives containing imidazolines (i.e., benzimidazolinyl, 5,6-bicyclic heterocyclyl/aromatic ring system), and benzene derivatives containing pyran (i.e., benzopyranyl, and 6,6-bicyclic heterocyclic/aromatic ring system). Other examples of aryl group include benzodioxanyl, benzodioxolyl, chromanyl, porphyrin, and the like. In some embodiments, aryl can be substituted as described herein. In some embodiments, aryl can have one or more halogen substituent also referred to as halogen aryl. Perhaloaryl, which is included in the halogen substituent, is that all of hydrogen atoms in aryl are replaced by halogen atom (for example, $C_6F_5$). In certain embodiments, one of the substituent of the aryl is substituted with another aryl and may be referred to as diaryl. Each aryl of diaryl can be substituted as disclosed herein.

As used herein, "heteroaromatic" refers to an aromatic monocyclic system containing ring heteroatom selected from the group consisting of oxygen (O), nitrogen (N), sulfur (S), cerium (Si), and selenium (Se), or a polycyclic system with at least one ring is aromatic and containing at least one ring heteroatom. Polycyclic heteroaryl contains one or more aromatic carbocyclic ring, non-aromatic carbocyclic ring and/or non-aromatic heterocyclic rings. Heteroaryl may have, for example, aromatic ring containing 5 to 24 atoms, wherein the atoms including 1 to 5 hetero atoms (such as heteroaryl containing 5 to 20 members). Heteroaryl can be attached to a defined chemical structure at any heteroatom or carbon atom to form stable structure. Heteromatic ring usually does not contain linkages of O—O, S—S or S—O. However, one or more N or S atoms of the heteroaromatic may be oxidized (e.g., pyridine N-oxide, thiophene S-oxide, thiophene S,S-dioxide). Examples of heteroaromatic includes monocyclic of 5 or 6 members and 5-6 bicyclic systems, wherein heteroaromatic may contain O, S, NH, N-alkyl, N-aryl, N-(arylalkane) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaromatic rings include pyrrolyl, furyl, thienyl, pyridyl, pyrimidinyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, fluorenyl, isodecyl, benzofuranyl, benzothienyl, quinolinyl, 2-methylquinolyl, isoquinolyl, quinoxalyl, quinazolyl, benzotriazolyl, benzimidazolyl, benzothiazolyl, benzene isothiazolyl, benzisoxazole, benzoxazolyl, benzoxazolyl, cinnolinyl, 1H-carbazolyl, 2H-carbazolyl, indolizinyl, isobenzofuranyl, naphthyridinyl, phthalazinyl, pteridinyl, purinyl, oxazolopyridinyl, thiazolopyridyl, Imidazopyridyl, furopyridinyl, thienopyridyl, pyridopyrimidinyl, pyridopyrazinyl, pyridopyridazinyl, thienothiazolyl, thienooxazolyl, thienoimidazolyl, and the like. Further, examples of heteroaromatic include 4,5,6,7-tetrahydroindenyl, tetrahydroquinolyl, benzothienopyridinyl, benzofuropyridinyl, and the like. In some embodiments, heteroaryl can be substituted as disclosed herein.

A first embodiment of the present invention discloses a conjugated polymer, which is a random copolymer, with the following formula (Formula I):

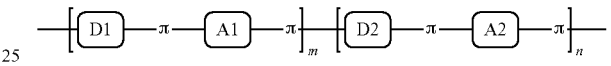

wherein

A1 = 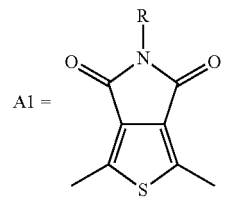

wherein $R_1$ is one selected from the group consisting of C1-C30 alkyl, C1-C30 branched alkyl, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain substituted by cyano, nitro, hydroxyl or keto, and halo group;

D1 and D2 are respectively selected from the group consisting of

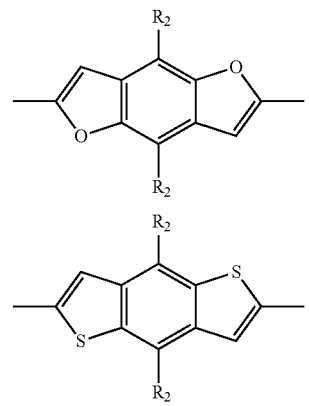

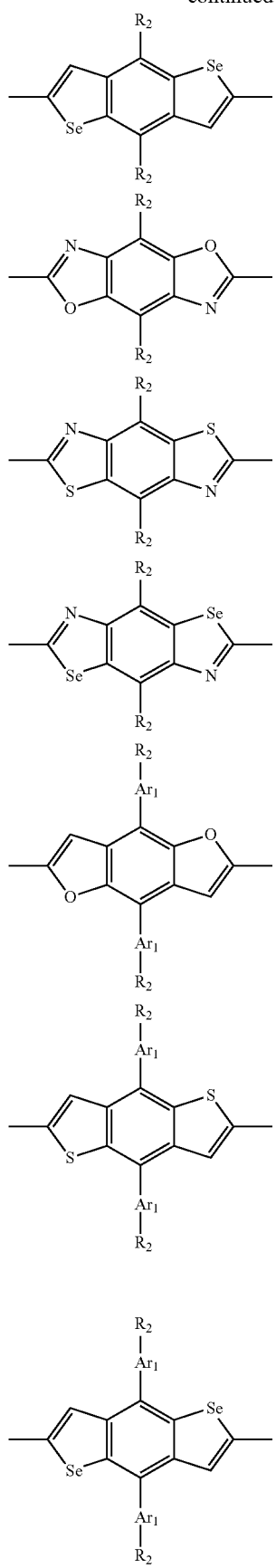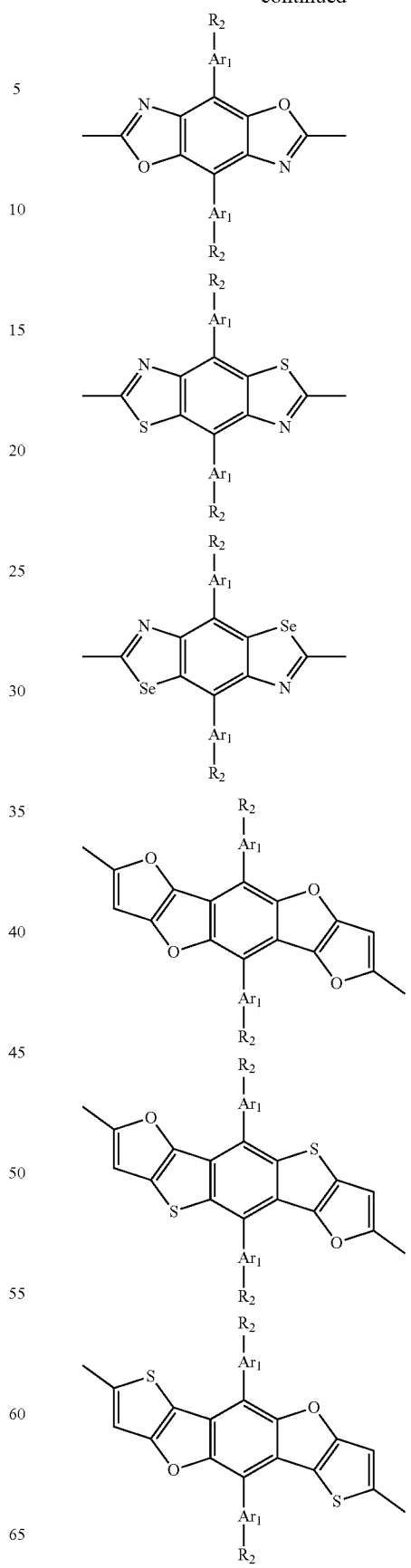

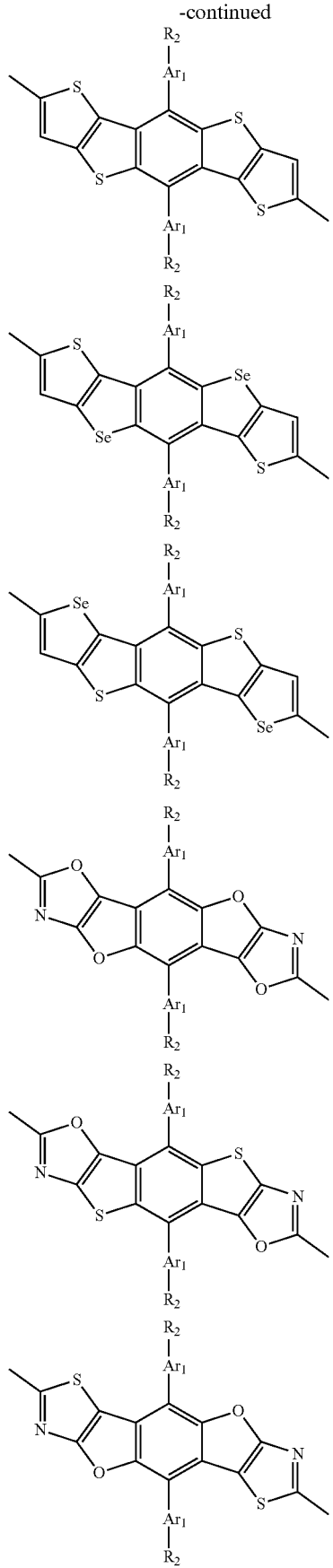
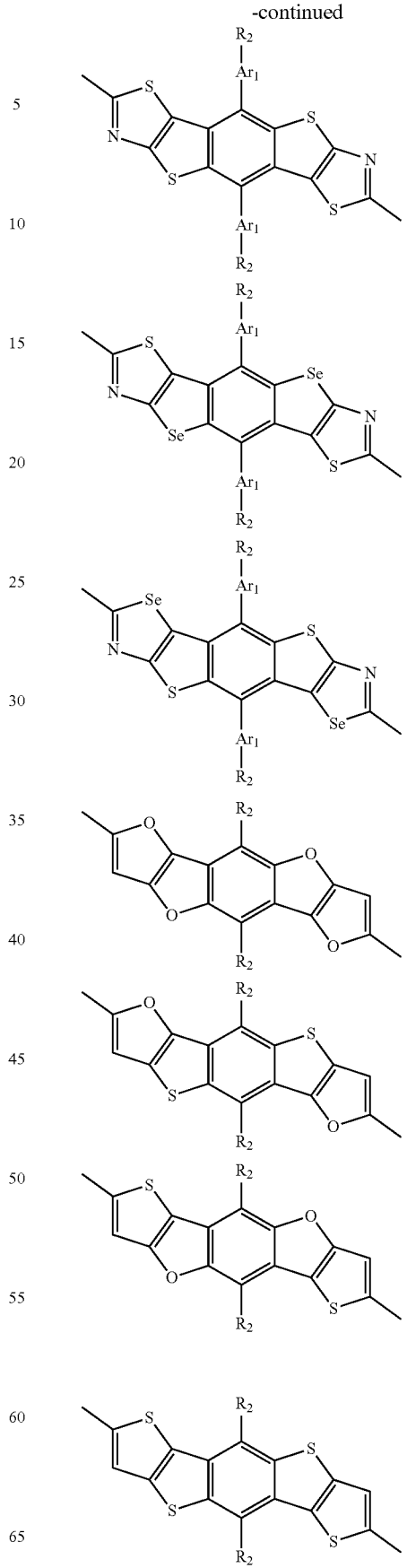

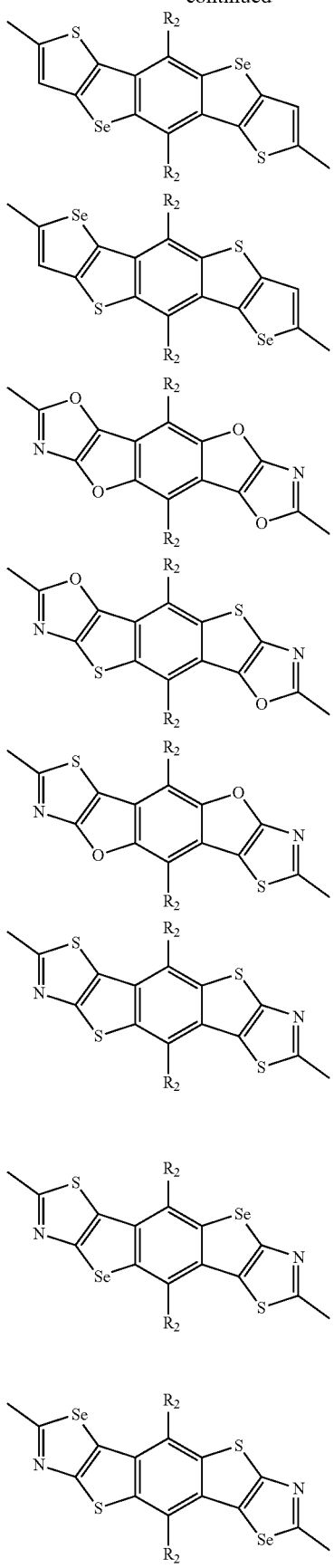
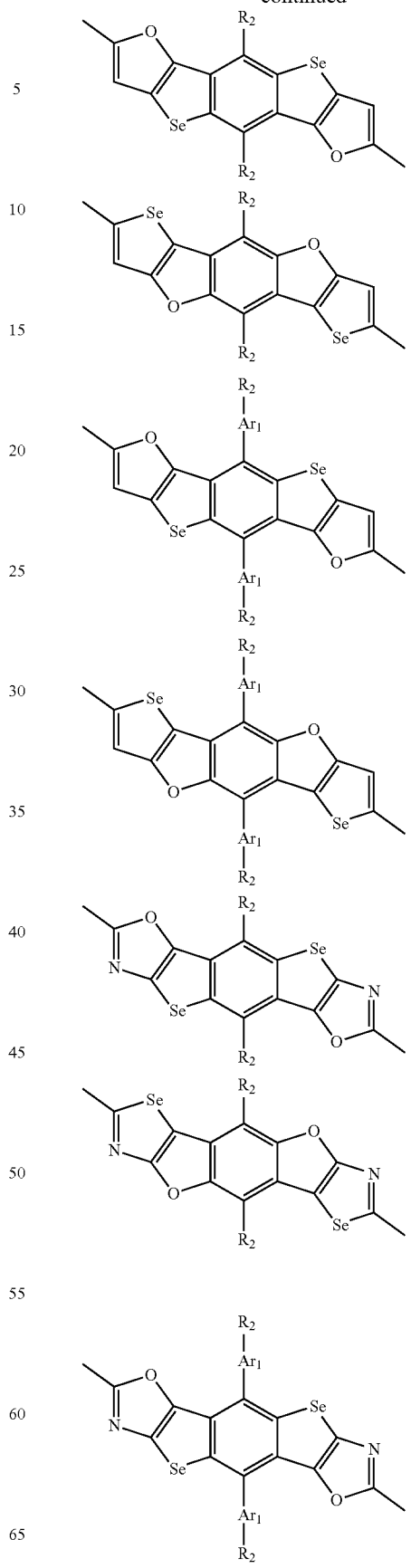

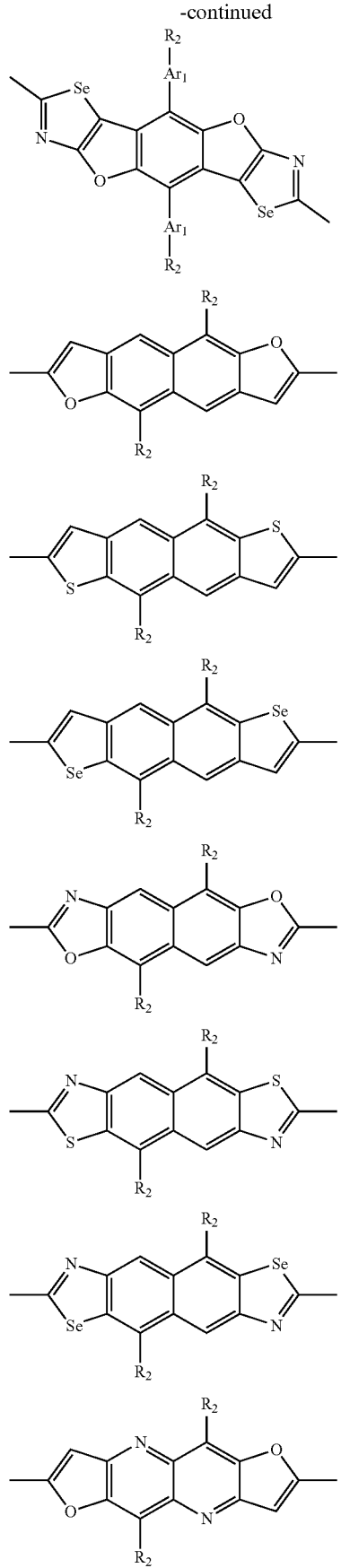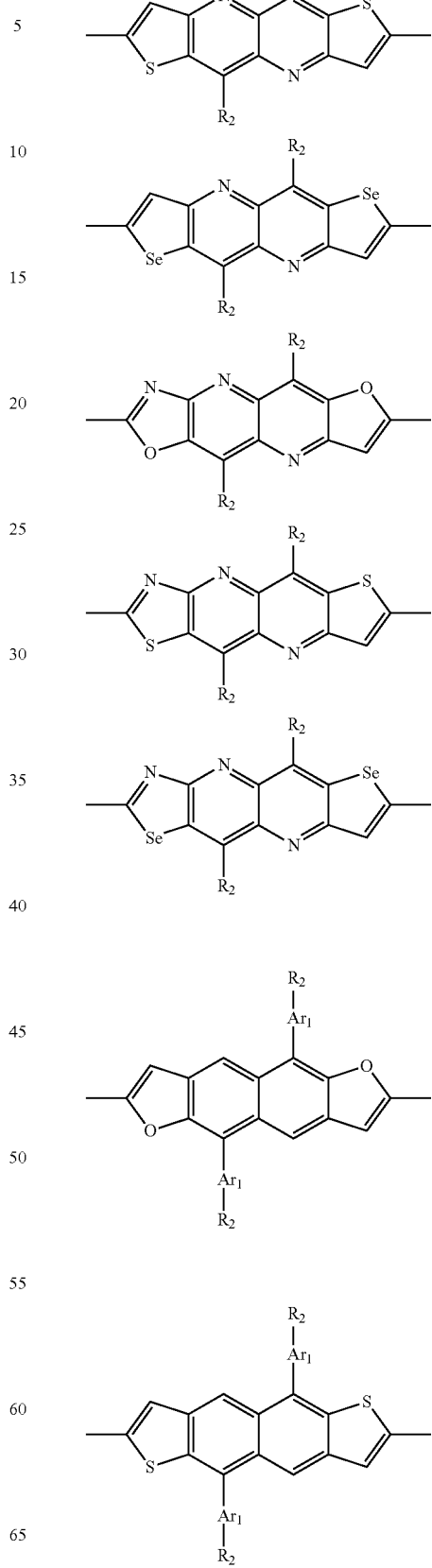

-continued
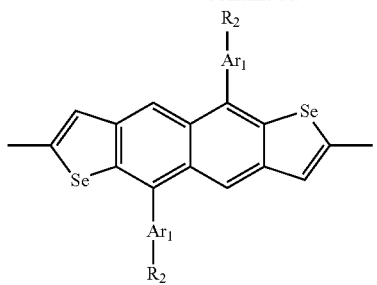
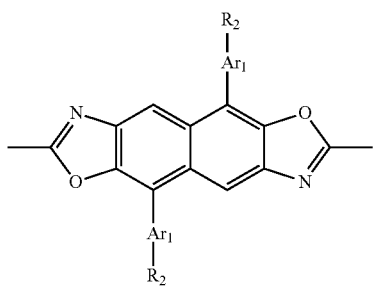
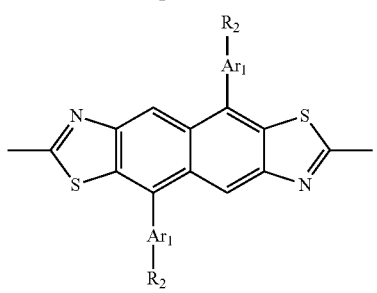
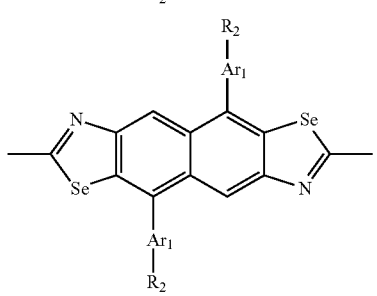
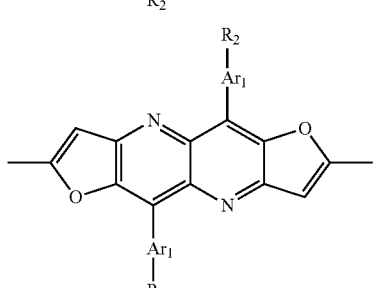
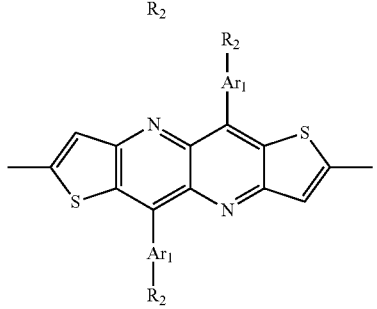
-continued
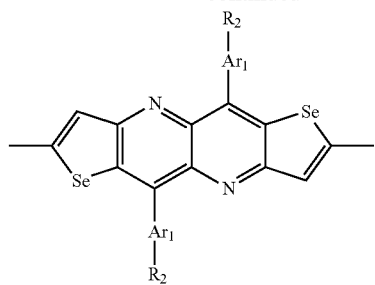
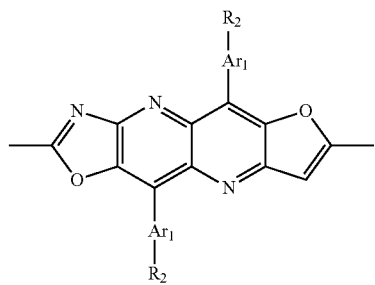
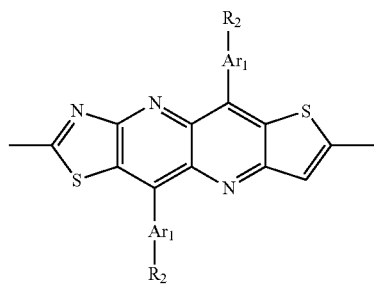
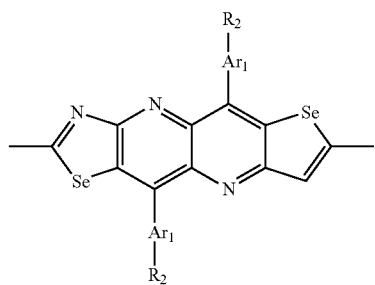
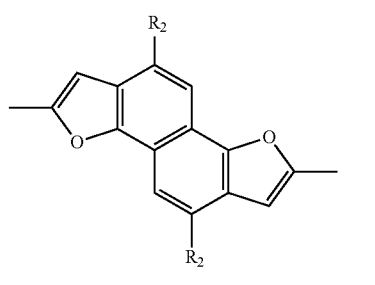
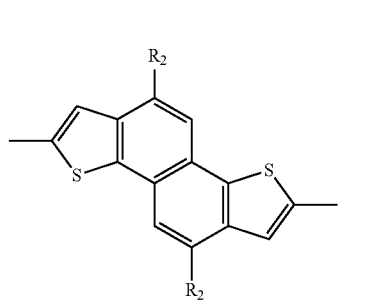

-continued
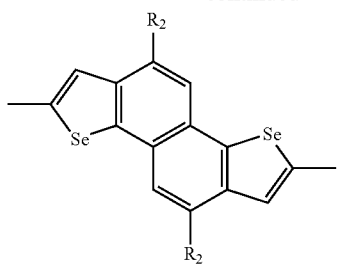
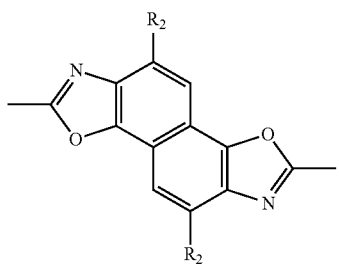
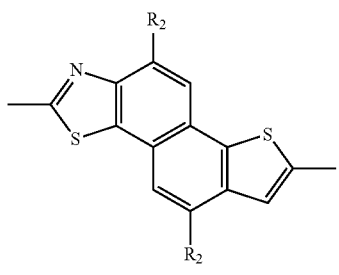
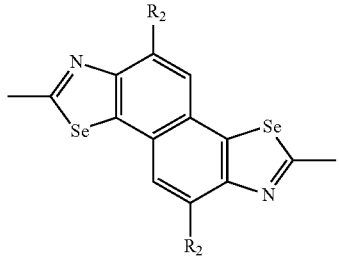
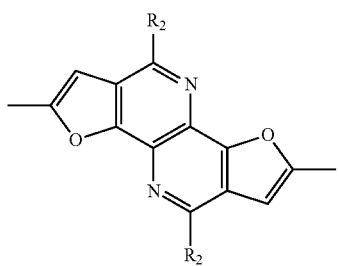
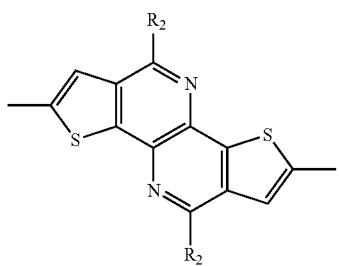
-continued
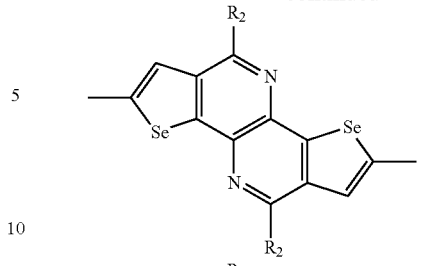
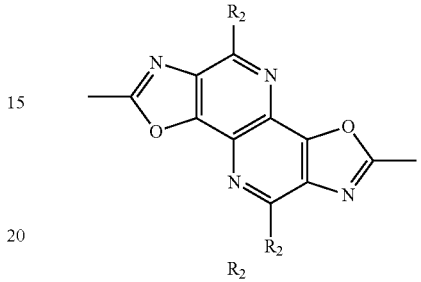
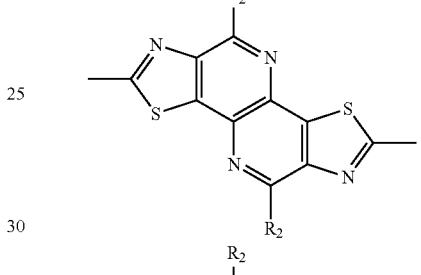
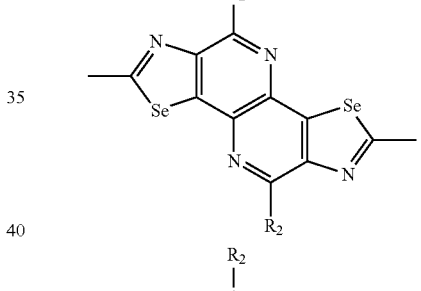
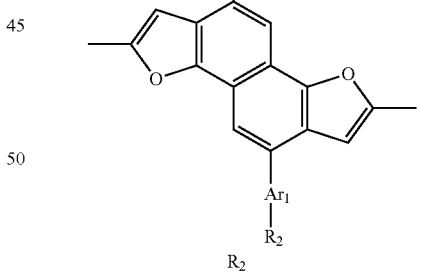
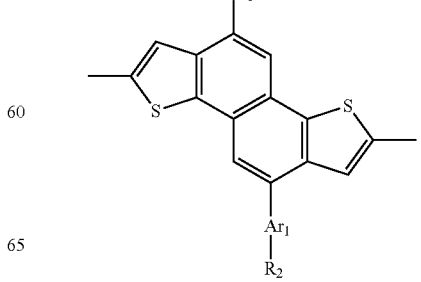

-continued
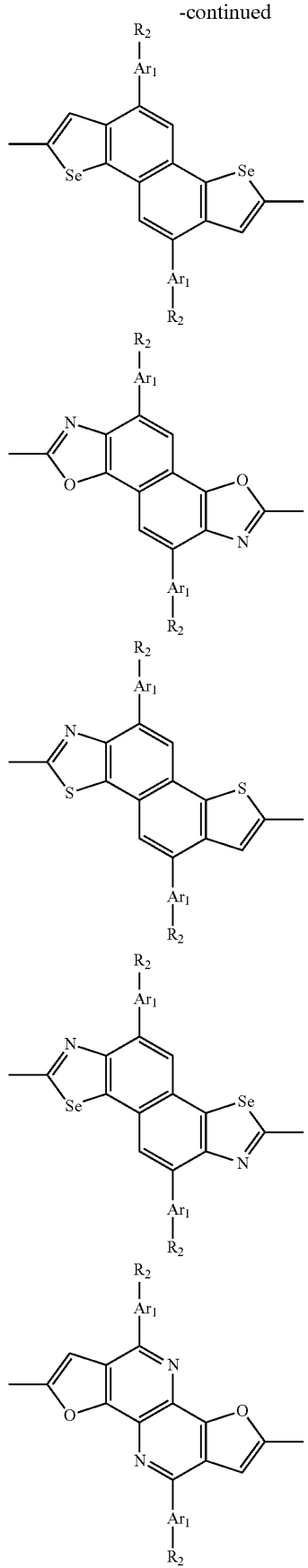
-continued
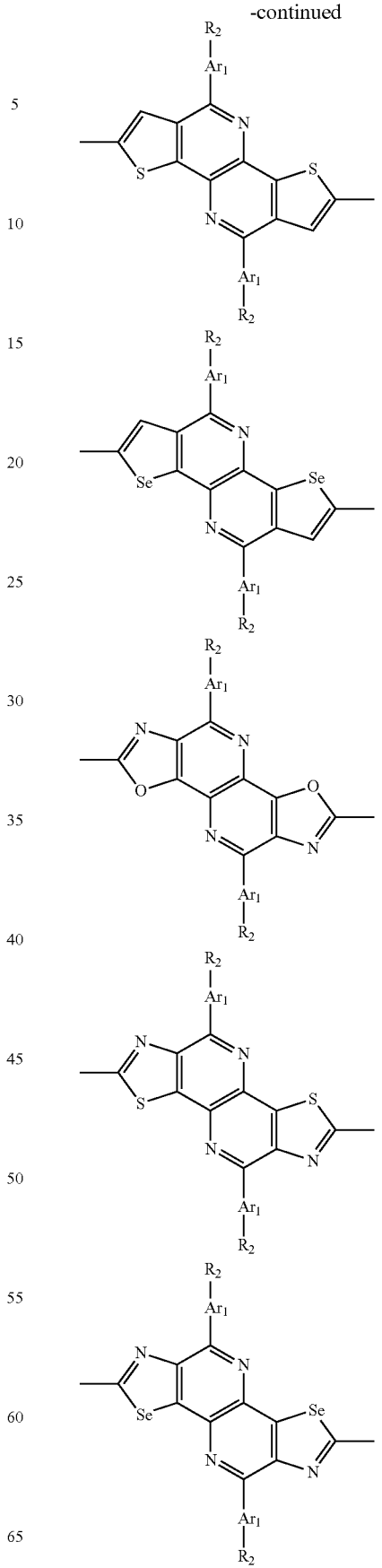

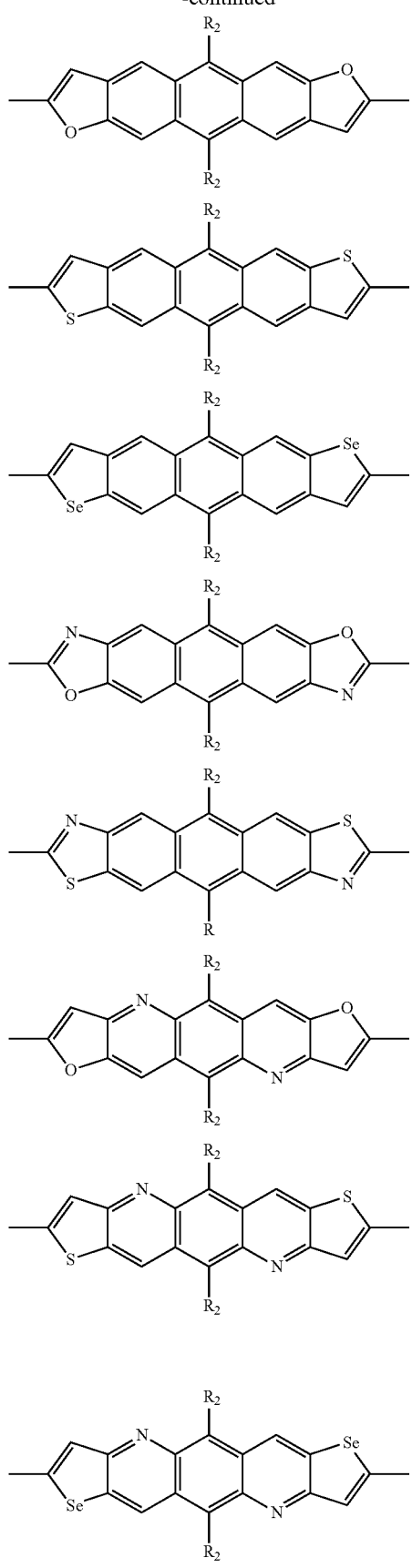
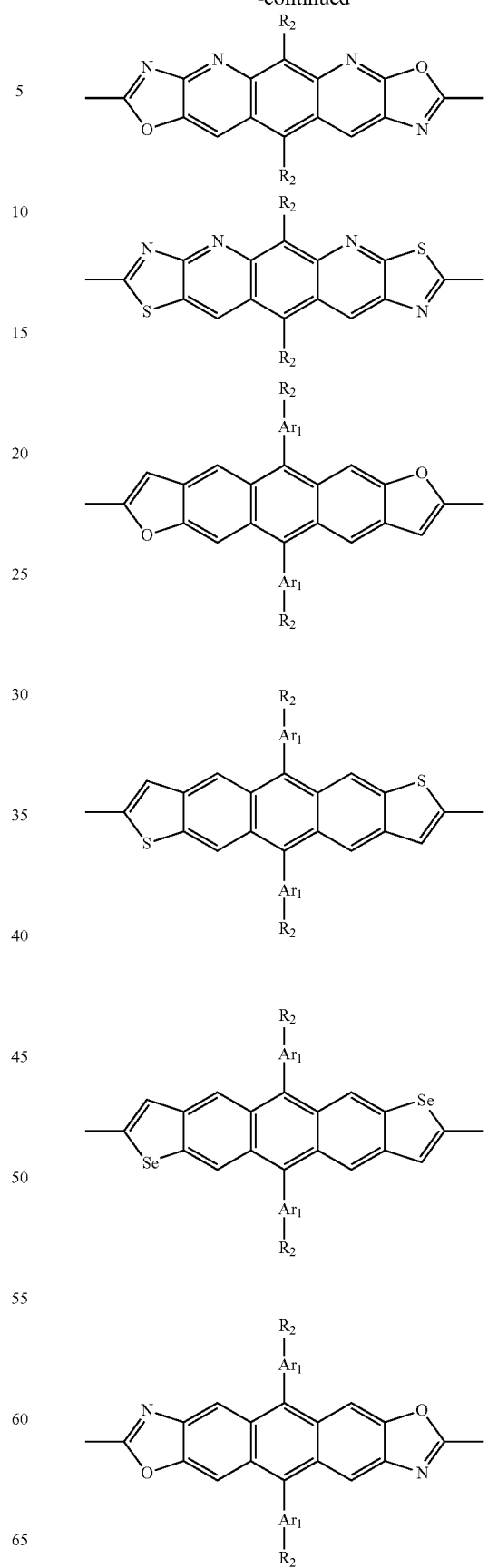

-continued
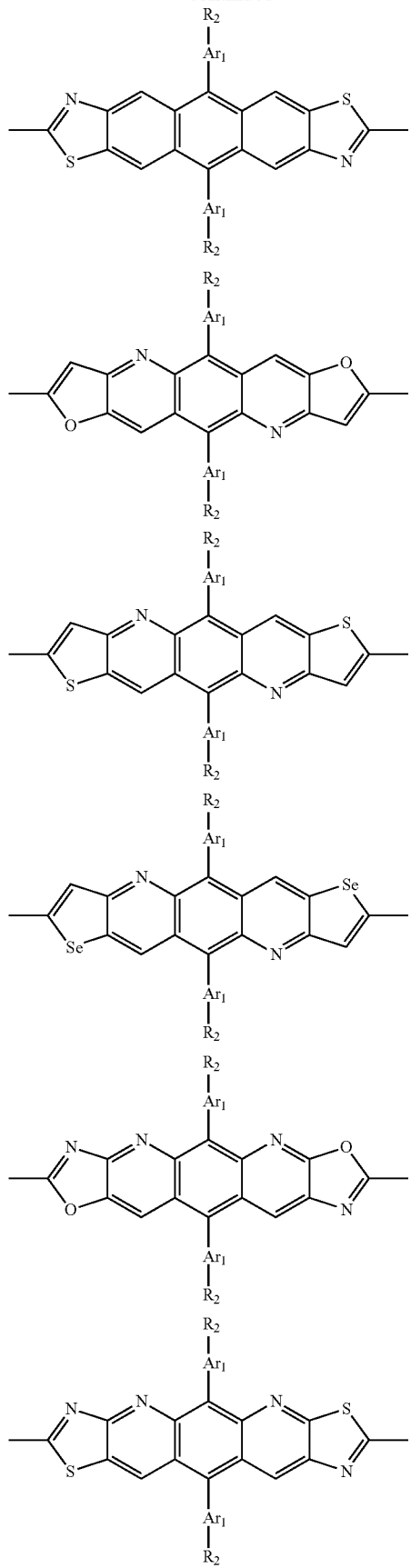
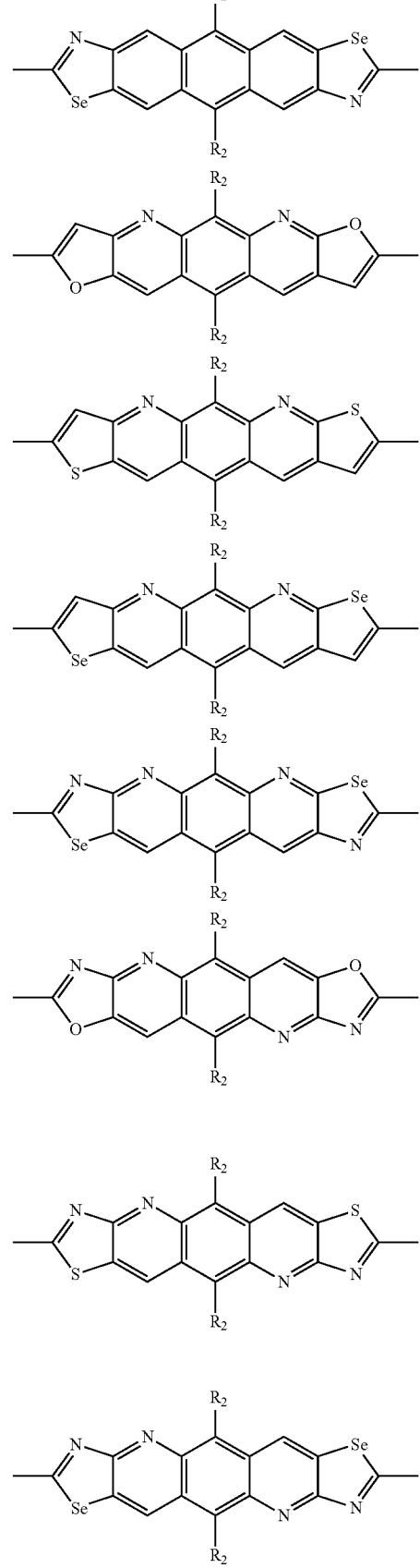

-continued
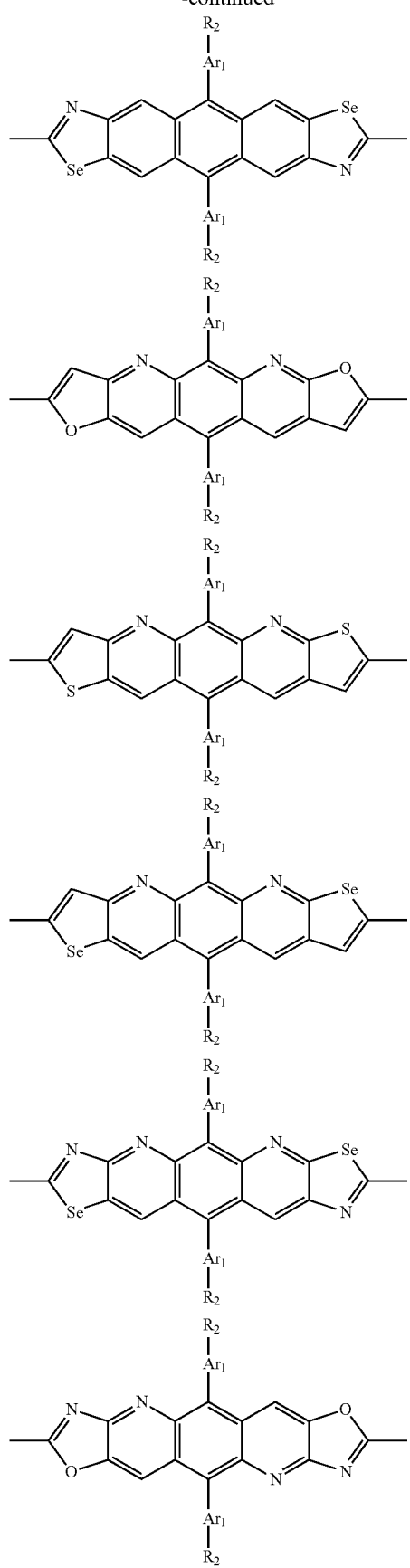
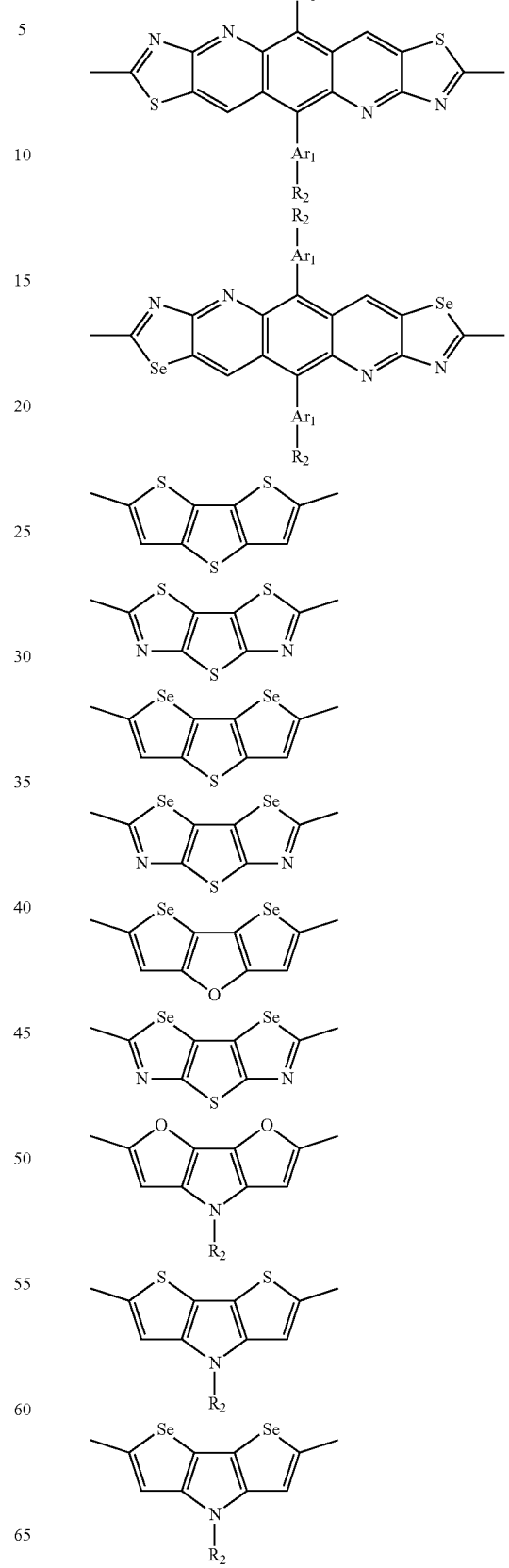

-continued
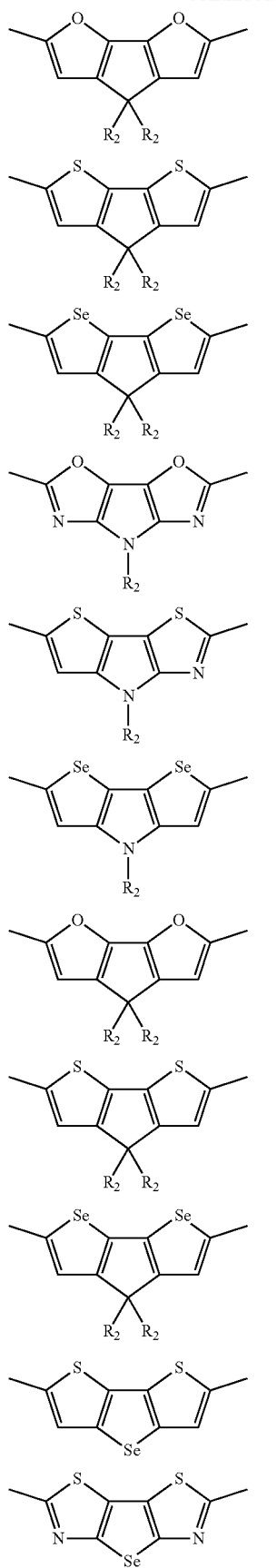
-continued
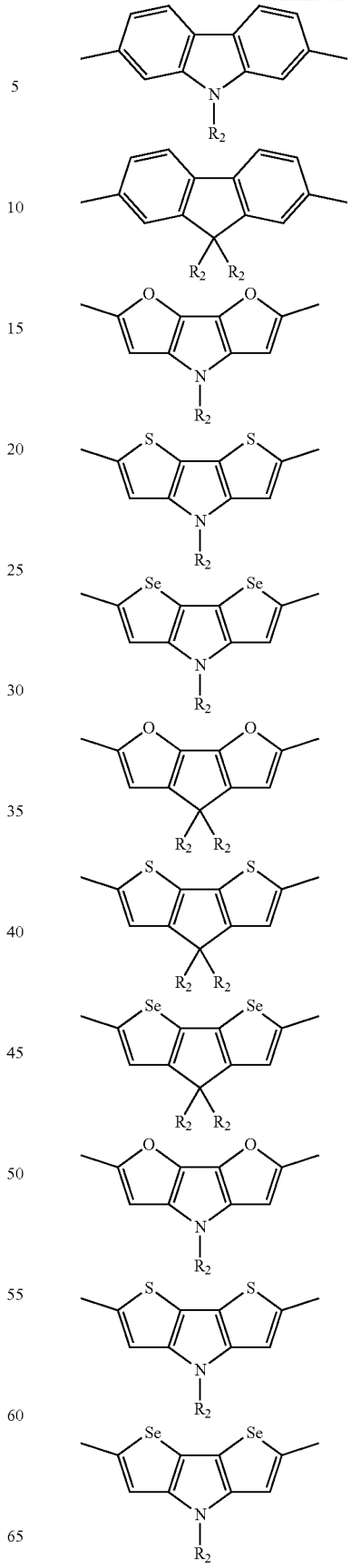

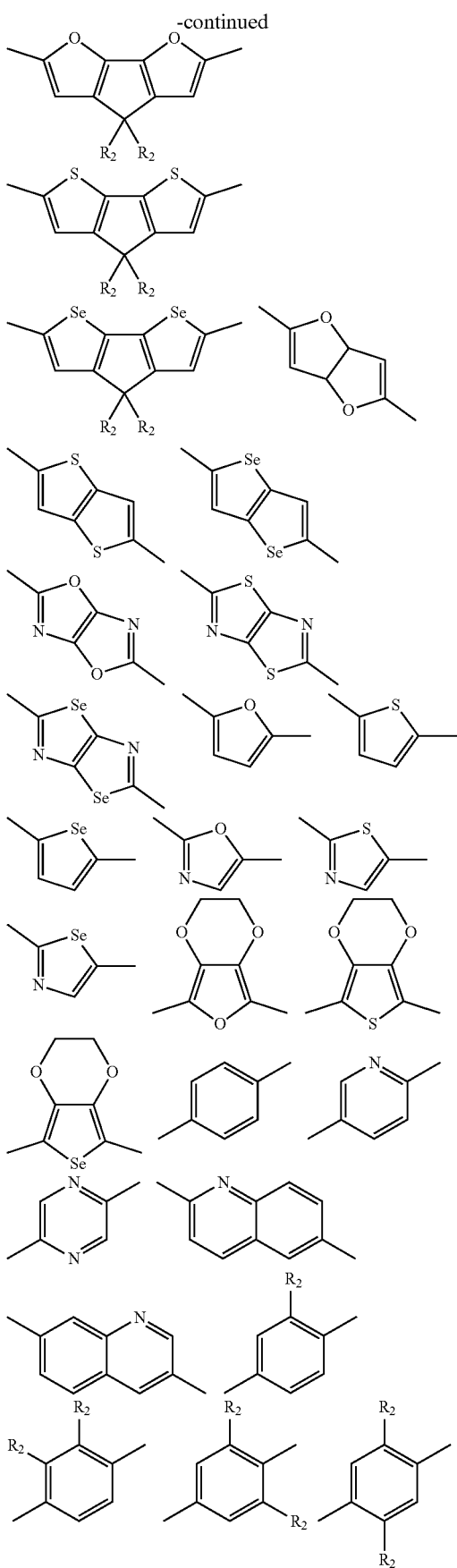
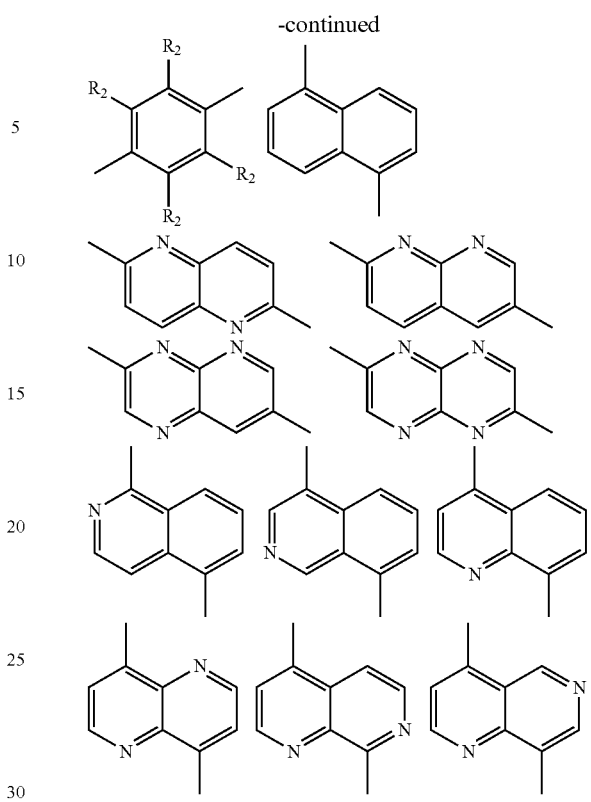

wherein R₂ is one selected from the group consisting of C1-C30 alkyl, C1-C30 branched alkyl, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain substituted by cyano, nitro, hydroxyl or keto, and halo group;

wherein Ar₁ is one selected from the group consisting of fused aromatic hydrocarbons, benzene fused heterocylic compounds, fused heterocylic compounds, benzene, five-membered heterocyclic ring and six-membered heterocyclic ring, wherein the benzene, the five-membered heterocyclic ring and the six-membered heterocyclic ring comprise C1-C30 alkyl groups, C1-C30 branched alkane, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain containing cyano, nitro, hydroxyl or keto, or halo group; and m and n are any integers selected from 2 to 200, respectively.

In one preferred embodiment, Ar₁ is selected from the group consisting of C8-C30 fused aromatic hydrocarbons, C6-C30 benzene fused heterocylic compounds, C5-C30 fused heterocylic compounds, C1-C30 benzene, C1-C30 five-membered heterocyclic ring and C1-C30 six-membered heterocyclic ring, wherein the C1-C30 benzene, the C1-C30 five-membered heterocyclic ring and the C1-C30 six-membered heterocyclic ring comprise C1-C30 alkyl groups, C1-C30 branched alkane, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain containing cyano, nitro, hydroxyl or keto, or halo group.

In one embodiment, the A2 is selected from the group consisting of:

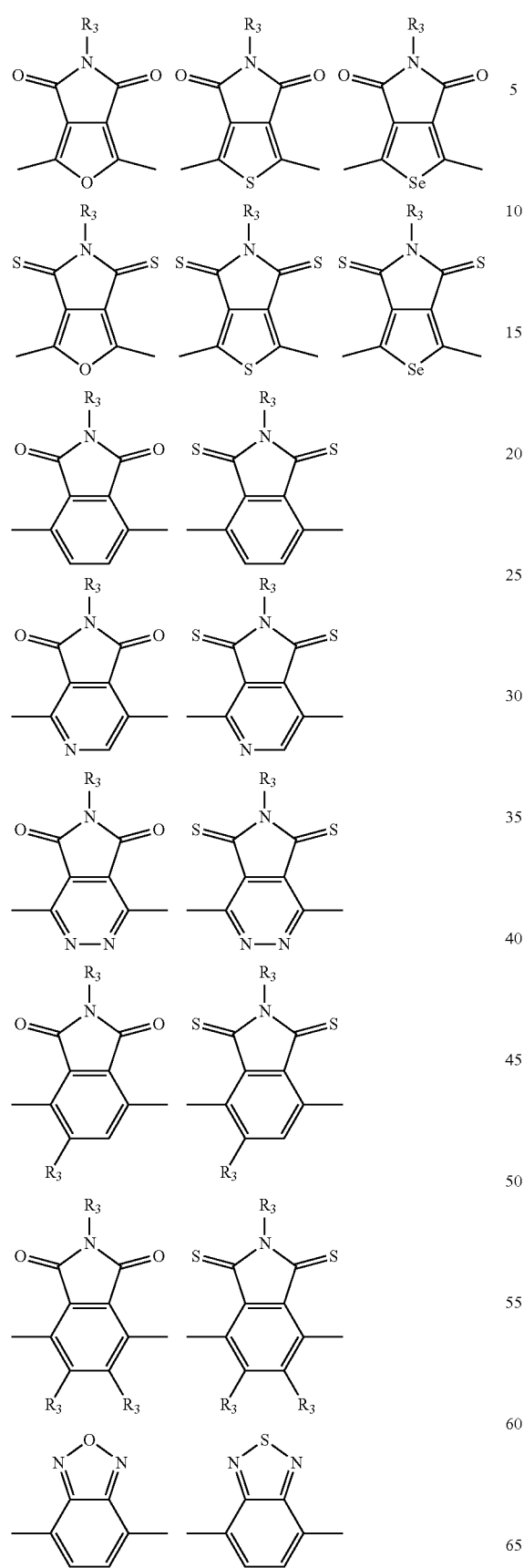
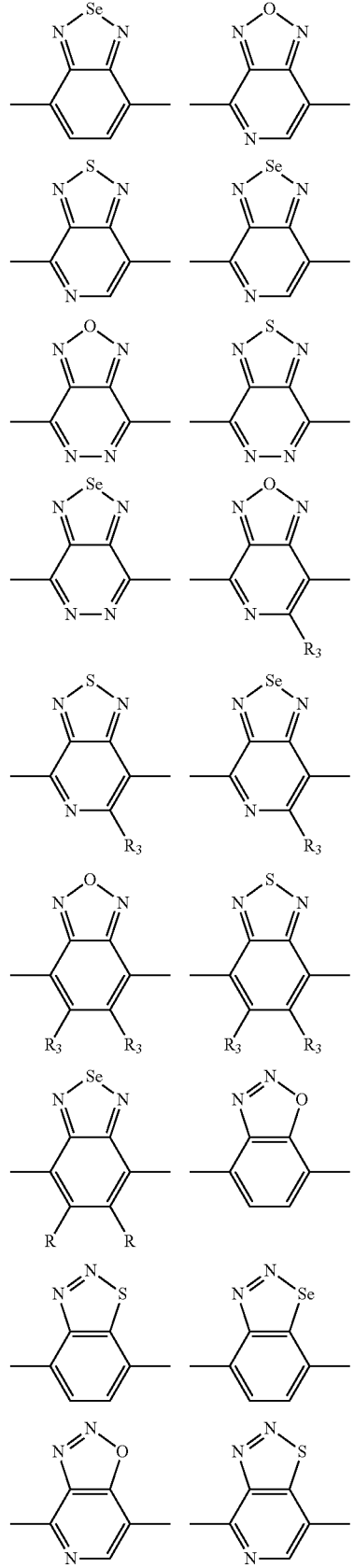

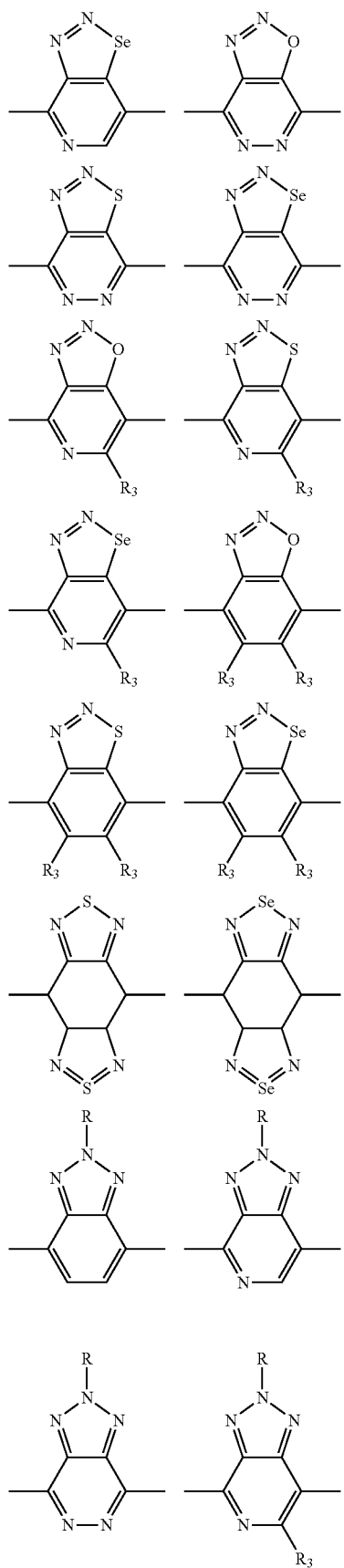
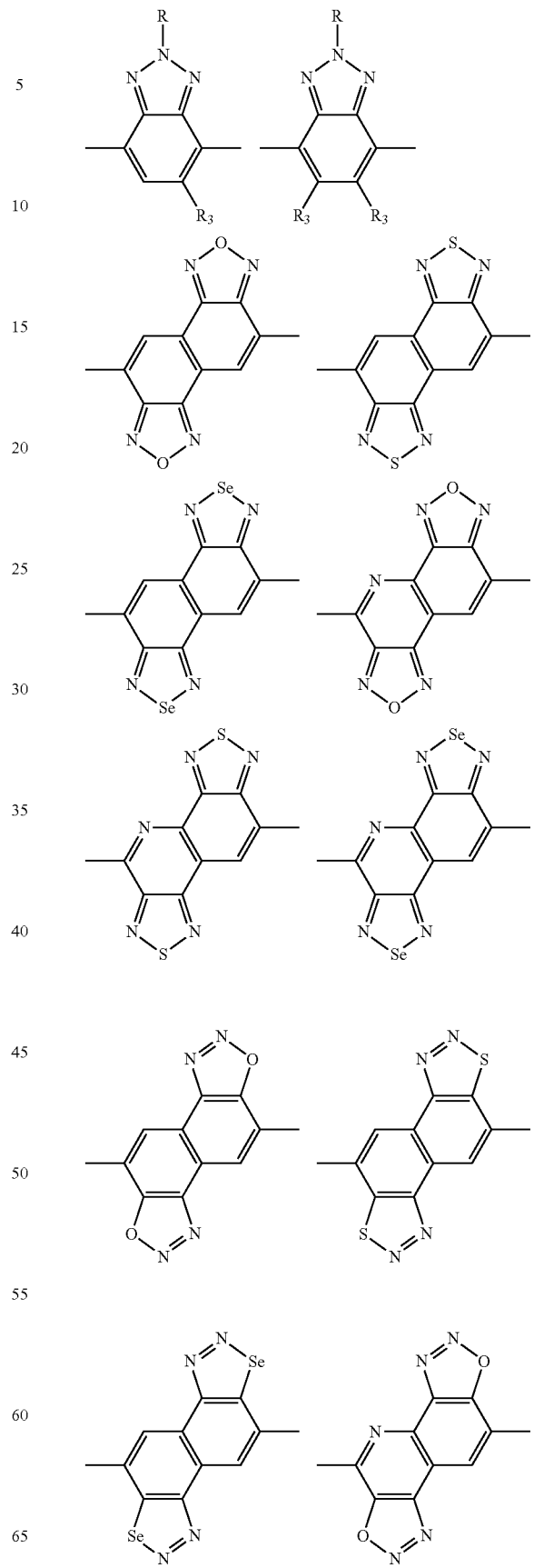

-continued
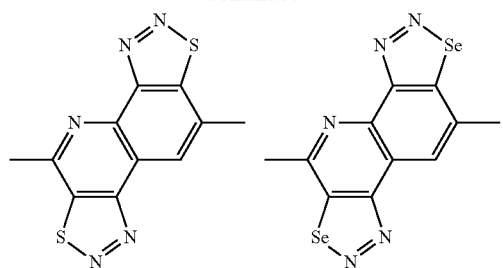 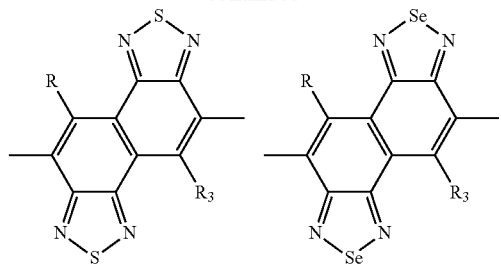
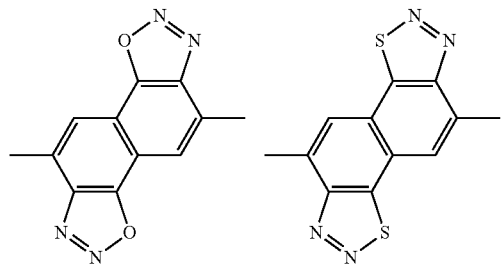 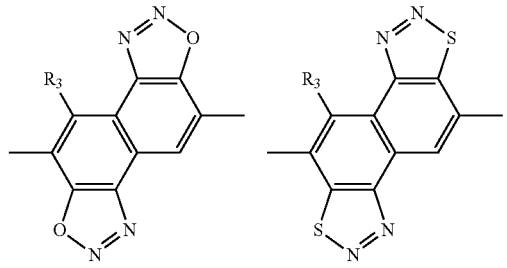
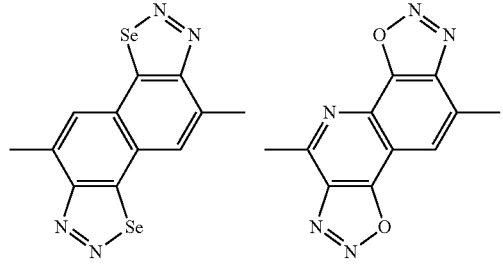 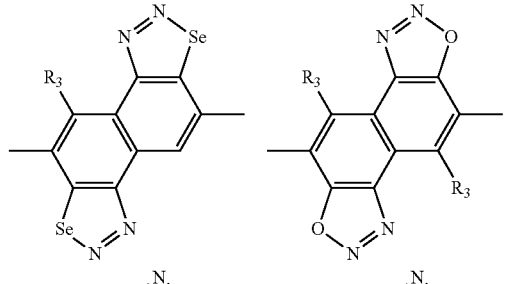
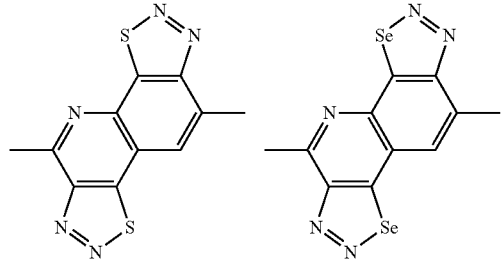 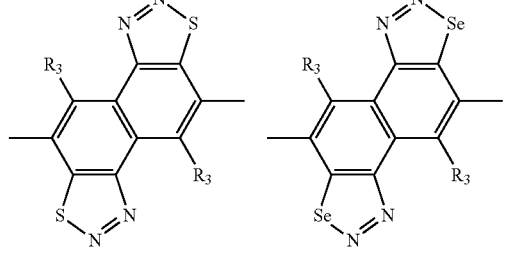
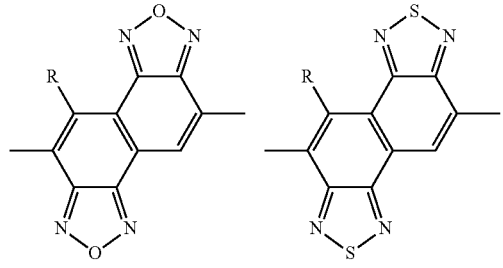 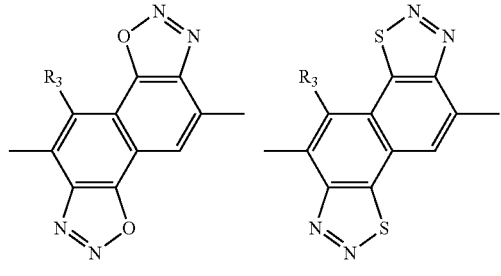
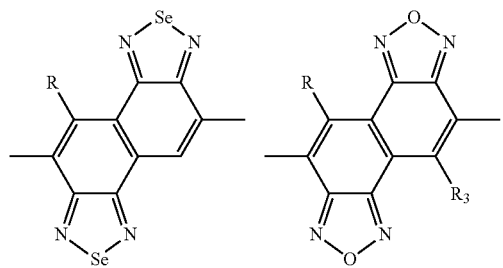 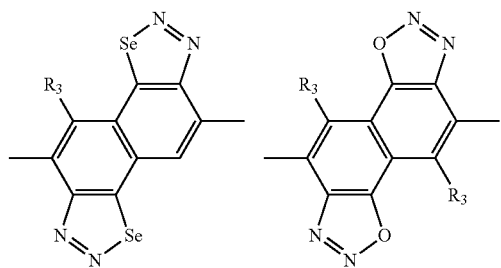

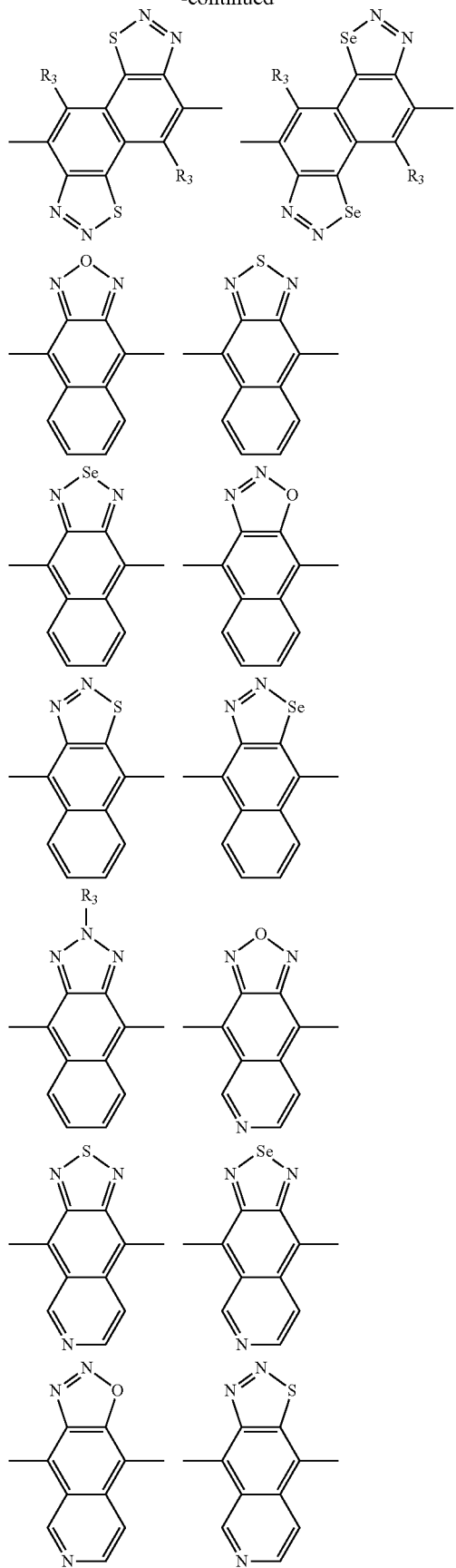
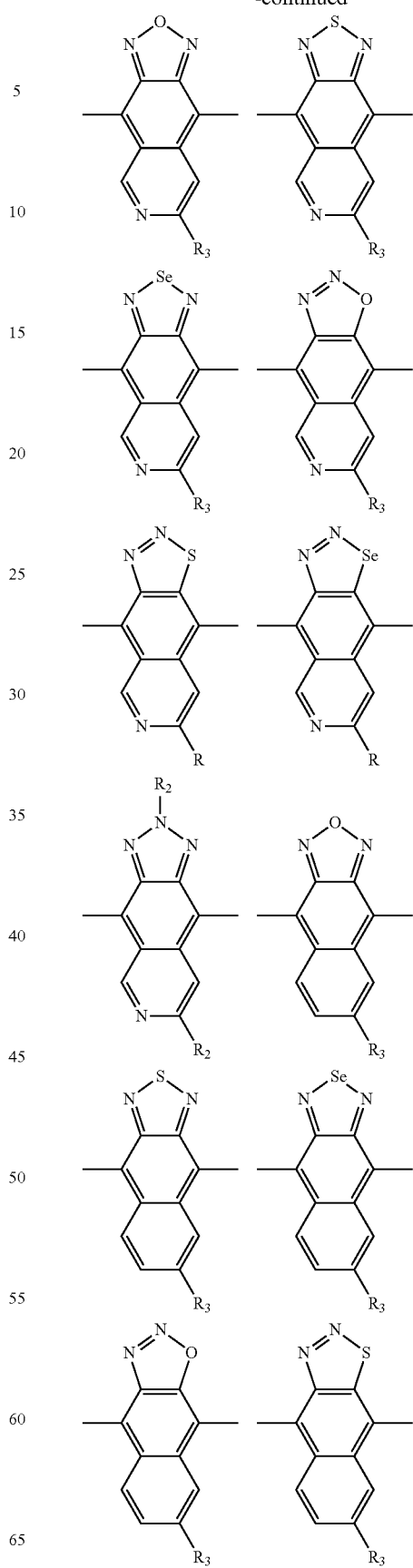

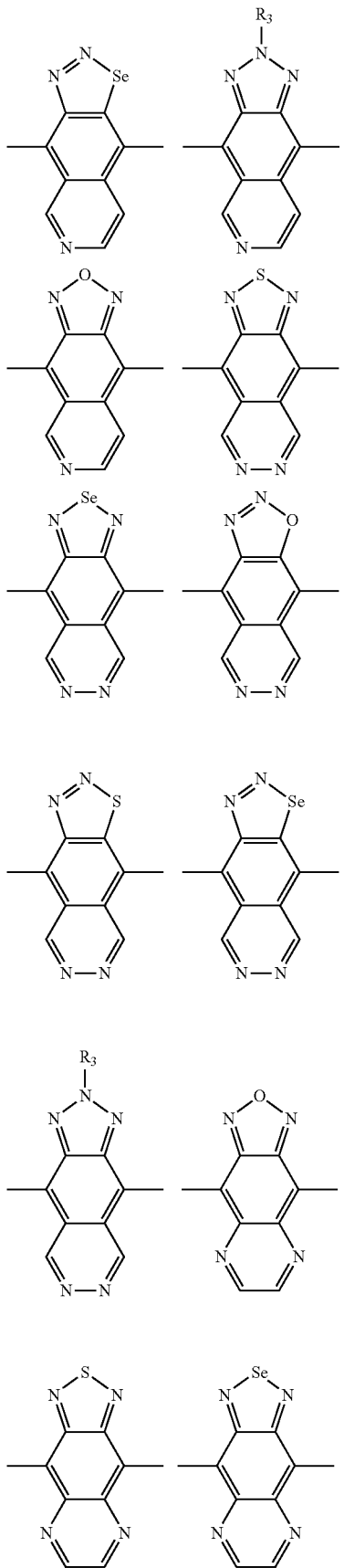
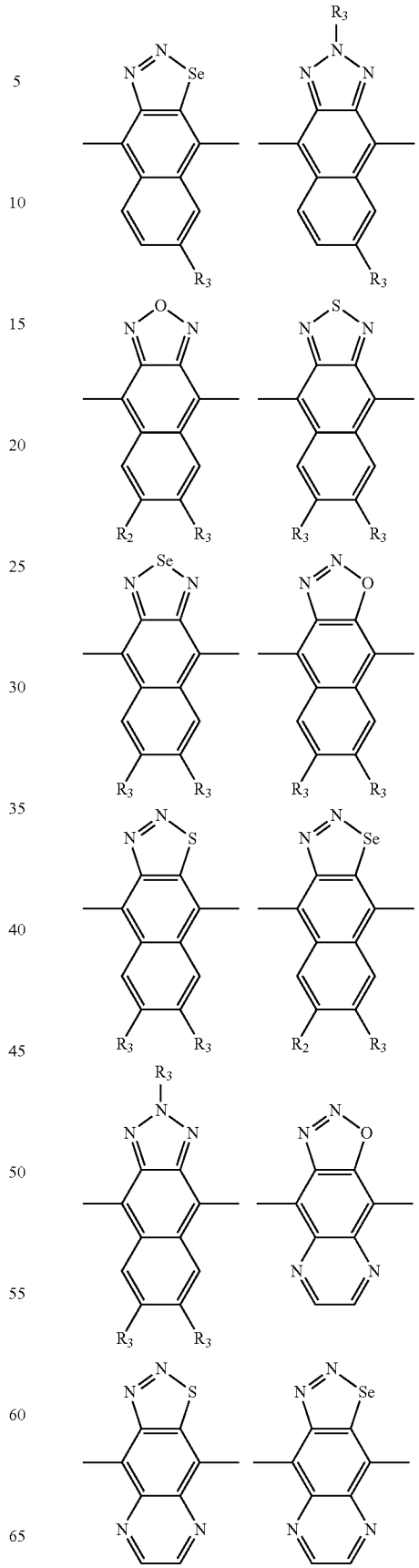

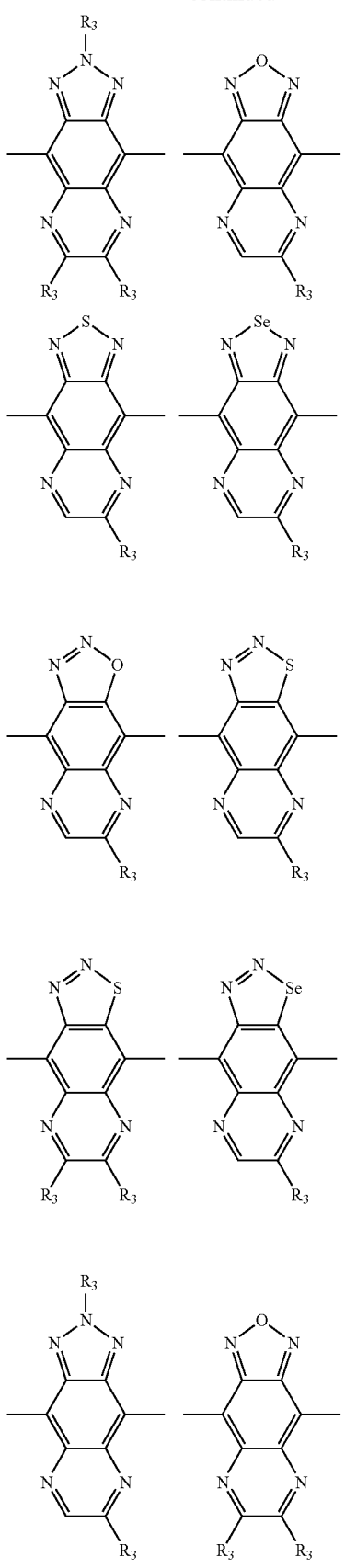
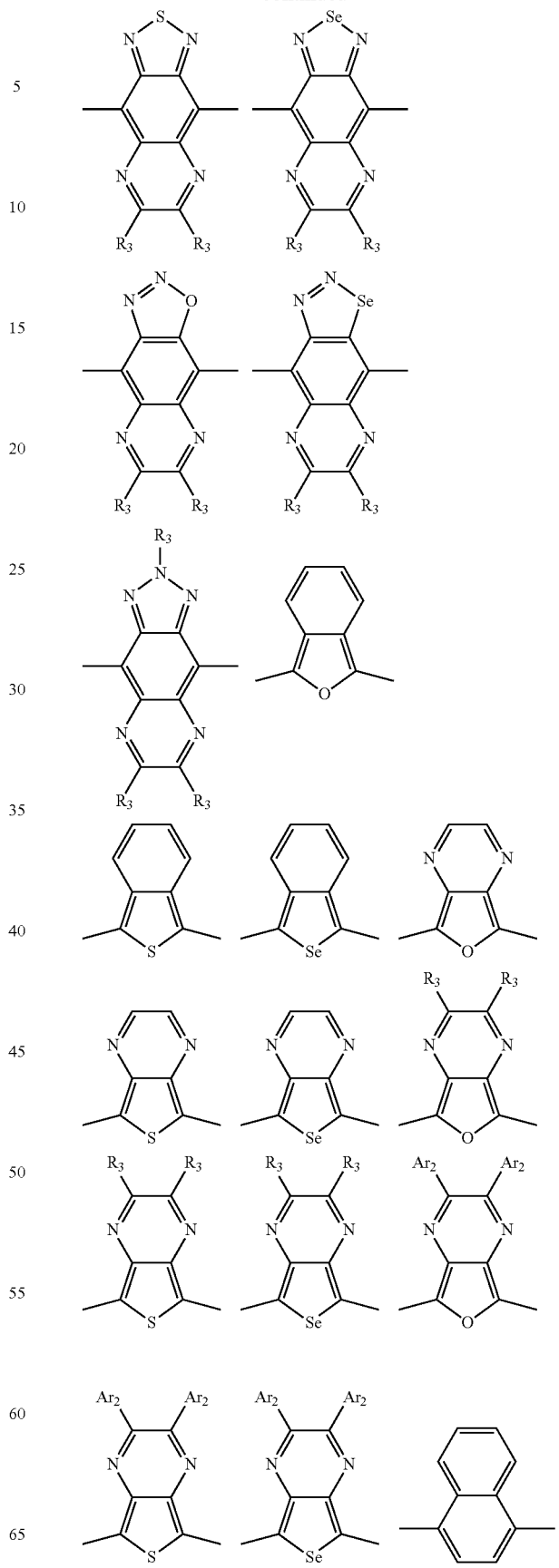

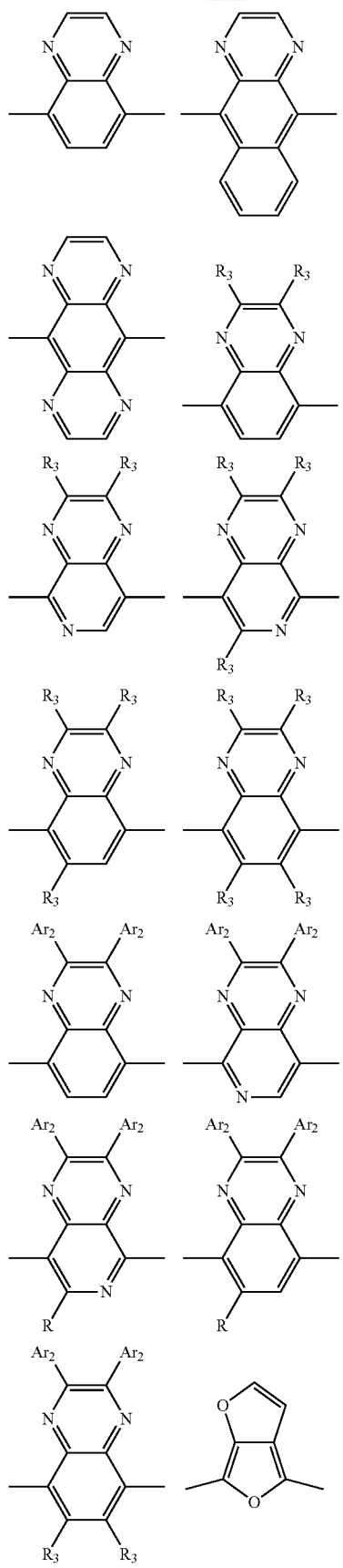
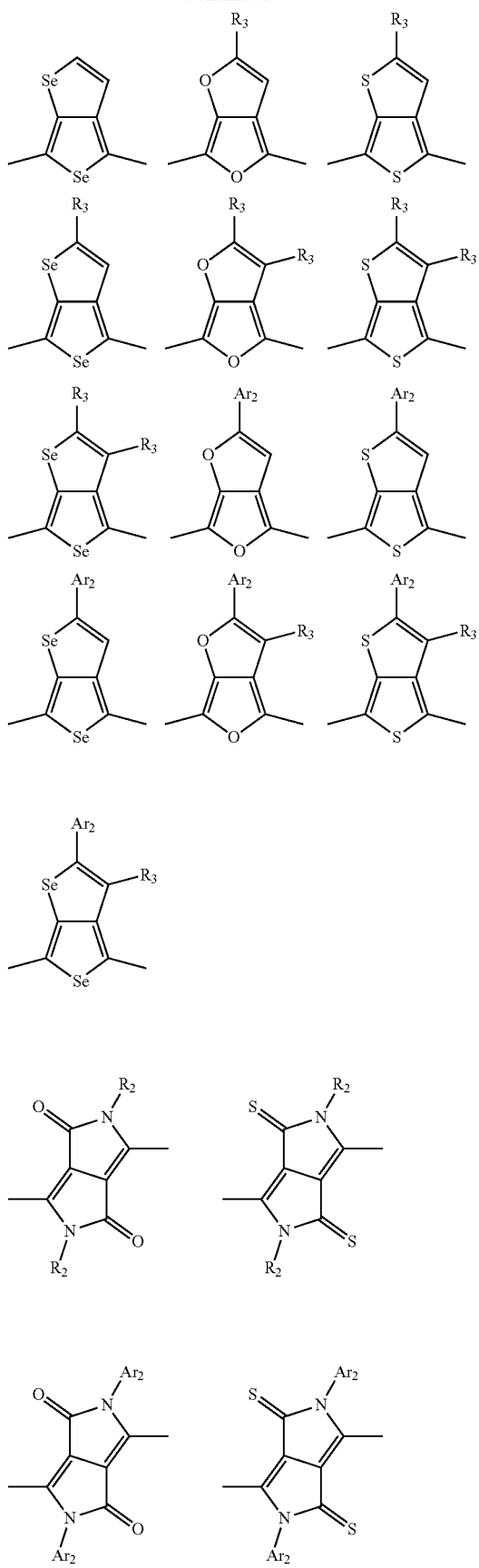

45
-continued
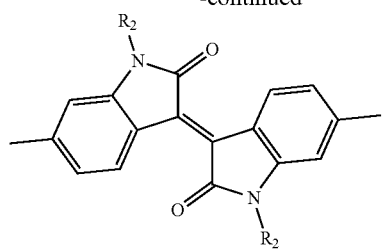
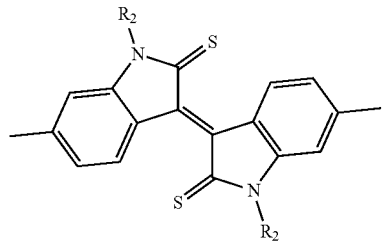
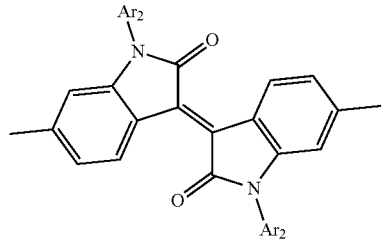
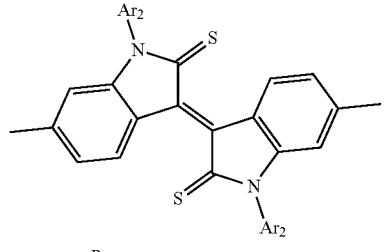
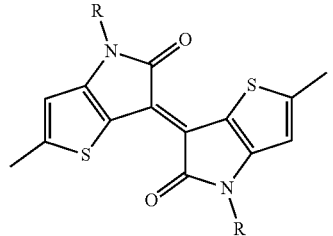
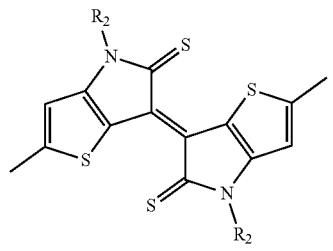
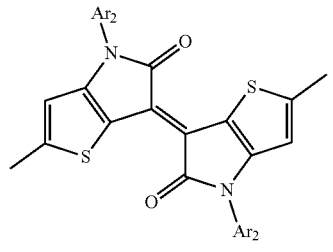
46
-continued
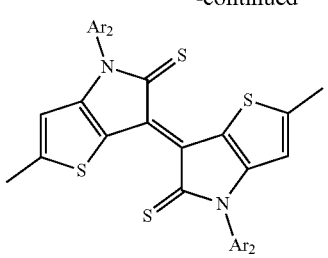
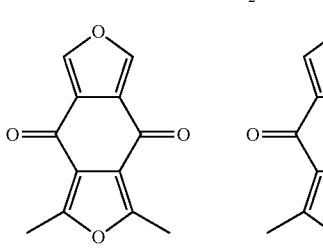
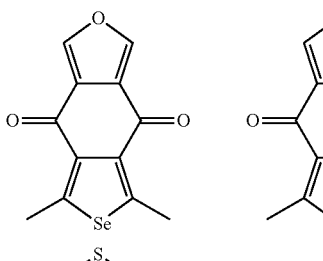
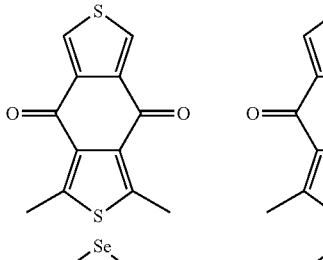
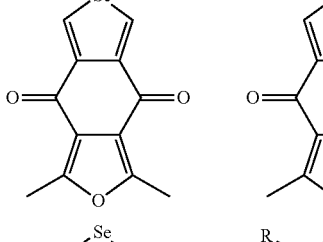
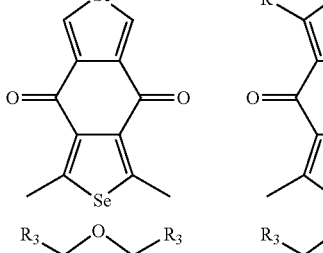
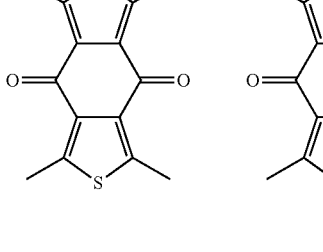

-continued
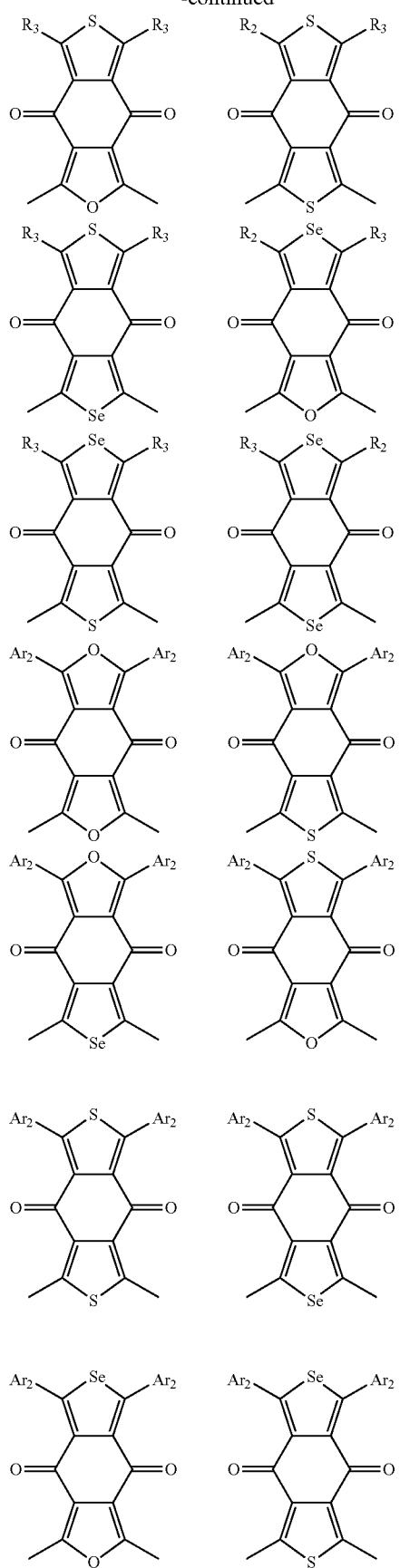
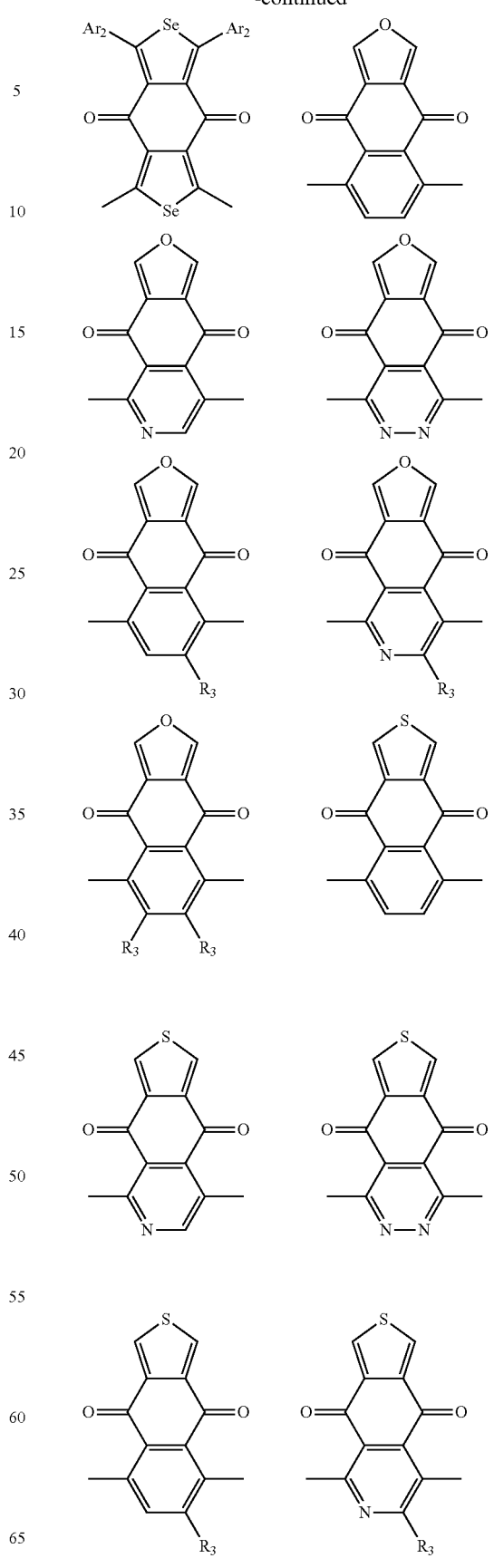

-continued
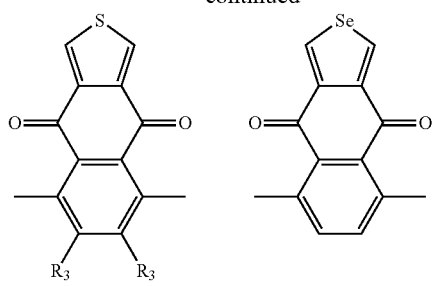
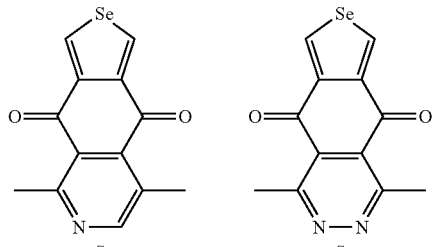
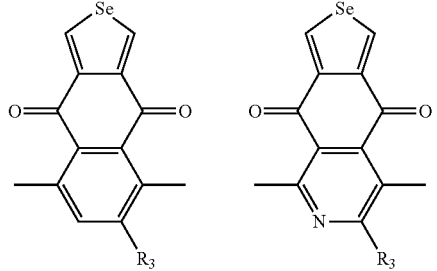
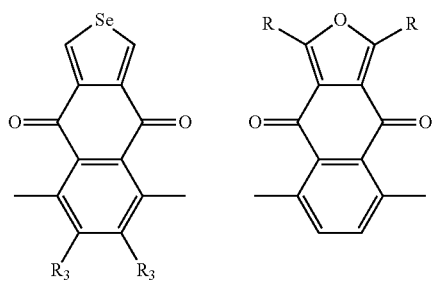
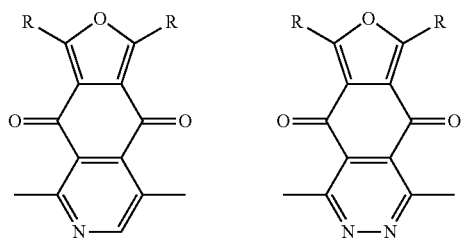
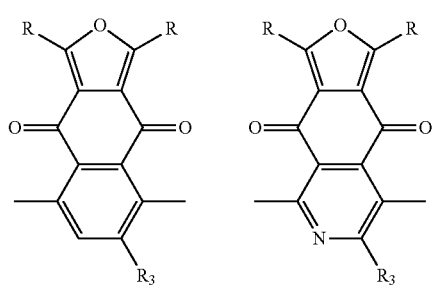
-continued
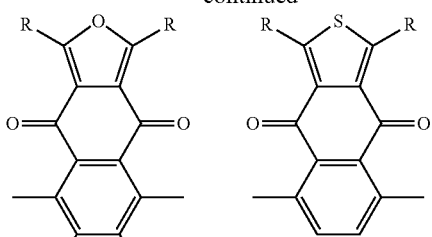
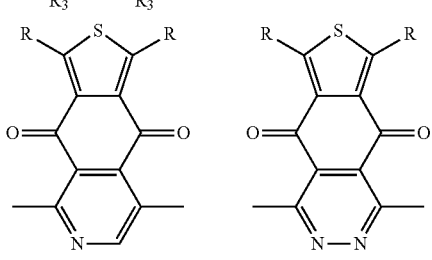
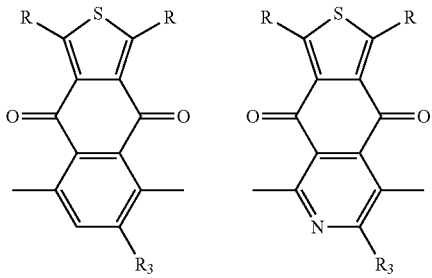
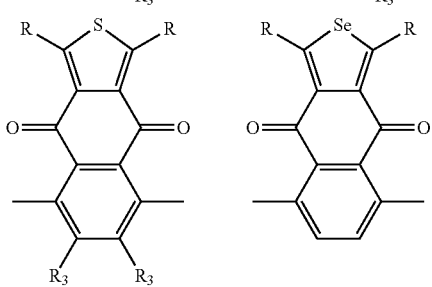
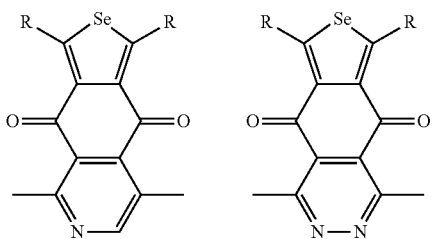
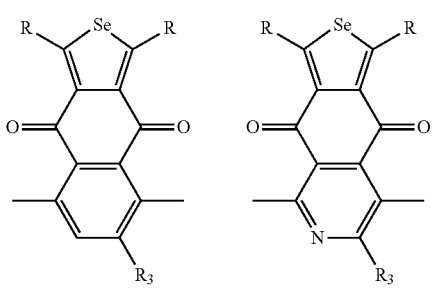

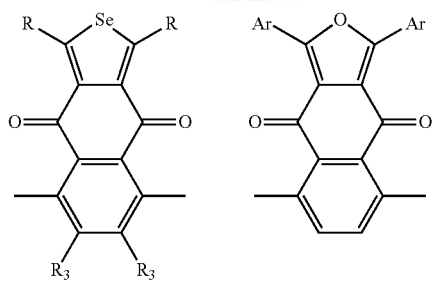
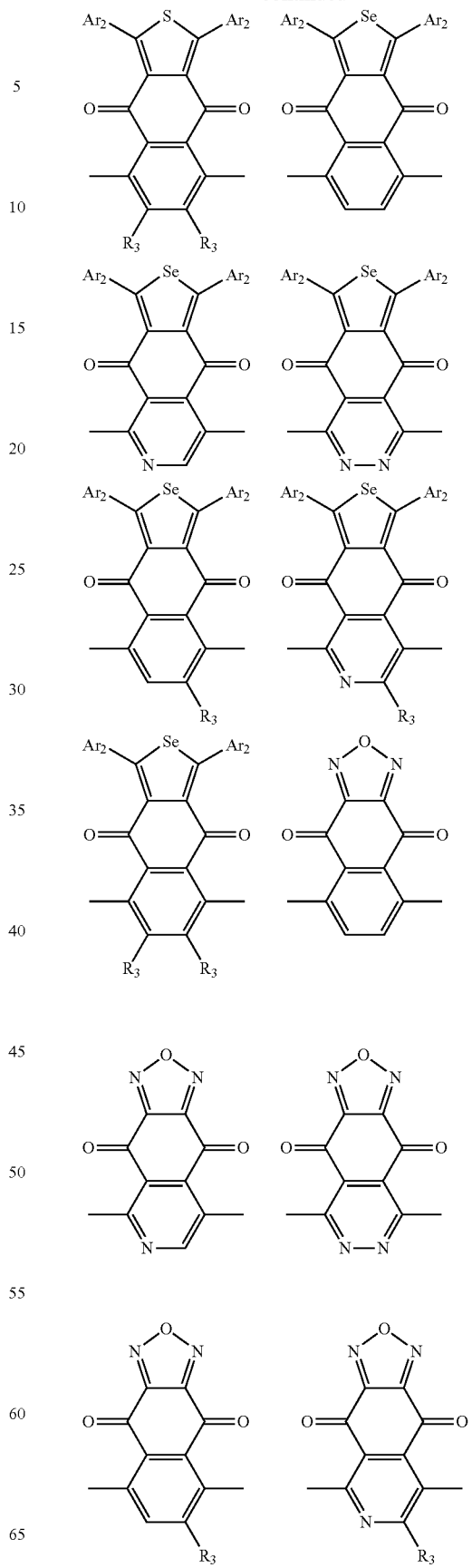

53
-continued
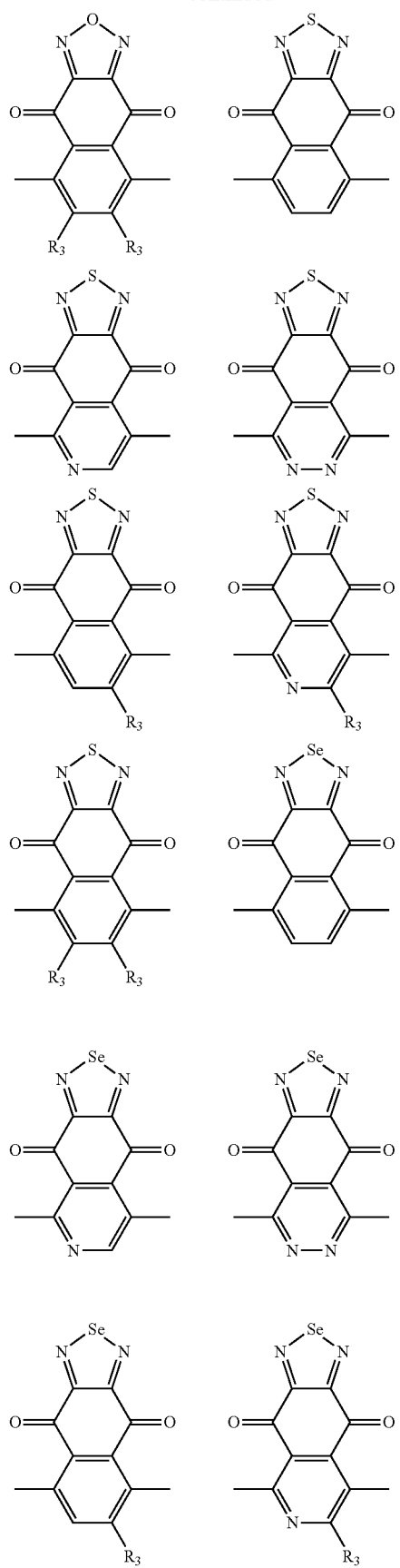
54
-continued
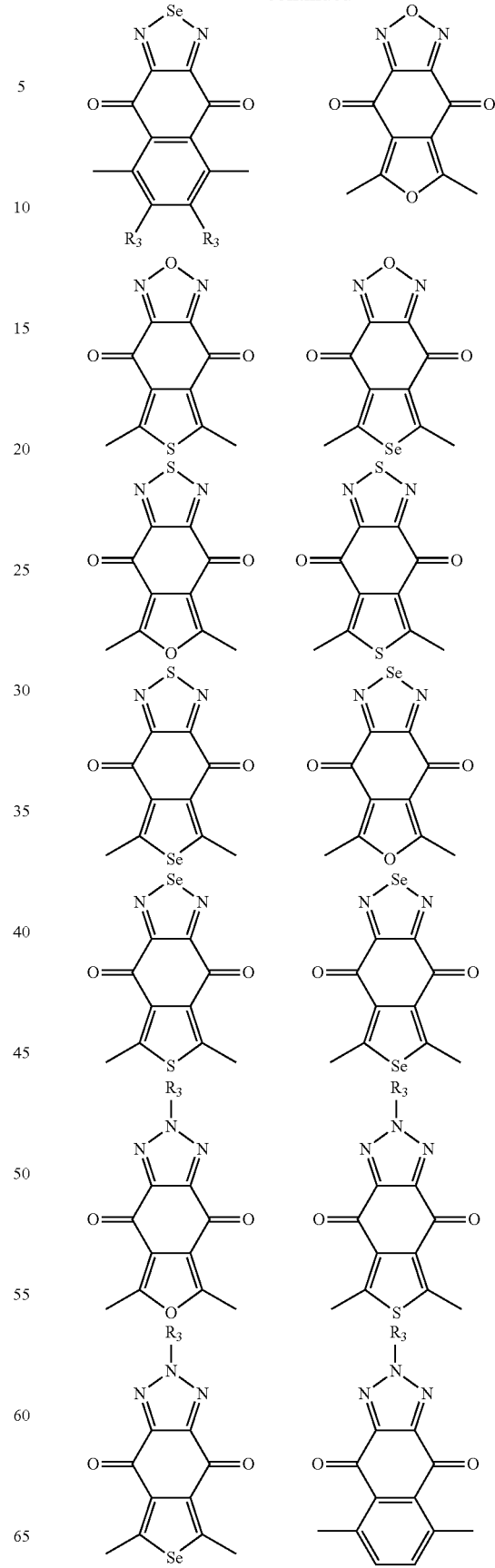

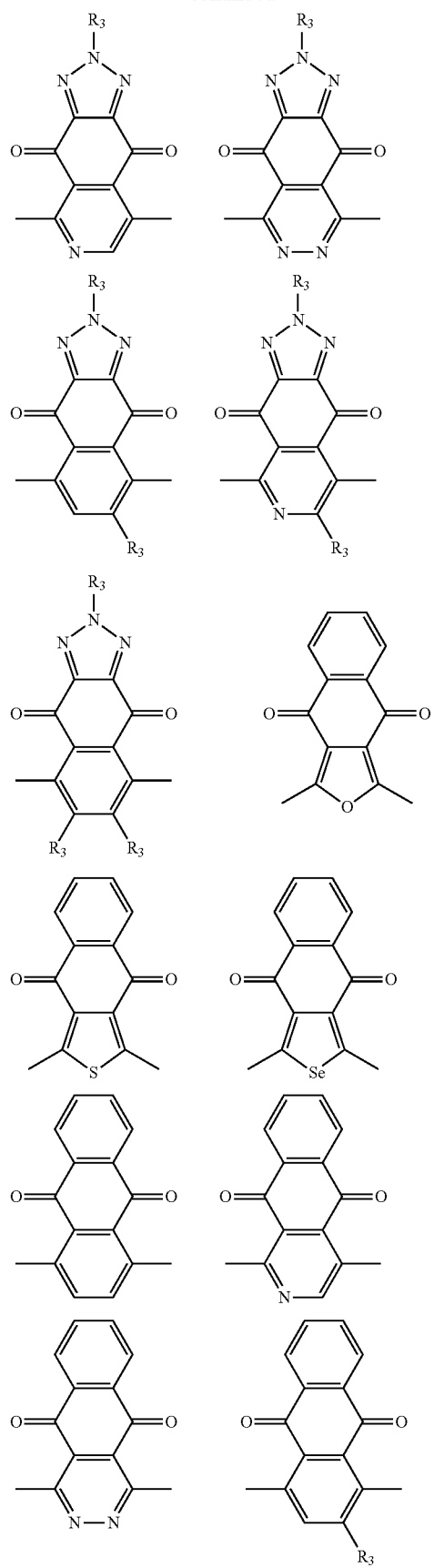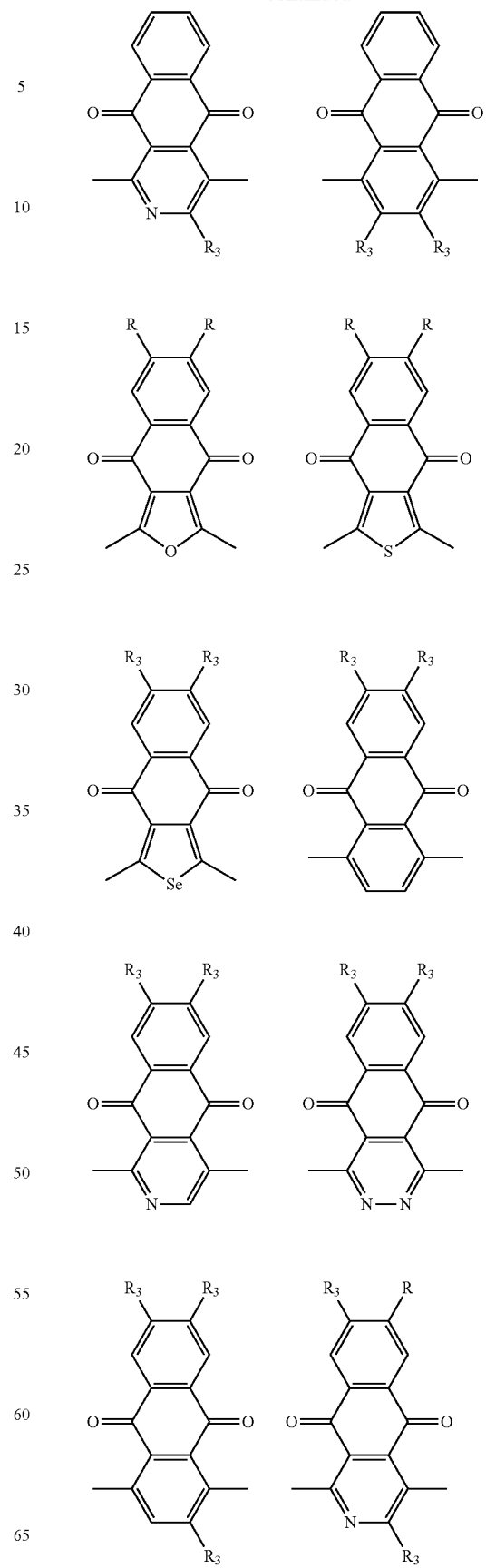

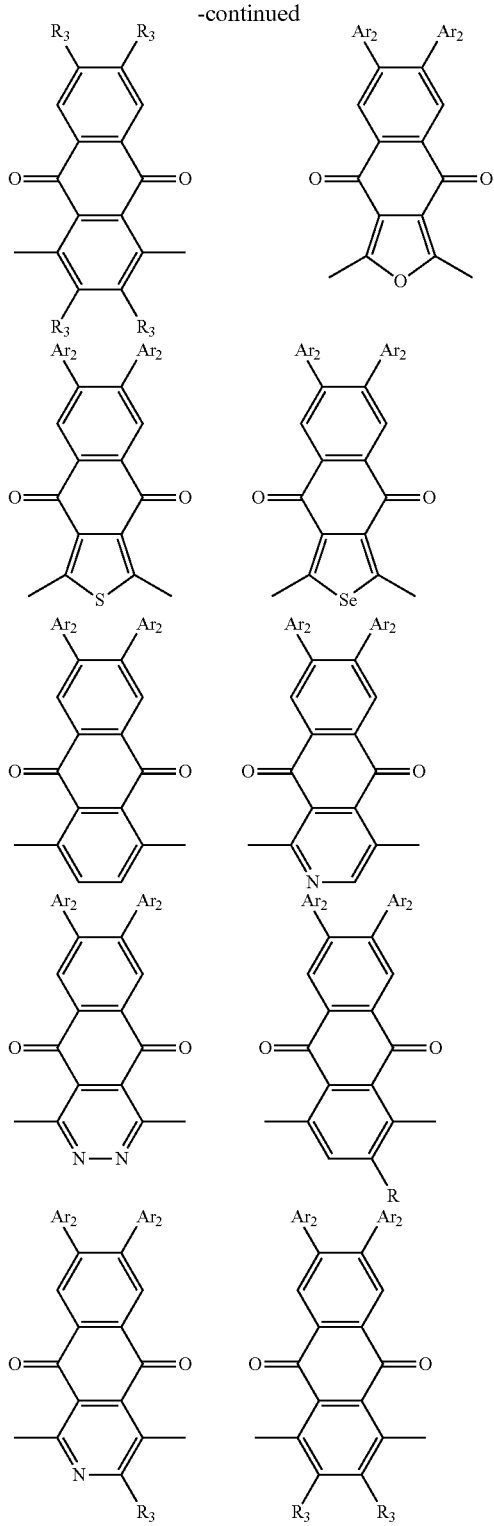

wherein R3 is selected from the group consisting of C1-C30 alkyl, C1-C30 branched alkyl, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain substituted by cyano, nitro, hydroxyl or keto and halo group; and wherein $Ar_2$ is selected from the group consisting of fused aromatic hydrocarbons, benzene fused heterocylic compounds, fused heterocylic compounds, benzene, five-membered heterocyclic ring and six-membered heterocyclic ring, wherein the benzene, the five-membered heterocyclic ring and the six-membered heterocyclic ring comprise C1-C30 alkyl groups, C1-C30 branched alkane, C1-C30 silane, C1-C30 ester, C1-C30 alkoxy, C1-C30 alkylthio, C1-C30 haloalkyl, C1-C30 carbon chain containing alkene or alkyne, C1-C30 alkyl chain containing cyano, nitro, hydroxyl or keto, and or halo group.

In one preferred embodiment, $Ar_2$ is selected from the group consisting of C8-C30 fused aromatic hydrocarbons, C6-C30 benzene fused heterocylic compounds, C5-C30 fused heterocylic compounds, C1-C30 benzene, C1-C30 five-membered heterocyclic ring and C1-C30 six-membered heterocyclic ring, wherein the C1-C30 benzene, the C1-C30 five-membered heterocyclic ring and the C1-C30 six-membered heterocyclic ring comprise C1-C30 alkyl groups, C1-C30 branched alkane, C1-C30 silane, C1-C30 ester, C1-C30 alkoxy, C1-C30 alkylthio, C1-C30 haloalkyl, C1-C30 carbon chain containing alkene or alkyne, C1-C30 alkyl chain containing cyano, nitro, hydroxyl or keto, or halo group.

In another embodiment, each π is independently selected from one of the following groups

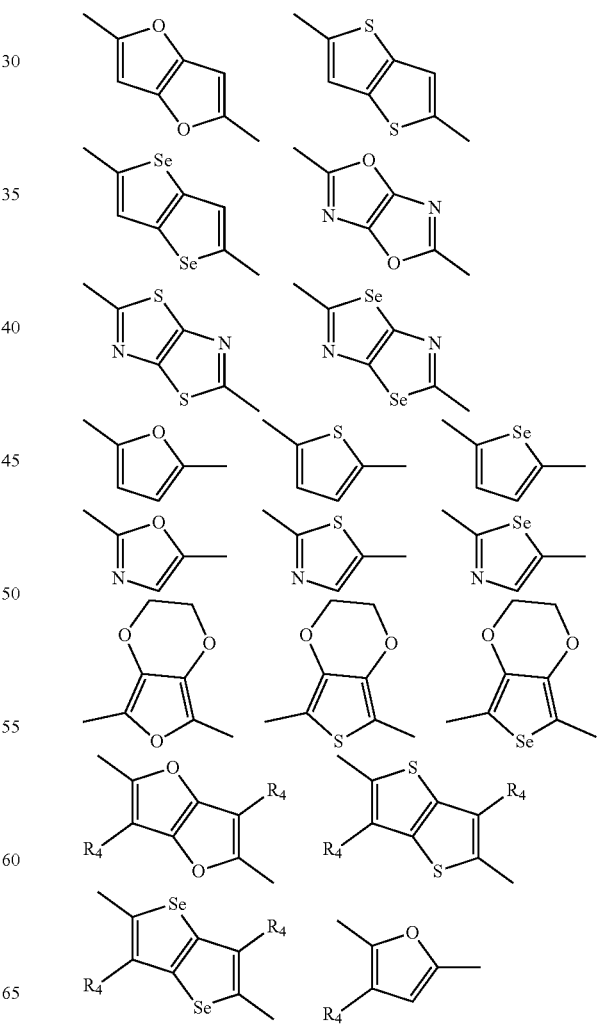

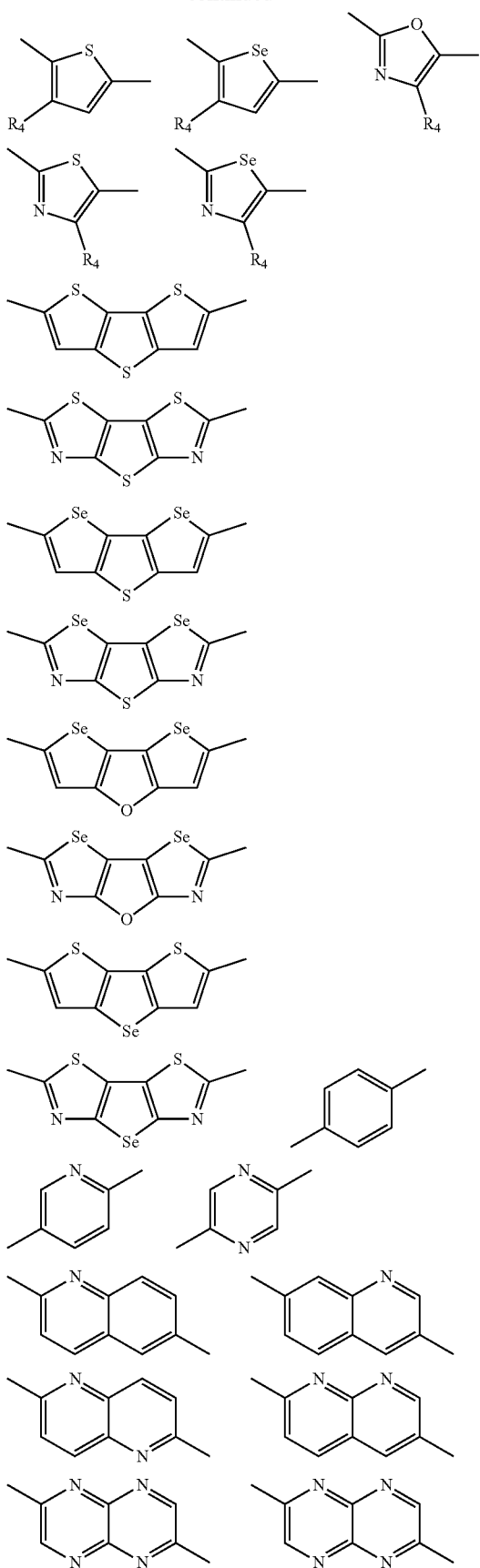
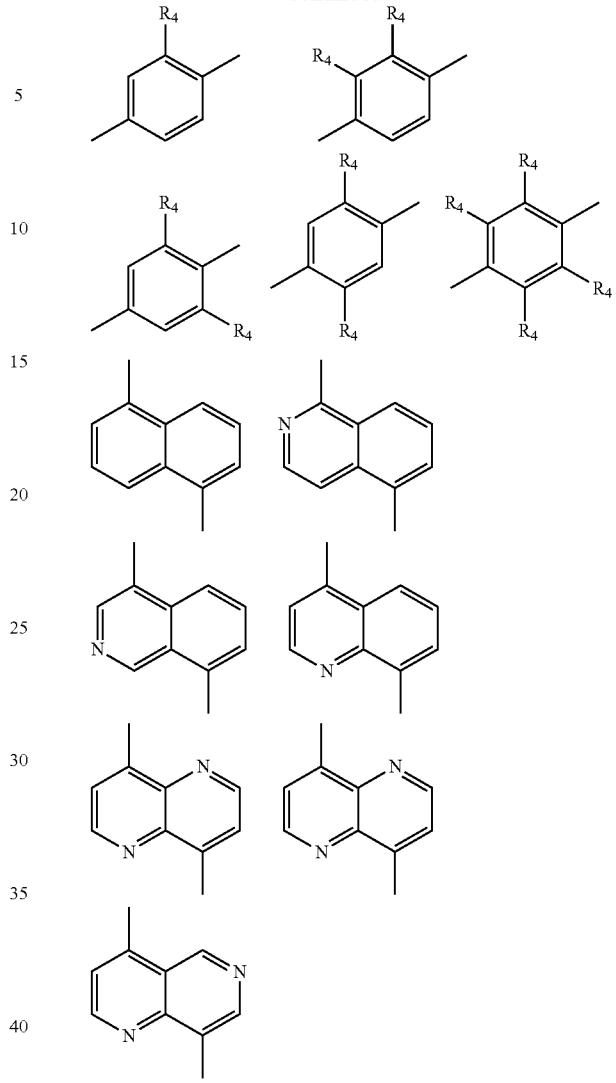

wherein $R_4$ is selected from the group consisting of C1-C30 alkyl, C1-C30 branched alkyl, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain substituted by cyano, nitro, hydroxyl or keto and halo group.

In another embodiment, an optical energy gap of the conjugated polymer is in a range from 1.85 to 2.5 eV.

In this embodiment, at least one of the conditions of A1≠A2 and D1≠D2 is established.

A second embodiment of the present invention discloses an organic photovoltaic device comprising a first electrode, a second electrode, and an active layer material. The active layer material is disposed between the first electrode and the second electrode, wherein the active layer material comprises a non-fullerene acceptor and a donor, and the donor is the conjugated polymer of the first embodiment.

In one embodiment, an optical energy gap of the non-fullerene acceptor is less than or equal to 1.7 eV.

In another embodiment, an optical energy gap of the donor is in a range from 1.85 to 2.5 eV.

EXAMPLE

Example 1: Material Synthesis (M3)

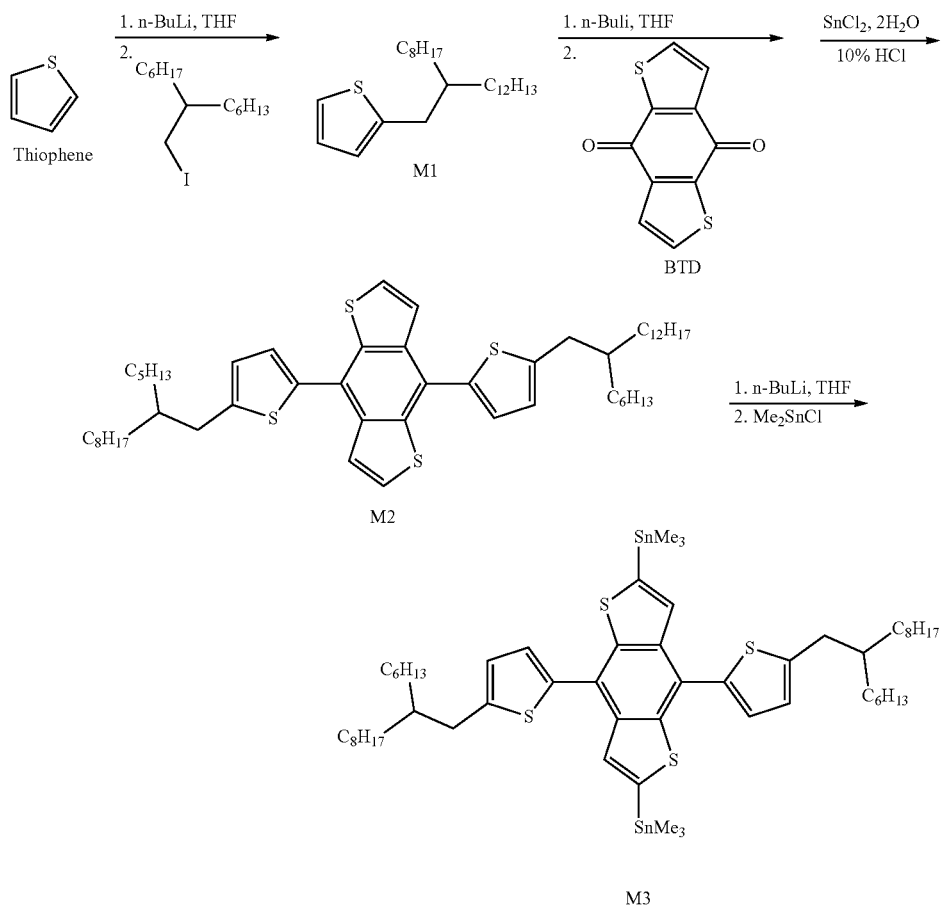

Synthesis of M1:

Placing Thiophene (8.4 g, 100.00 mmol) in a 500 mL four-necked reaction flask under argon, and dissolving Thiophene in 40 mL of anhydrous THF with stirring and cooling to 15° C.; dripping 40 mL of n-BuLi slowly and stirring continuously for 1 hour; adding dropwise 7-(iodomethyl) pentadecane (23.49 g, 66.67 mmol); warming slowly to room temperature and stirring overnight; under ice bath, adding 5 mL water to stop the reaction, adding 100 mL Heptane, and extracting three times with 20 mL water; dehydrating an organic layer and rotary evaporating to remove an organic solvent; distilling under reduced pressure (0.25 torr, 80-100° C.) to remove an impurities; overcoloring a residue with 20 g silica gel, and extract is Heptane; collecting the main fraction, removing the organic solvent, and drying in vacuo to obtain a pale yellow oil M1. Yield of M1: 13.37 g, 65%.

Synthesis of M2:

Placing M1 (13.37 g, 43.33 mmol) in a 500 mL three-necked flask under argon; adding 134 mL anhydrous Tetrahydrofuran (THF) to dissolve the M1 and cooling to 8° C. with stirring; adding dropwise 17.33 mL n-BuLi slowly, and stirring the reaction at 8° C. for 1 hour; adding benzo[1,2-b:4,5-b]dithiophene-4,8-dione (BTD) (4.66 g, 21.13 mmol) in one portion and stirring at 8° C. for 3 hours; adding $SnCl_2$·$2H_2O$ (11.65 g, 51.63 mmol) dissolved in 35 mL of 10% Hydrochloric acid (HCl) (aq) slowly at a temperature not exceeding 20° C.; warming slowly to room temperature after adding completely, and stirring overnight; adding 200 mL Heptane, and then extracting three times with 50 mL water and ensuring that aqueous solution is neutral; dehydrating an organic layer, filtering to obtain a solution, and rotary evaporating to remove an organic solvent; performing a column chromatography with extract of Heptane to remove organic solvent; drying at 50° C. under vacuum to obtain a pale yellow oil M2. Yield of M2: 11.88 g, 70%.

Synthesis of M3:

Placing M2 (11.88 g, 14.79 mmol) in a 500 mL three-necked flask under argon; adding 120 mL anhydrous THF to dissolve the M2 and cooling to −60° C.; adding dropwise 14.8 mL n-BuLi slowly, and stirring the reaction at −60° C. for 0.5 hour; adding dropwise $Me_3SnCl$ (8.25 g, 41.41 mmol) dissolved in 8 mL anhydrous THF slowly, warming to 10° C., and stirring 2 hours; adding 10 mL water to stop the reaction, adding 100 mL Heptane, and extracting three times with 20 mL water; dehydrating an organic layer, and rotary evaporating to remove an organic solvent to obtain a crude product; drying in vacuo to obtain a yellow oil M3. Yield of M3: 15.86 g, 95%. The 1H NMR spectrum of the M3 material is shown in FIG. 1.

Example 2: Material Synthesis (M6)

Example 3: Material Synthesis (M8)

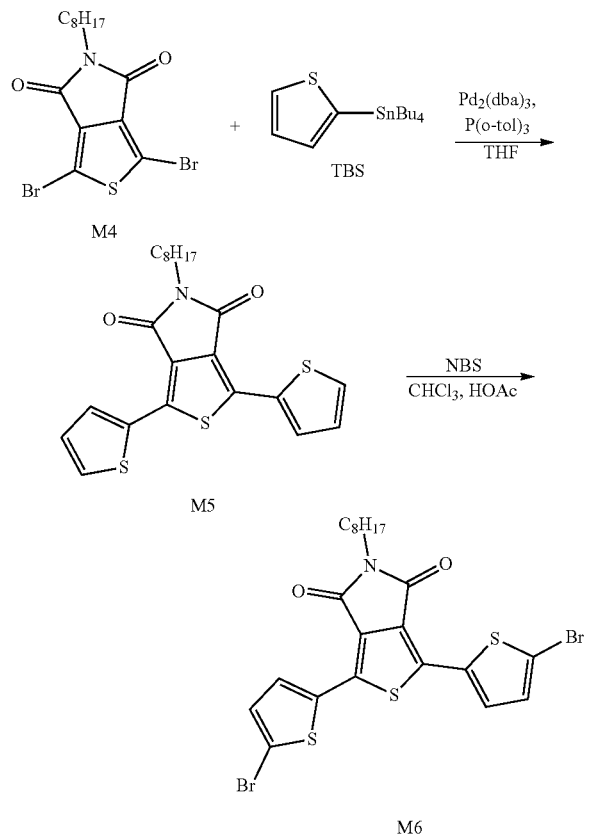

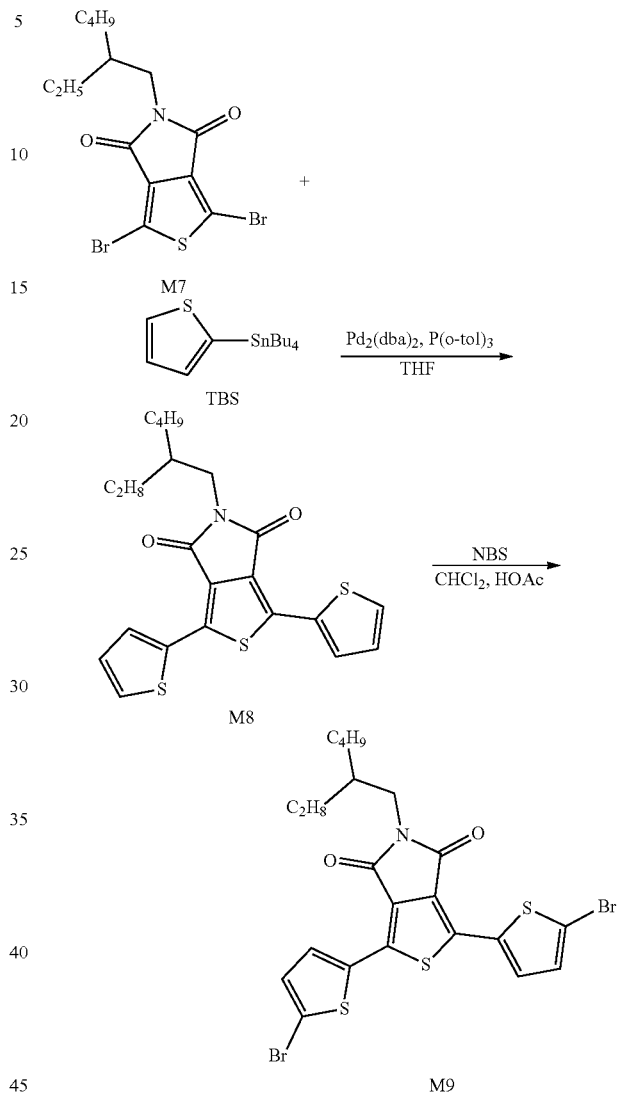

Synthesis of M5:

Adding M4 (shown in the above chemical equation) (5.00 g, 11.81 mmol) and tributyl(thiophen-2-yl)stannane TBS (9.03 g, 24.19 mmol) to a 100 mL reaction flask; adding 10 V THF (50 mL), and deoxidating at room temperature for 30 minutes; adding $Pd_2(dba)_3$ (0.43 g, 0.46 mmol) and $P(o\text{-}tol)_3$ (0.57 g, 1.87 mmol) under argon, heating in an oil bath until the reaction temperature reaches 67° C. and refluxing for 1 hour; returning to room temperature after the reaction is completed, filtering with Celite, concentrating, purifying with a column of 120 g silica gel and collecting the main fraction with extract of dichloromethane (DCM):Heptane 4:6; concentrating and drying in vacuo to obtain a fluorescent yellow powder M5. Yield of M5: 4.15 g, 81%.

Synthesis of M6:

Adding M5 (1.20 g, 2.79 mmol) to a 100 mL 3-neck reaction flask, adding 18 mL of $CHCl_3$ and 1.8 mL of Acetic acid (HOAc), and reacting under nitrogen; adding NBS (1.09 g, 6.12 mmol) slowly at room temperature; heating in an oil bath until the reaction temperature reaches 40° C. After 1 hour, the reaction is completed. Cooling and adding 54 mL MeOH, and suction filtering after solid is precipitated; dissolving the solid in 36 mL THF, adding dropwise 72 mL Isopropanol (IPA) at room temperature for recrystallization; suction filtering and drying in vacuo to obtain a fluorescent yellow powder M6. Yield of M6: 1.41 g, 85%. The 1H NMR spectrum of the M6 material is shown in FIG. 2.

Synthesis of M8:

Adding M7 (shown in the above chemical equation) (6.00 g, 14.17 mmol) and TBS (13.22 g, 35.42 mmol) to a 250 mL reaction flask; adding 60 mL THF (60 mL), and deoxygenating with argon for 30 minutes at room temperature; adding $Pd_2(dba)_3$ (0.52 g, 0.56 mmol) and $P(o\text{-}tol)_3$ (0.69 g, 2.26 mmol) under an argon atmosphere, and heating to a reaction temperature of 66° C. for reflux for 2 hours; returning to room temperature after the reaction is completed, filtering with Celite and silica gel, concentrating, purifying with a column of 300 g silica gel and collecting the main fraction with extract of DCM:Heptane=4:6; concentrating and drying in vacuo to obtain a fluorescent yellow powder M8. Yield of M8: 4.86 g, 80%.

Synthesis of M9:

Adding M8 (4.86 g, 11.31 mmol) to a 100 mL 3-neck reaction flask, adding 72 mL of $CHCl_3$ and 7.2 mL of HOAc, and reacting under nitrogen, adding NBS (4.42 g, 24.83 mmol) slowly, heating in an oil bath until the reaction temperature reaches 40° C. After 1 hour, the reaction is completed; cooling and adding 145 mL MeOH, and suction filtering after solid is precipitated; dissolving the solid in 30 mL THF, adding dropwise 60 mL IPA at room temperature for recrystallization; suction filtering and drying in vacuo to obtain a fluorescent yellow powder M9. Yield of M9:5.8 g, 87.3%. The 1H NMR spectrum of the M9 material is shown in FIG. 3.
Example 4: Material Synthesis (P1, P2)
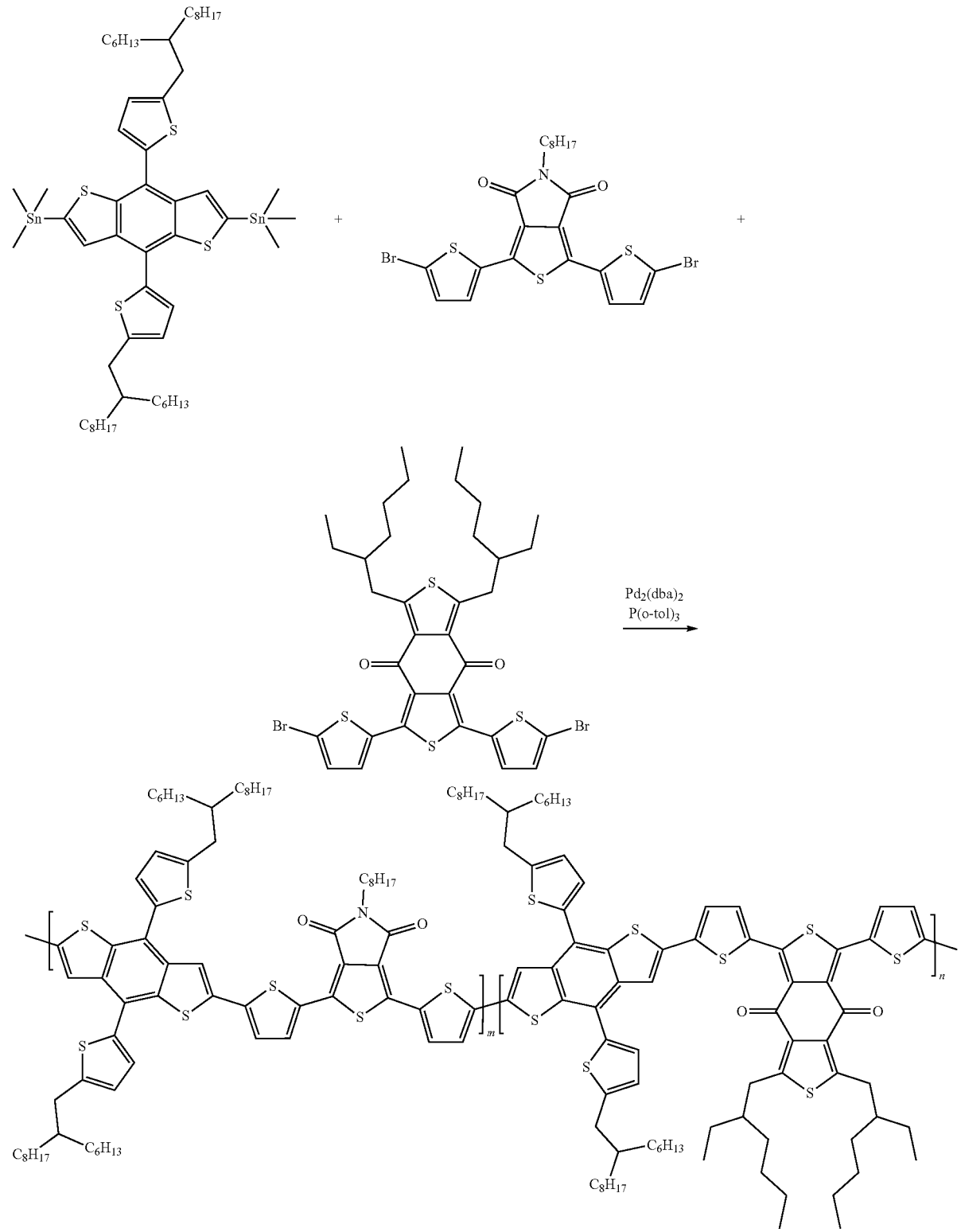

Synthesis of 40-033 (P1): m:n=9:1

Adding M3 (0.63 g, 0.56 mmol), M6 (0.30 g, 0.51 mmol) and 1,3-Bis(5-bromothiophen-2-yl)-5,7-bis(2-ethylhexyl)benzo[1,2-c']dithiophene-4,8-dione (BDD) (0.043 g, 0.056 mmol) to a 100 mL three-necked flask. Adding 22 mL o-xylene. Bubbling argon and stirring for 30 minutes. Adding $Pd_2(dba)_3$ (0.021 g, 0.0225 mmol) and $P(o\text{-}tol)_3$ (0.027 g, 0.090 mmol) under argon. Heating the reaction to 130° C., and reacting for 17 hours. Cooling and pouring the reactant into methanol to precipitate. Purifying with Soxhlet extraction and a purification solvent is methanol and dichloromethane. Finally, dissolving the product in chlorobenzene and precipitating in methanol. Collecting solid and rinsing with methanol. Drying in vacuum oven overnight. Yield of P1:0.62 g, 87.7%.

Synthesis of 40-033 (P2): m:n=8:2

Adding M3 (0.72 g, 0.64 mmol), M6 (0.30 g, 0.51 mmol) and BDD (0.098 g, 0.13 mmol) to a 100 mL three-necked flask; adding 25 mL o-xylene; bubbling argon and stirring for 30 minutes; adding $Pd_2(dba)_3$ (0.023 g, 0.0255 mmol) and $P(o\text{-}tol)_3$ (0.031 g, 0.102 mmol) under argon; heating the reaction to 130° C., and reacting for 18 hours; cooling and pouring the reactant into methanol to precipitate; purifying with Soxhlet extraction and a purification solvent is methanol and dichloromethane; finally, dissolving the product in chlorobenzene and precipitating in methanol; collecting solid and rinsing with methanol; drying in vacuum oven overnight. Yield of P2:0.69 g, 85.5%.

Example 5: Material Synthesis (P3)

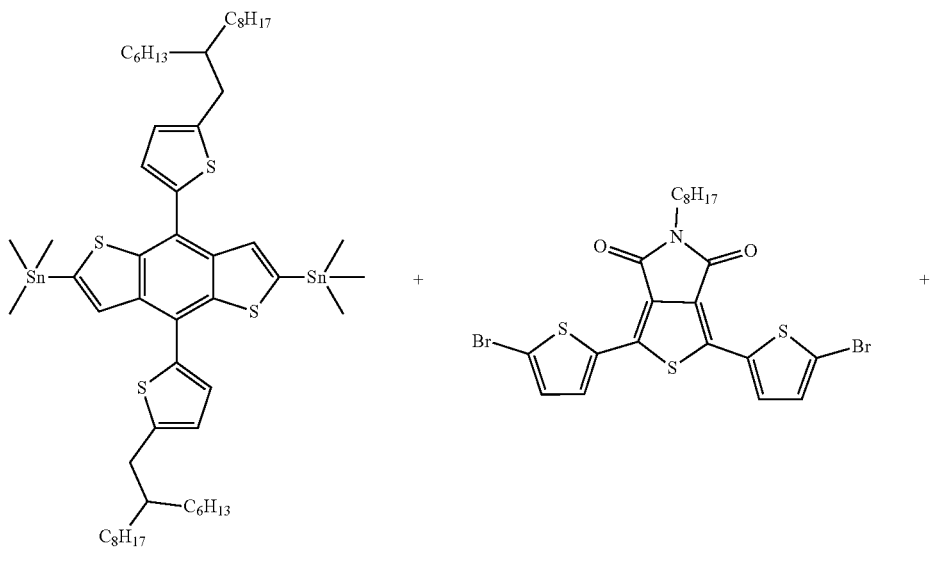

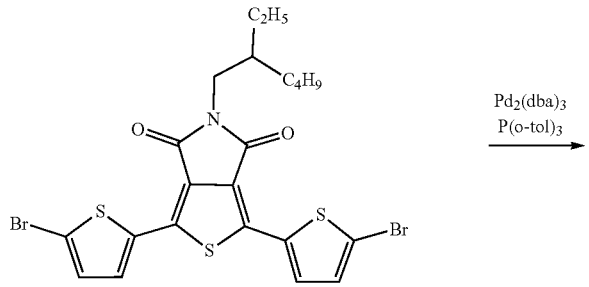

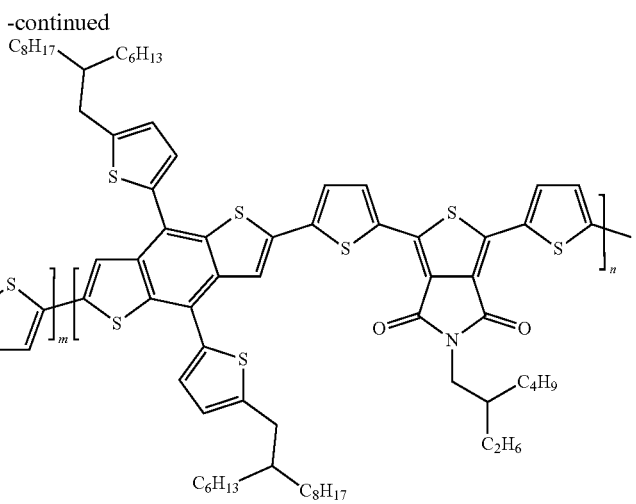

-continued

Synthesis of 40-073 (P3): m:n=5:5

Adding M3 (0.54 g, 0.48 mmol), M6 (0.14 g, 0.24 mmol) and M9 (0.14 g, 0.24 mmol) to a 100 mL three-necked flask; adding 19 mL o-xylene; bubbling argon and stirring for 30 minutes; adding Pd$_2$(dba)$_3$ (0.017 g, 0.0192 mmol) and P(o-tol)$_3$ (0.0233 g, 0.0767 mmol) under argon; heating the reaction to 130° C., and reacting for 19 hours; cooling and pouring the reactant into methanol to precipitate; purifying with Soxhlet extraction and a purification solvent is methanol and dichloromethane; finally, dissolving the product in chlorobenzene and precipitating in methanol; collecting solid and rinsing with methanol; drying in vacuum oven overnight. Yield of P3:0.41 g, 69.9%.

Example 6: Material Synthesis (P4)

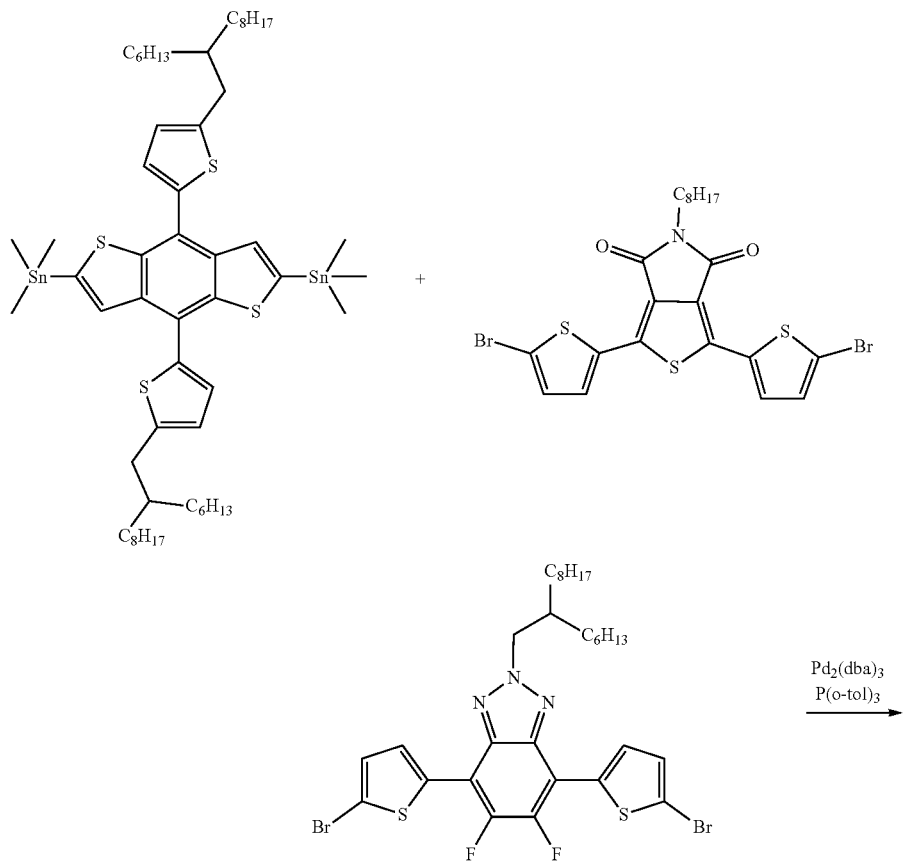

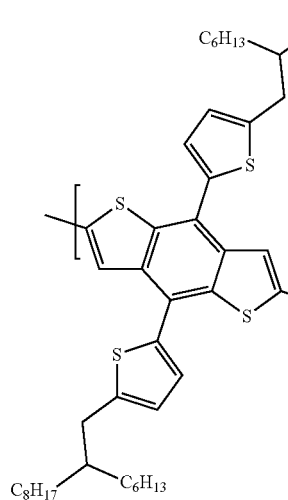
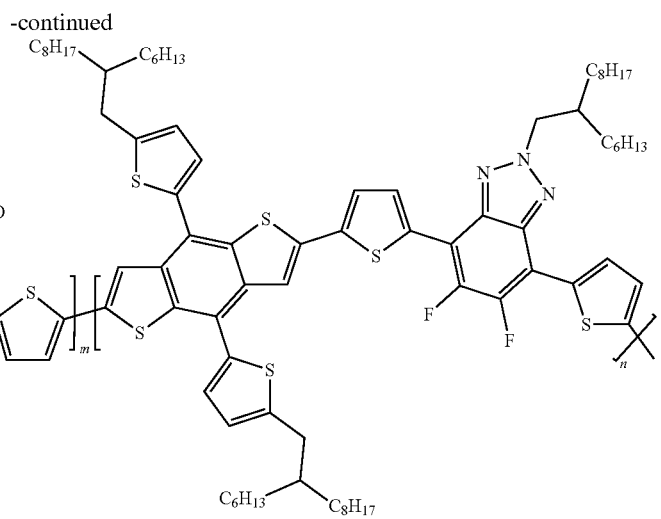

Synthesis of 40-082 (P4): m:n=9:1

Adding M3 (0.73 g, 0.65 mmol), M6 (0.34 g, 0.58 mmol) and 4,7-bis(5-bromothiophen-2-yl)-5,6-difluoro-2-(2-hexyldecyl)-2H-benzo[d][1,2,3]triazole (BTZ) (0.045 g, 0.065 mmol) to a 100 mL three-necked flask; adding 25 mL o-xylene; bubbling argon and stirring for 30 minutes, adding Pd$_2$(dba)$_3$ (0.024 g, 0.026 mmol) and P(o-tol)$_3$ (0.032 g, 0.104 mmol) under argon; heating the reaction to 130° C., and reacting for 22 hours; cooling and pouring the reactant into methanol to precipitate; purifying with Soxhlet extraction and a purification solvent is methanol and dichloromethane; finally, dissolving the product in chlorobenzene and precipitating in methanol; collecting solid and rinsing with methanol; drying in vacuum oven overnight. Yield of P4: 0.60 g, 75.2%.

Example 7: Material Synthesis (P5)

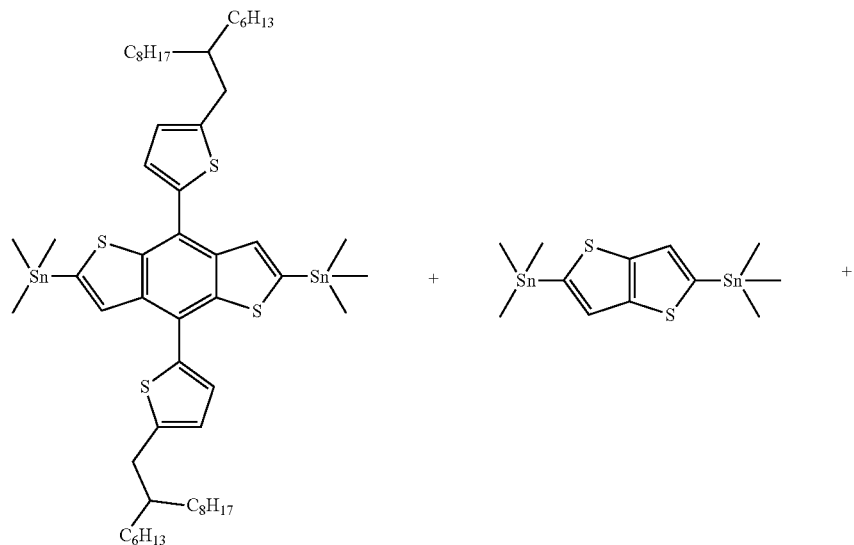

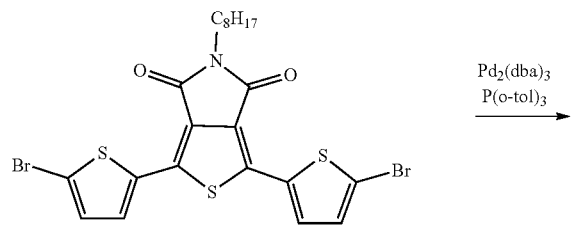

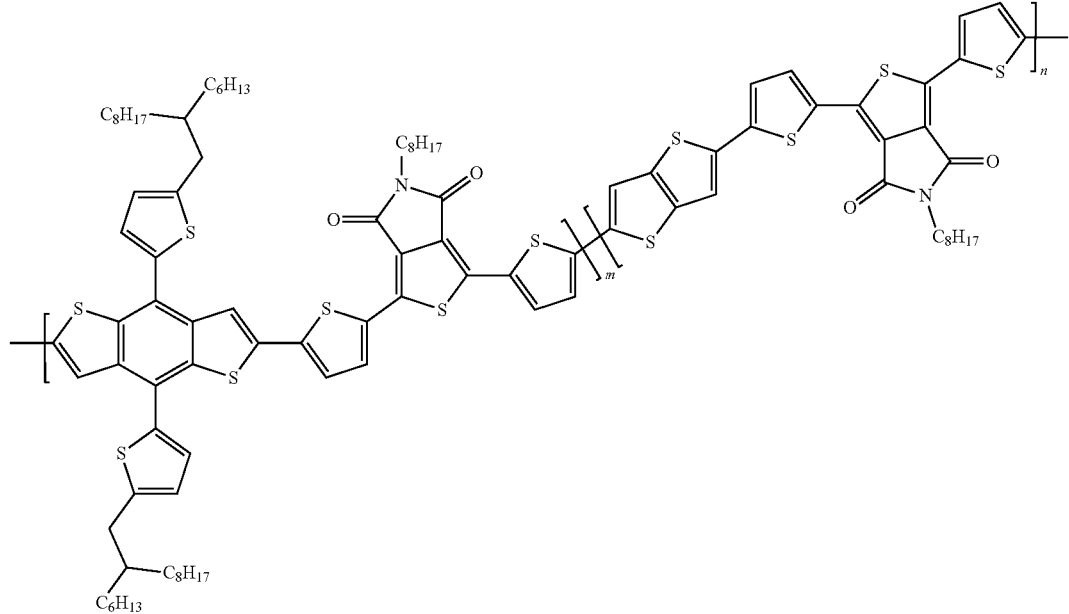

Synthesis of 26-145 (P5): m:n=0.95:0.05

Adding M3 (0.57 g, 0.51 mmol), M6 (0.31 g, 0.53 mmol) and 2,5-bis(trimethylstannyl)thieno[3,2-b]thiophene (0.0125 g, 0.027 mmol) to a 100 mL three-necked flask, adding 40 mL chlorobenzene; bubbling argon and stirring for 30 minutes; adding $Pd_2(dba)_3$ (0.020 g, 0.021 mmol) and $P(o\text{-tol})_3$ (0.026 g, 0.086 mmol) under argon; heating the reaction to 130° C., and reacting for 22 hours; cooling and pouring the reactant into methanol to precipitate; purifying with Soxhlet extraction and a purification solvent is methanol and dichloromethane; finally, dissolving the product in chlorobenzene and precipitating in methanol; collecting solid and rinsing with methanol; drying in vacuum oven overnight. Yield of P5:0.41 g, 64.8%.

Example 8: Material Synthesis (P6)

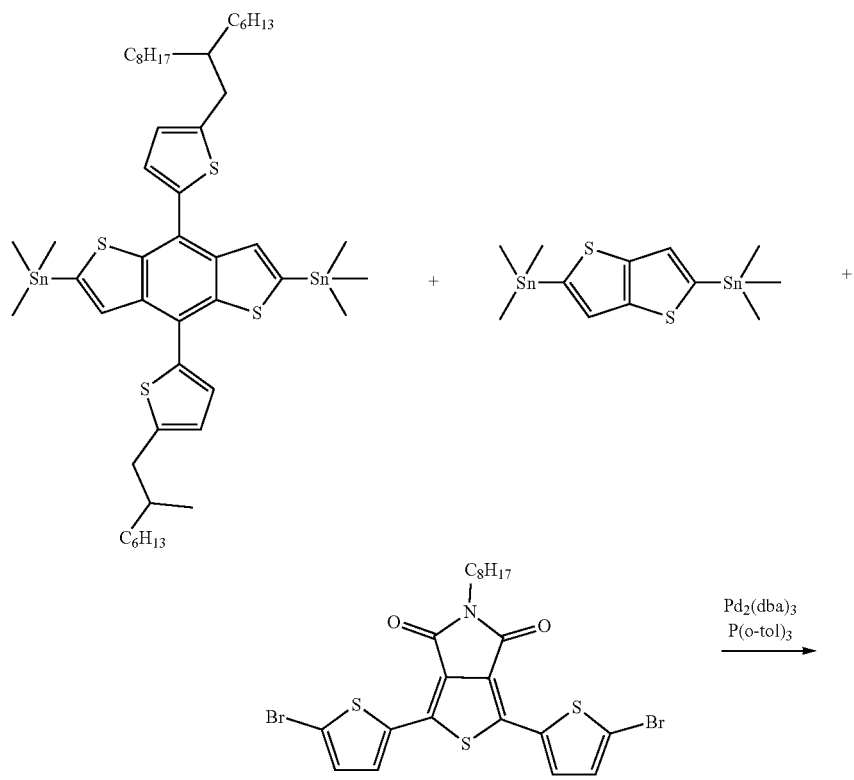

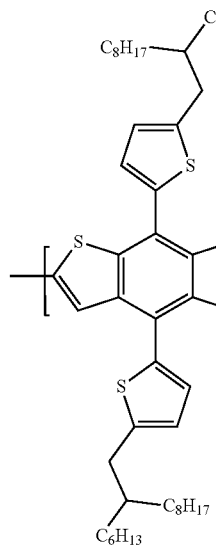
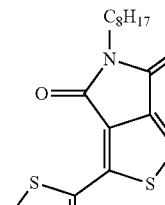
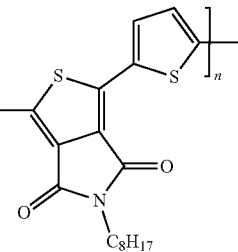

Synthesis of 26-147 (P6): m:n=0.9:0.1

Adding M3 (0.70 g, 0.62 mmol), M6 (0.40 g, 0.69 mmol) and 2,5-bis(trimethylstannyl)thieno[3,2-b]thiophene (0.0322 g, 0.069 mmol) to a 100 mL three-necked flask; adding 54 mL chlorobenzene; bubbling argon and stirring for 30 minutes; adding $Pd_2(dba)_3$ (0.025 g, 0.027 mmol) and $P(o\text{-tol})_3$ (0.034 g, 0.110 mmol) under argon; heating the reaction to 130° C., and reacting for 18 hours; cooling and pouring the reactant into methanol to precipitate; purifying with Soxhlet extraction and a purification solvent is methanol and dichloromethane; finally, dissolving the product in chlorobenzene and precipitating in methanol; collecting solid and rinsing with methanol; drying in vacuum oven overnight. Yield of P6:0.62 g, 77.4%.

Example 9: Manufacturing and Testing of the Organic Photovoltaic Devices

A glass coated by a pre-patterned Indium Tin Oxides (ITO) with a sheet resistance of ~11 Ω/sq is used as a substrate. The substrate is ultrasonically oscillated in neutral detergent, deionized water, acetone, and isopropanol in sequence, and washed in each step for 15 minutes. The washed substrate is further treated with a $UV\text{-}O_3$ cleaner for 15 minutes. A top coating layer of ZnO (diethylzinc solution, 15 wt % in toluene, diluted with tetrahydrofuran) is spin coated on the ITO substrate with a rotation rate of 5000 rpm for 30 seconds, and then baked at 120° C. in air for 20 minutes. The active layer solution is prepared in o-xylene or chlorobenzene (CB), and 0.5% (v/v) 1,8-diiodoocatne (DIO) is added as an additive to adjust the film morphology (polymer: IC trapezoid molecular weight ratio is 1:1~1:1.25). The IC trapezoidal molecule also contain Indacenodithienothiophene (IDTT) derivative, such as:

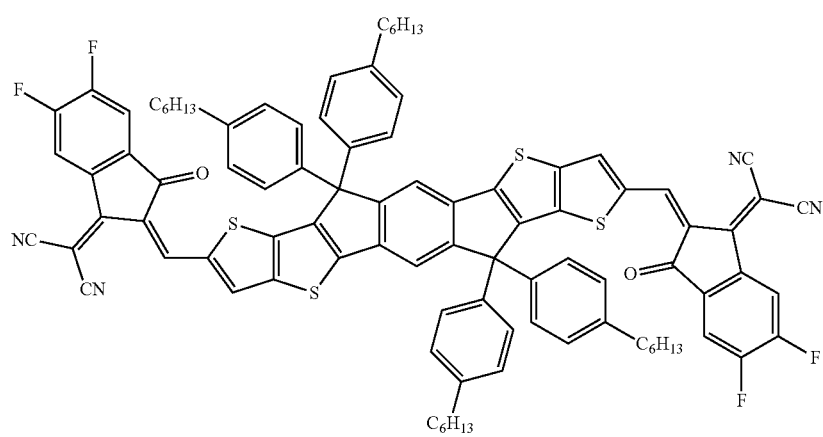

IDTT-4FIC

-continued
IDTT-2M
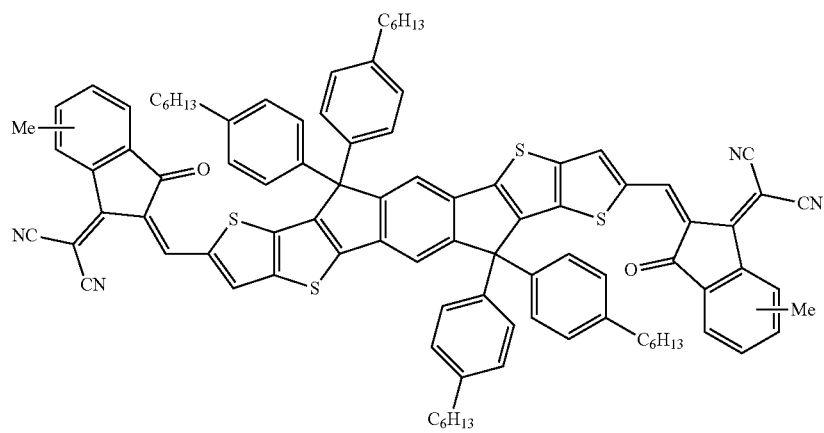
IDTT-2OR
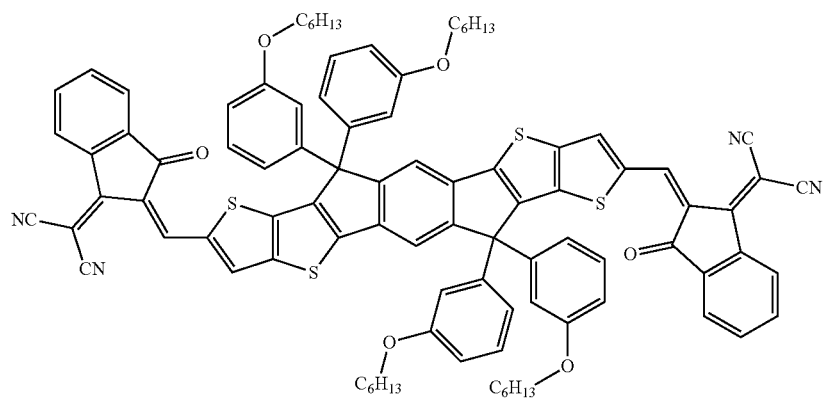
IDTT-IC
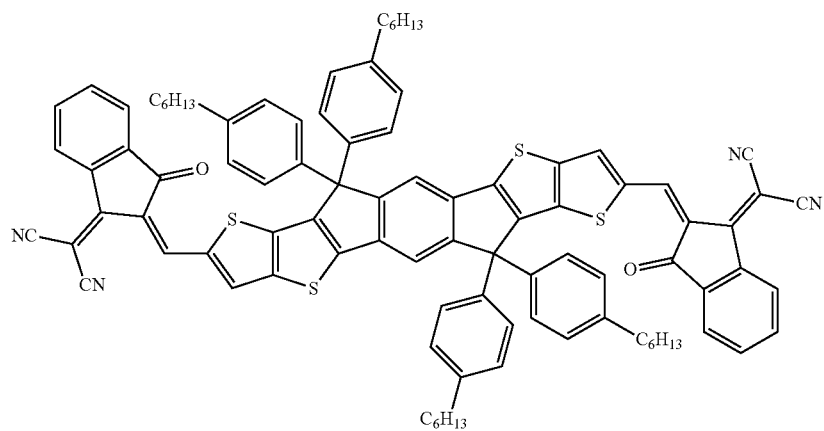
M-IDTT-IC
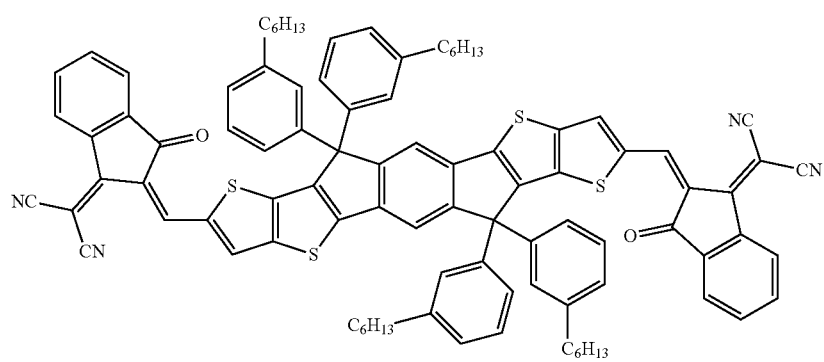

IDTT-Th

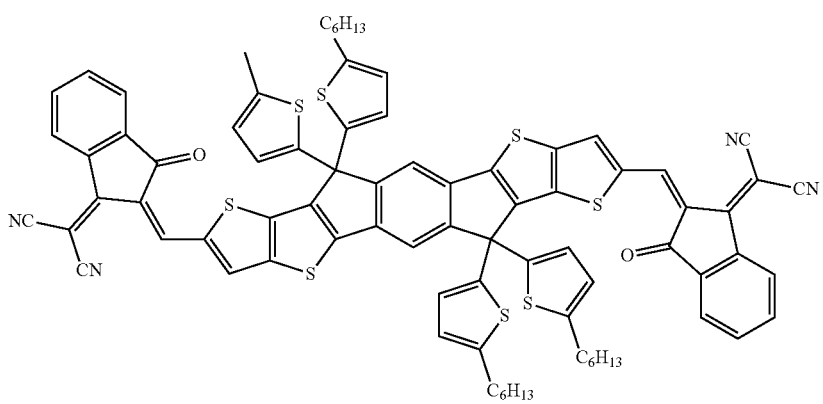

The concentration of the polymer is 8-10 mg/mL. To completely dissolve the polymer, the active layer solution is stirred on a hot plate at 100° C. for at least 3 hours. Then, the polymer solution is returned to the room temperature for spin coating, wherein the film thickness is controlled about 100 nm by coating speed. The mixed film is annealed at 120° C. for 5 minutes, and then is transferred to a hot vaporizer. A thin layer (8 nm) of $MoO_3$ is deposited as an anode intermediate layer under a vacuum of $3\times10^{-6}$ Torr, and then a silver layer with a thickness of 100 nm is deposited as an upper electrode. All batteries are encapsulated with epoxy resin in a glove box. The J-V characteristics of the components is measured by a solar simulator (having a xenon lamp with an AM 1.5 G filter) in air and at room temperature and under AM 1.5 G (100 mW $cm^{-2}$). Here, a standard ruthenium dipole with a KG5 filter is used as a reference cell to calibrate the light intensity to make the mismatch portion of the spectrum consistent. The J-V characteristics are recorded by a Keithley 2400 source meter instrument. A typical battery has an element area of 4 $mm^2$, which is defined by the area of the metal mask aligning element with the aperture. Each element has 4 effective points, and the average of these 4 points is $PCE^{AVE}$. Each element has 4 effective points, and the highest value of these is $PCE^{BEST}$.

Example 10: Performance Analysis of the Organic Photovoltaic Devices

FIG. 4 shows a representative configuration of an organic photovoltaic device, comprising a substrate 20 (e.g., glass), an anode 22 (e.g., ITO), a cathode 26 (e.g., aluminum or calcium), and an active layer 24 between the anode and cathode, and material of the active layer is the conjugated polymer of the present invention.

P5 and P6

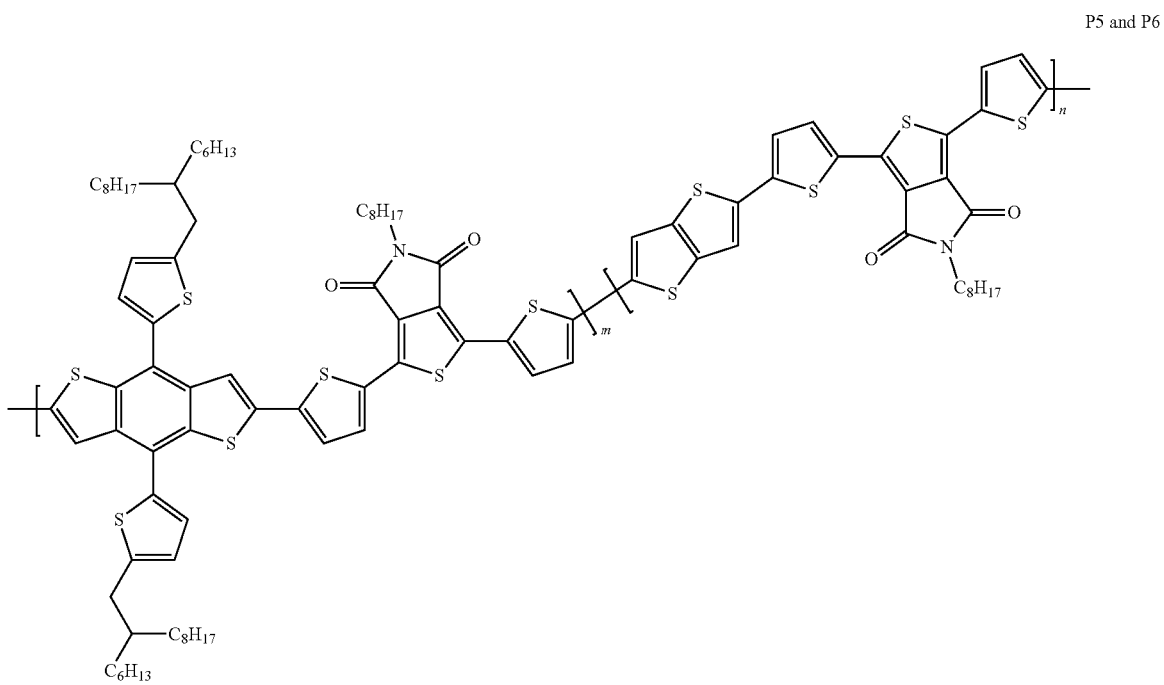

The structures of P5 and P6 are the same except the ratio of m to n. The ratio of P5 is m:n=0.95:0.05, and the ratio of P6 is m:n=0.9:0.1. P5 and P6 are the structures belonging to A1=A2 and D1 D2. Please refer to the data in Table 1. The best power conversion efficiency (PCE$^{BEST}$) of components prepared with P5 and P6 is 9.58% and 8.55%, respectively.

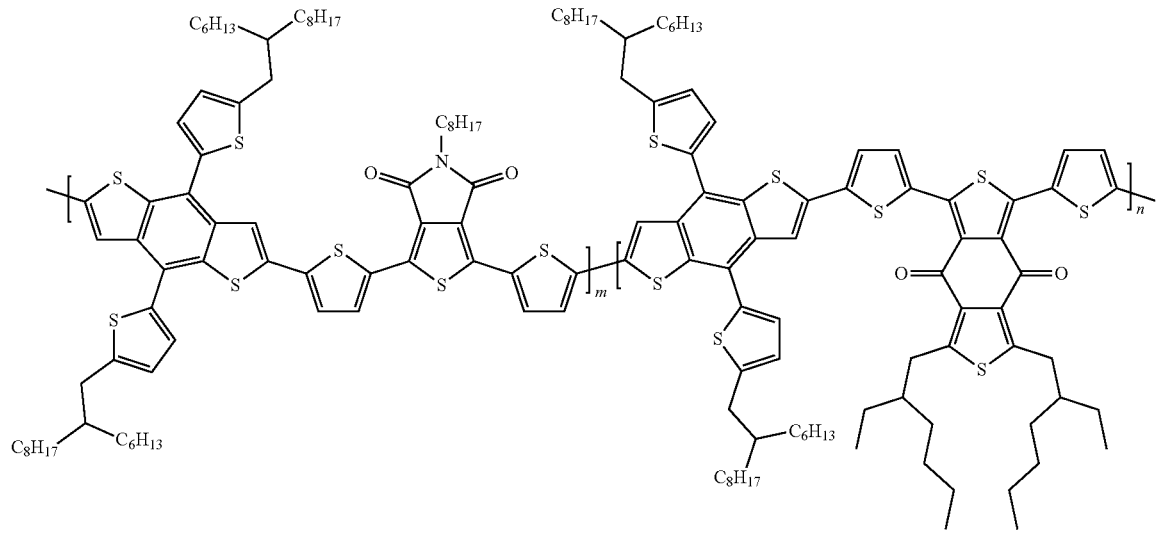

P1 and P2

The structures of P1 and P2 are the same except the ratios of m to n. The ratio of P1 is m:n=0.9:0.1, and the ratio of P2 is m:n=0.8:0.2. P1 and P2 are the structures belonging to A1=A2 and D1≠D2. Please refer to the data in Table 2. The best power conversion efficiency (PCE$^{BEST}$) of components prepared with P1 and P2 is 12.5% and 12.45%, respectively.

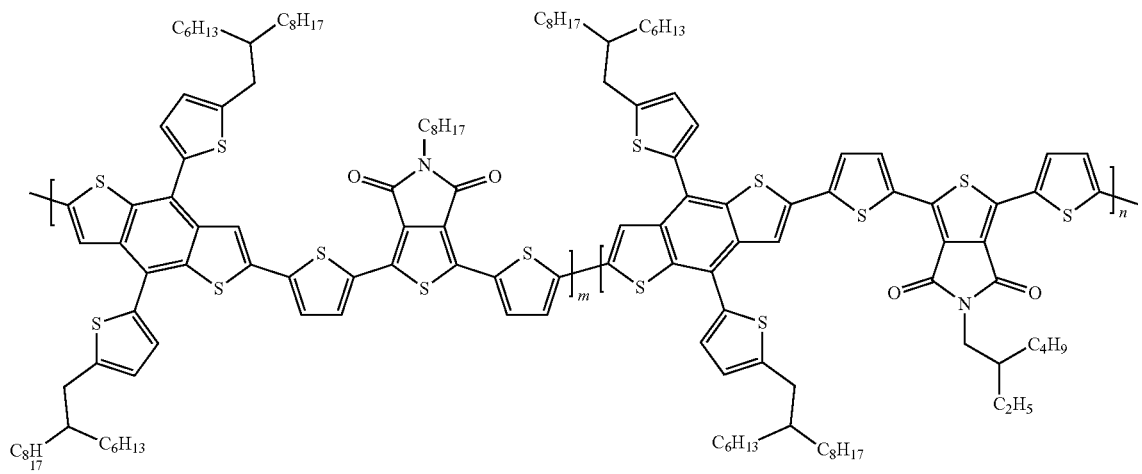

P3

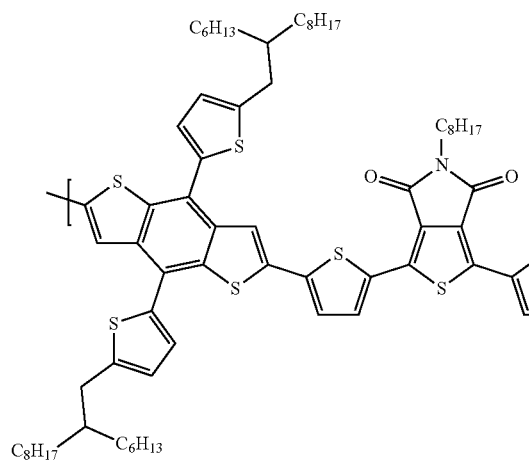
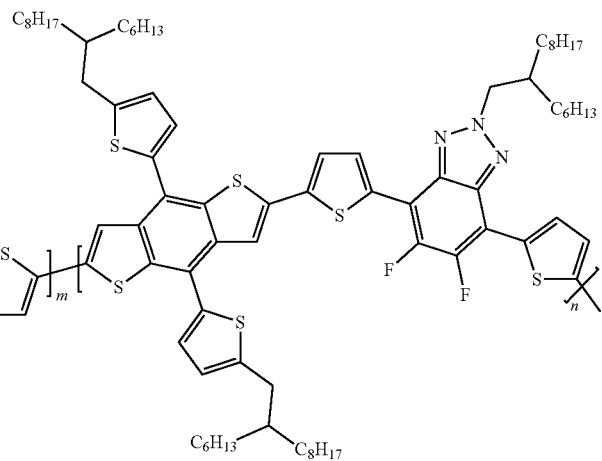

P3 and P4 are structures belonging to A1≠A2 and D1=D2. The ratio of P3 is m:n=0.5:0.5, and the ratio of P4 is m:n=0.9:0.1. Please refer to the data in Table 2. The best power conversion efficiency (PCE$^{BEST}$) of P3 and P4 is 12.45% and 10.88%, respectively.

Based on the above data, it is found that the best power conversion efficiency (PCE$^{BEST}$) of the components prepared with the structures of D1 D2 (P5 and P6) falls below 10%. In contrast, the best power conversion efficiency (PCE$^{BEST}$) of the components prepared with the structures of D1=D2 (P1, P2, P3, and P4) falls below 10%. In summary, it can be known that the structure of D1=D2 is advantageous for improving power conversion efficiency (PCE).

In addition, the ratio of m to n in the low energy gap copolymer disclosed in the prior art usually greatly affects the power conversion efficiency (PCE). In this regard, the ratio of m to n must be very precise, which makes the process difficult and not conducive to industrial mass production. On the contrary, please refer to Table 2 of the present invention, the doping ratio of m to n of P1 to P4 is from 0.9:0.1 to 0.5:0.5, and the best power conversion efficiency (PCE$^{BEST}$) of the prepared component can be maintained above 10%. Therefore, the manufacturing process of the device with the conjugated polymer of the present invention is flexible and conducive to industrial mass production.

TABLE 1 the structures of D1 ≠ D2

| Donor | Acceptor | Spin Speed (rpm) | $V_{oc}$ (V) | $J_{sc}$ (mA/cm$^2$) | F.F. (%) | PCE$^{AVE}$ (%) | PCE$^{BEST}$ (%) | ACL thickness (nm) |
|---|---|---|---|---|---|---|---|---|
| P5 | IDTT | 1100 | 0.8 | 18.57 | 63.3 | 9.44 | 9.58 | 100 |
| P6 | derivative | 1000 | 0.78 | 18.29 | 59.4 | 8.5 | 8.55 | 97 |

TABLE 2 the structures of D1 = D2

| Donor | Acceptor | Spin Speed (rpm) | $V_{oc}$ (V) | $J_{sc}$ (mA/cm$^2$) | F.F. (%) | PCE$^{AVE}$ (%) | PCE$^{BEST}$ (%) | ACL thickness (nm) |
|---|---|---|---|---|---|---|---|---|
| P1 | IDTT | 1300 | 0.8 | 20.32 | 76.02 | 12.29 | 12.5 | 123 |
| P2 | derivative | 900 | 0.8 | 20.02 | 74.79 | 11.94 | 12.45 | 110 |
| P3 | | 1600 | 0.796 | 20.27 | 75.6 | 12.18 | 12.45 | 106 |
| P4 | | 1050 | 0.78 | 19.33 | 72.74 | 10.93 | 10.88 | 113 |

With the examples and explanations mentioned above, the features and spirits of the invention are hopefully well described. More importantly, the present invention is not limited to the embodiment described herein. Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A conjugated polymer, which is a random copolymer, with Formula I:

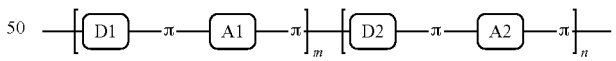

wherein

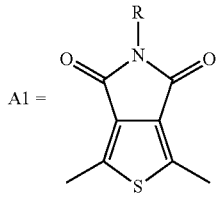

wherein $R_1$ is selected from the group consisting of C1-C30 alkyl, C1-C30 branched alkyl, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain substituted by cyano, nitro, hydroxyl or keto, and halo group;
D1 and D2 are respectively selected from the group consisting of
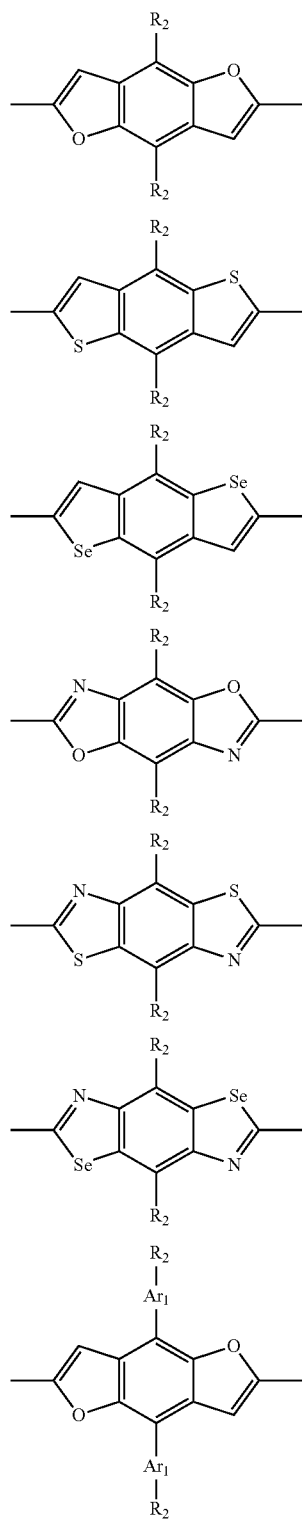
-continued
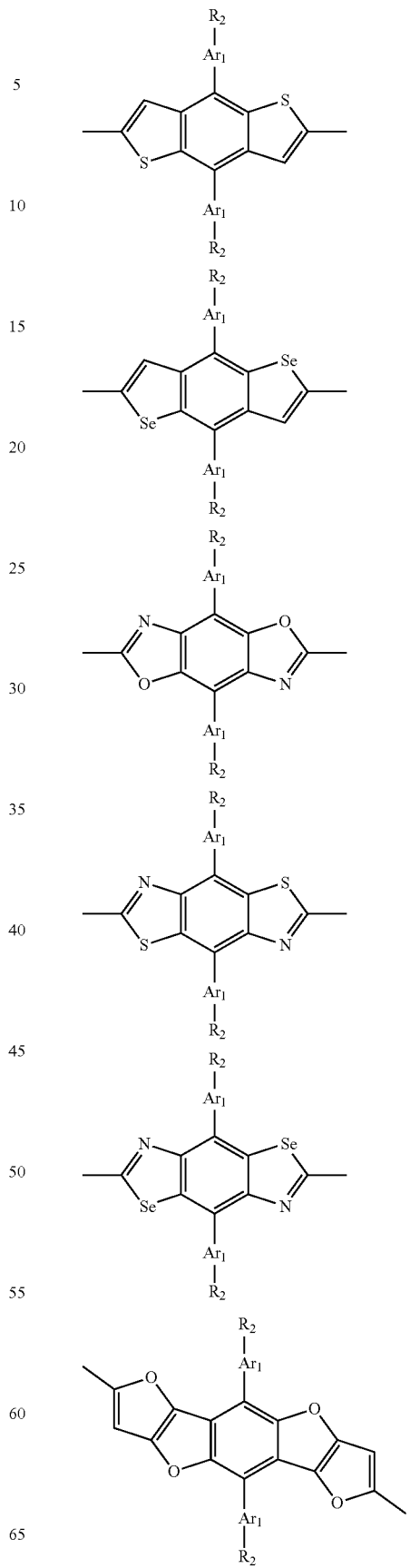

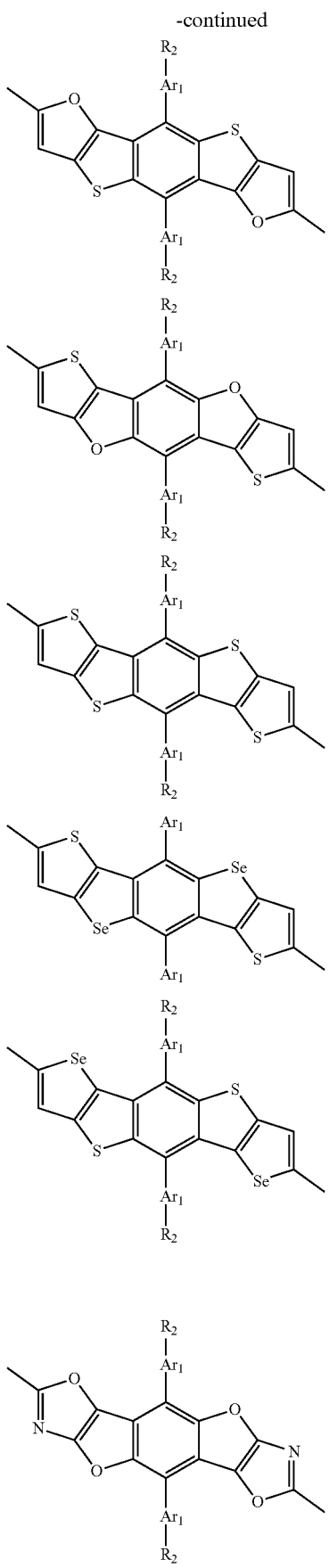
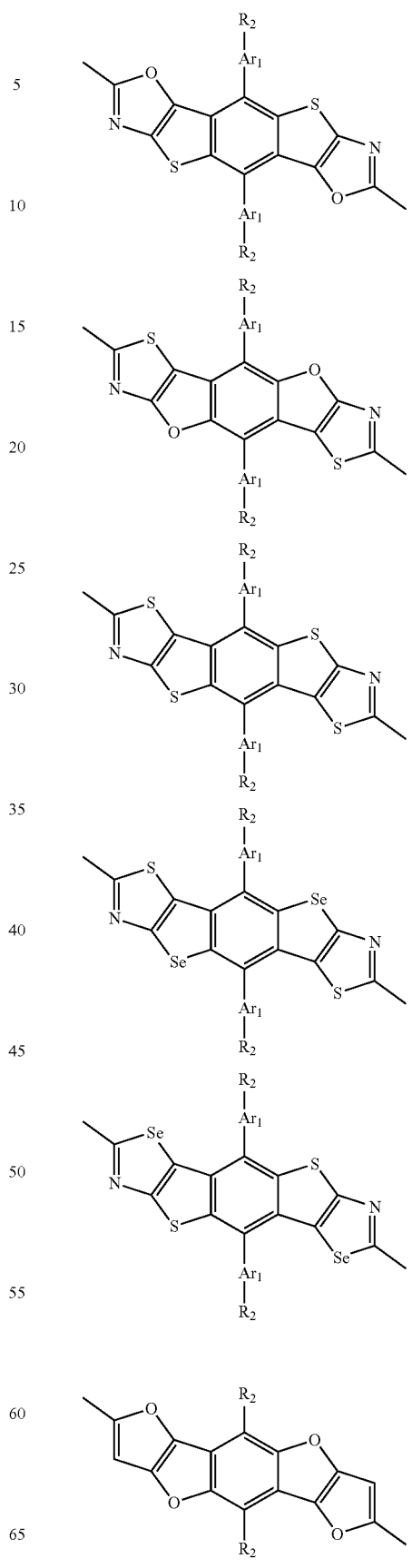

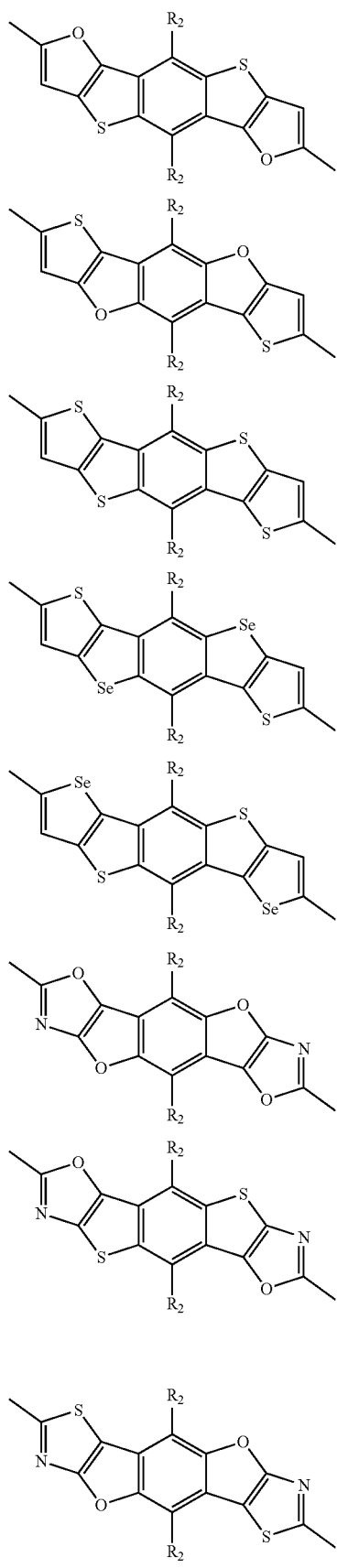
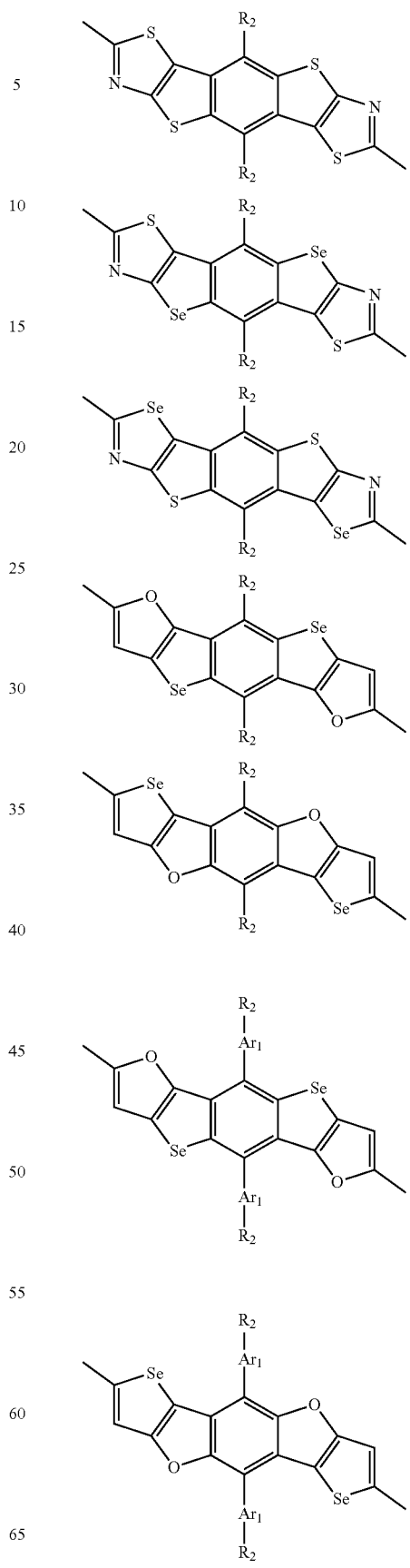

-continued
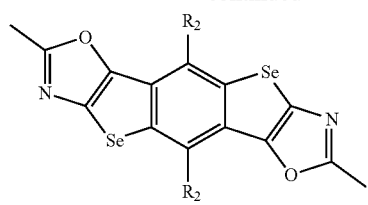
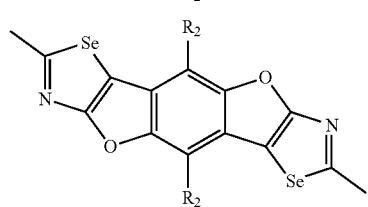
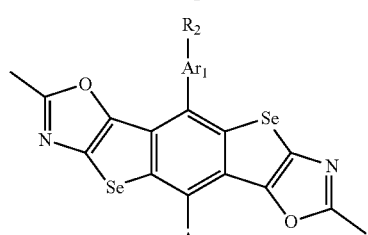
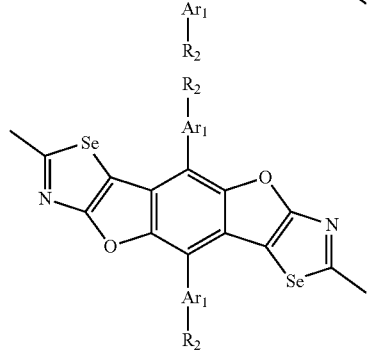
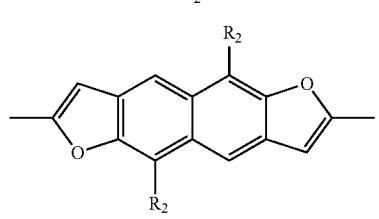
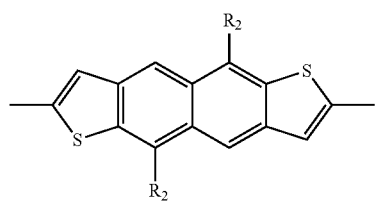
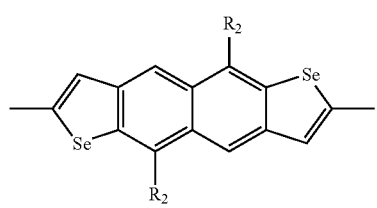
-continued
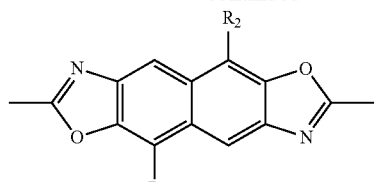
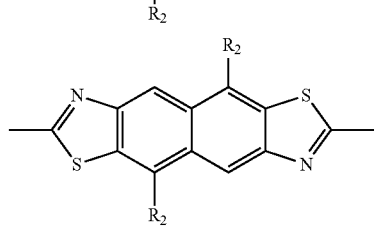
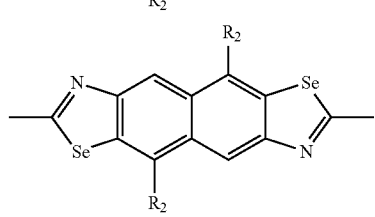
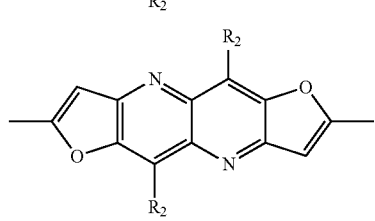
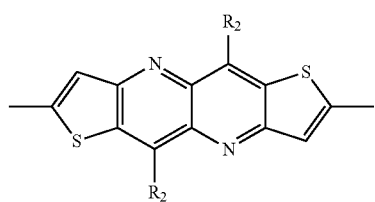
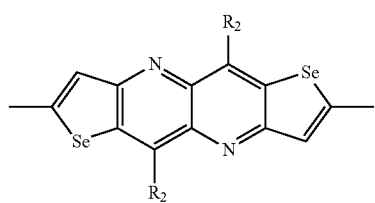
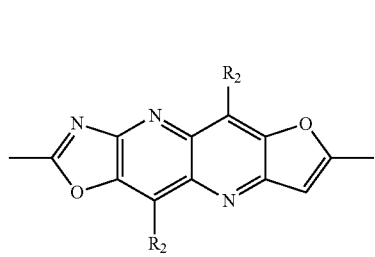
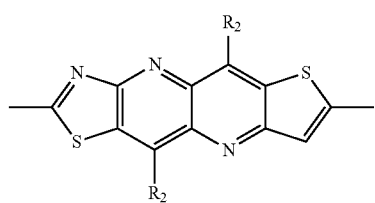

-continued
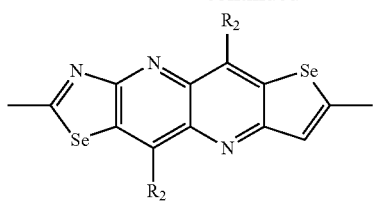
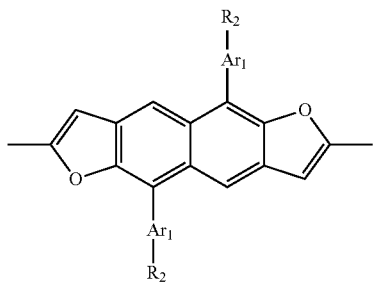
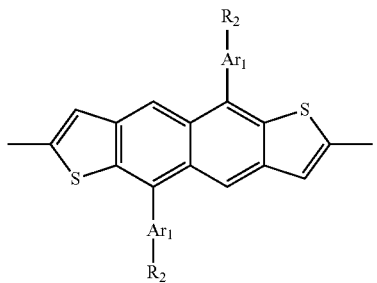
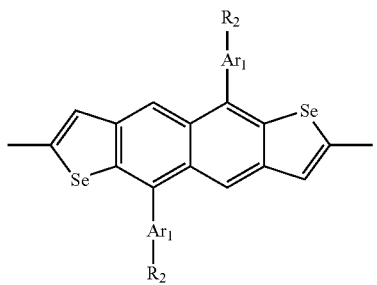
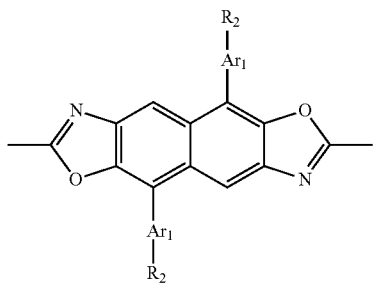
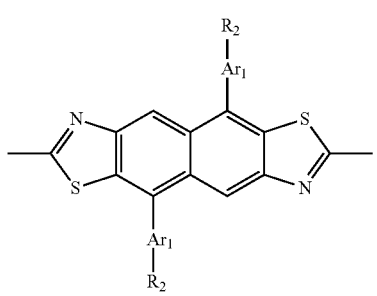
-continued
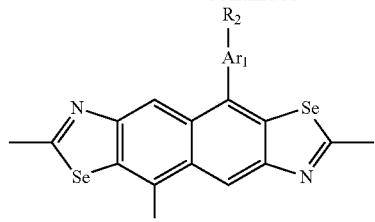
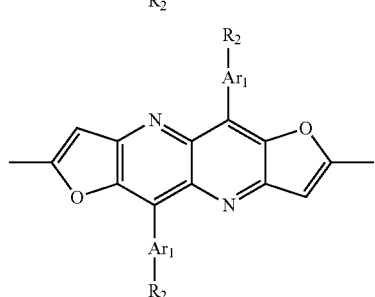
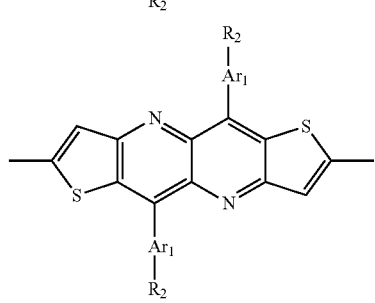
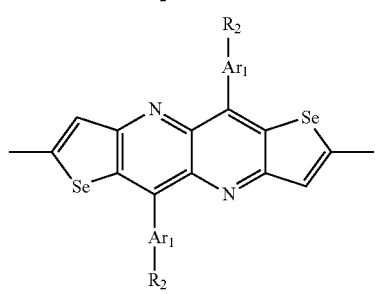
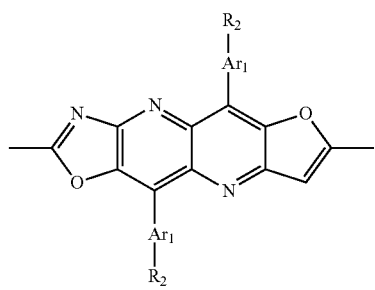
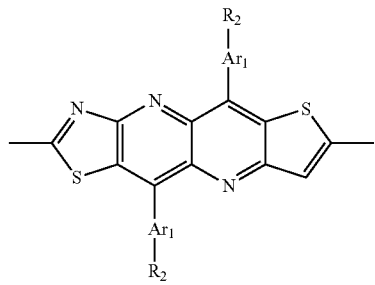

-continued
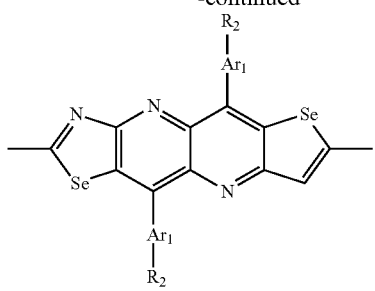
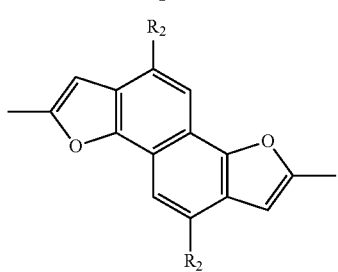
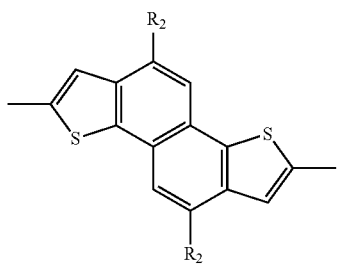
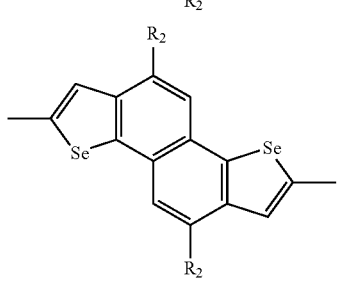
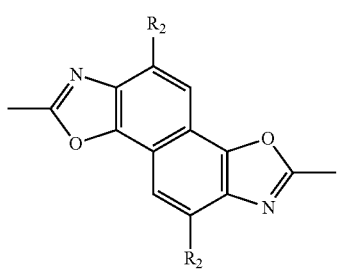
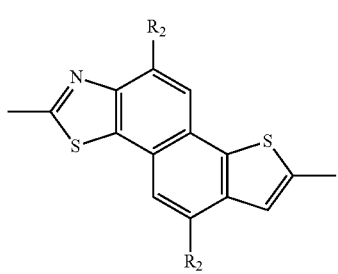
-continued
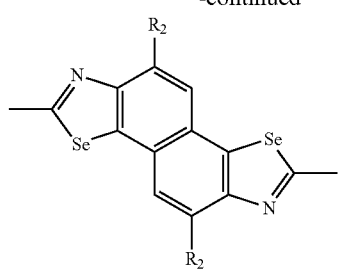
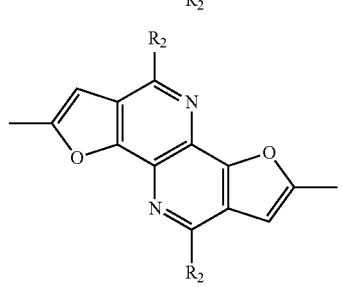
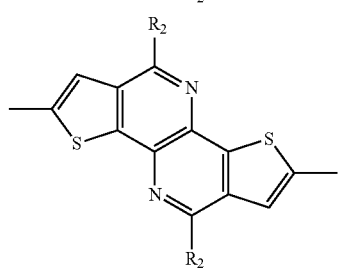
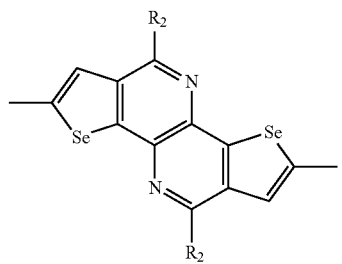
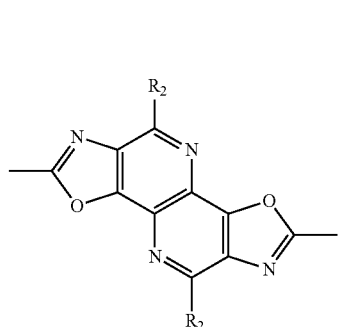
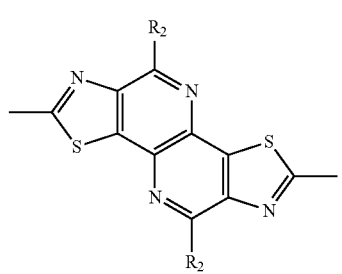

-continued
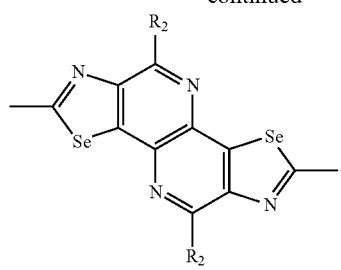
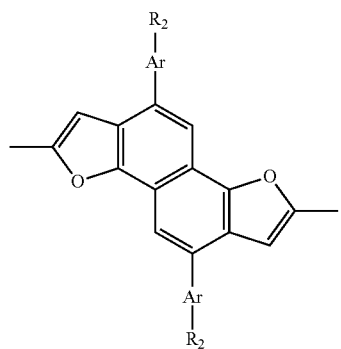
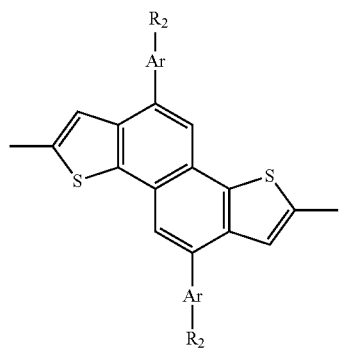
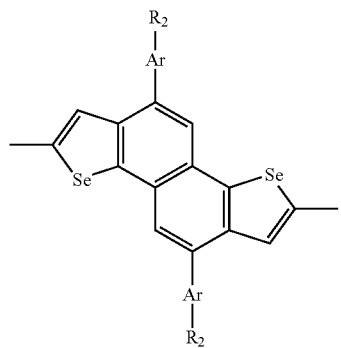
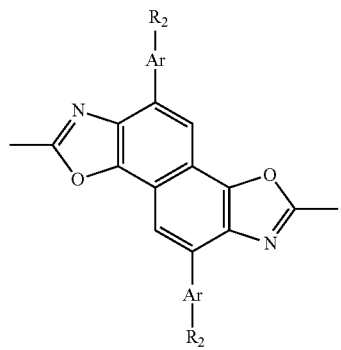
-continued
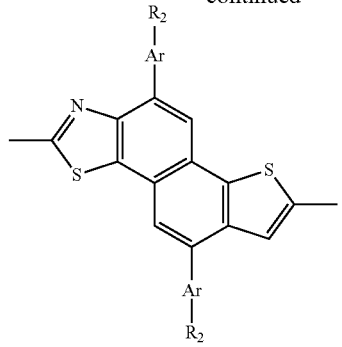
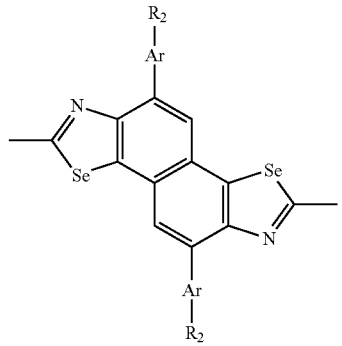
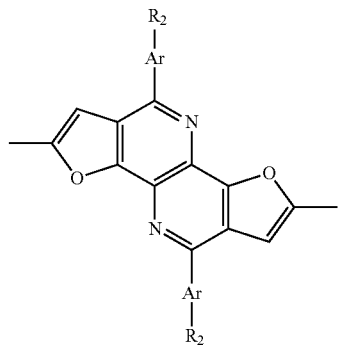
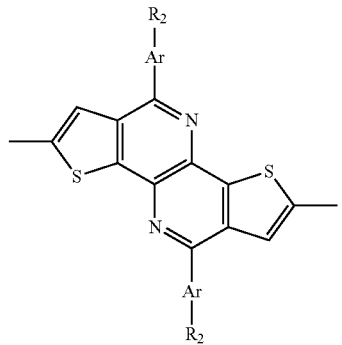
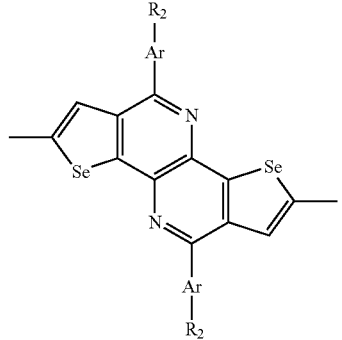

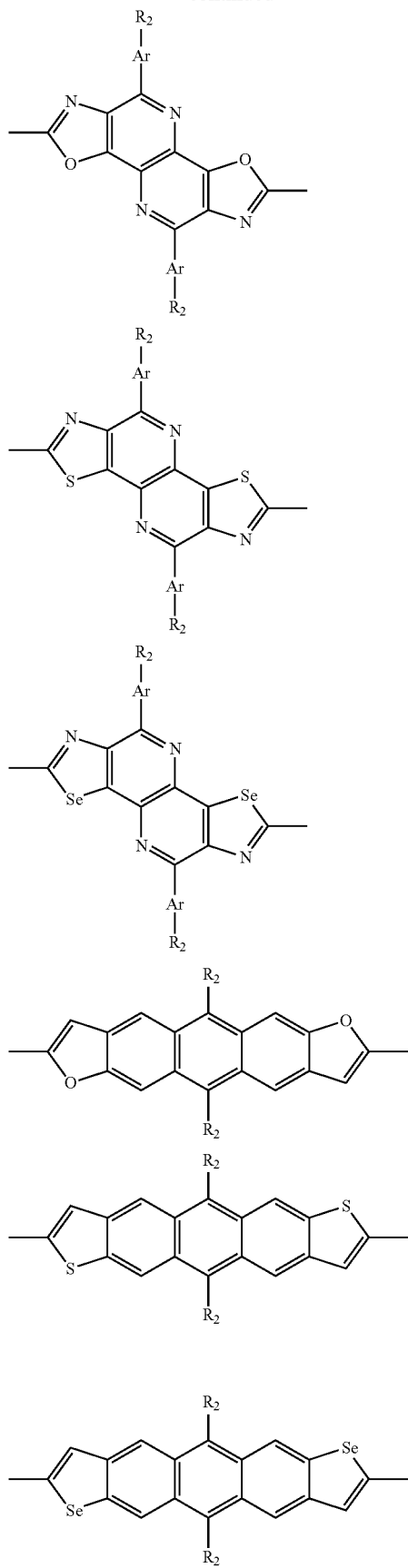
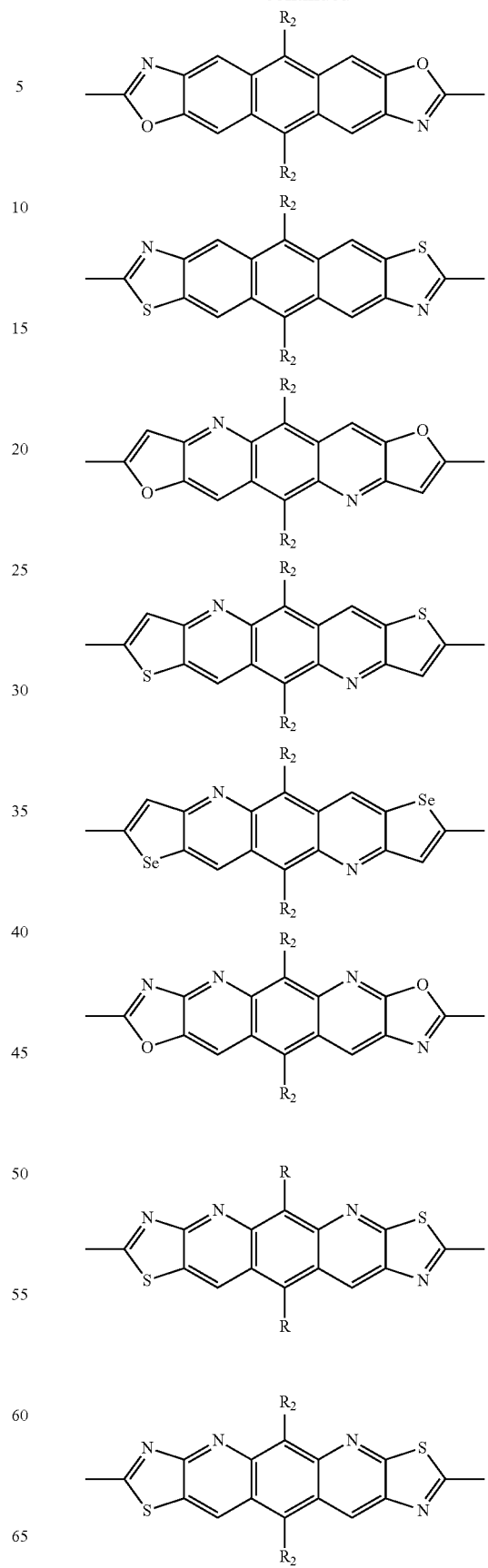

-continued
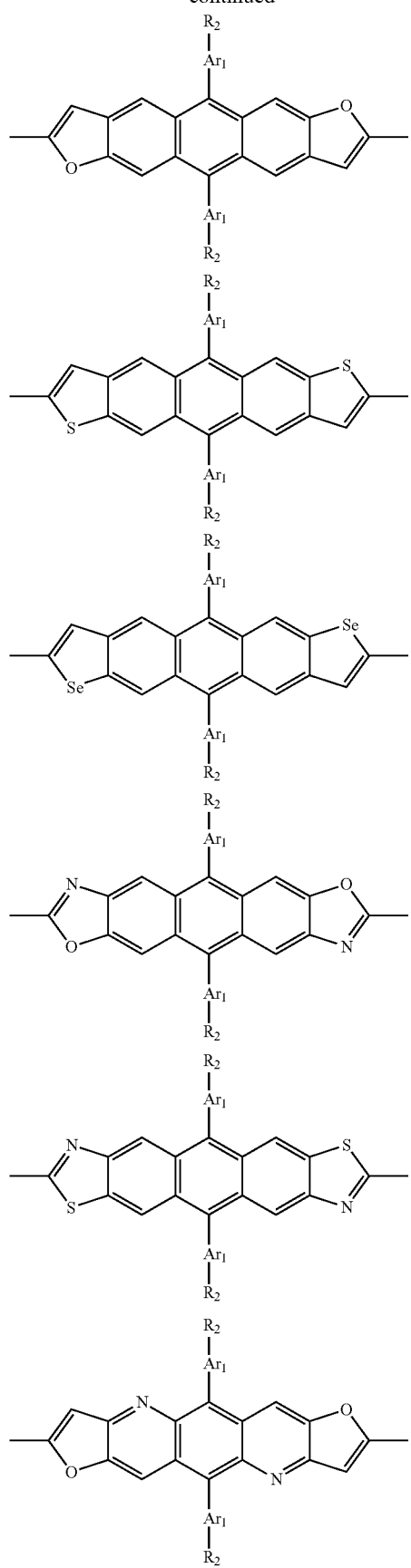
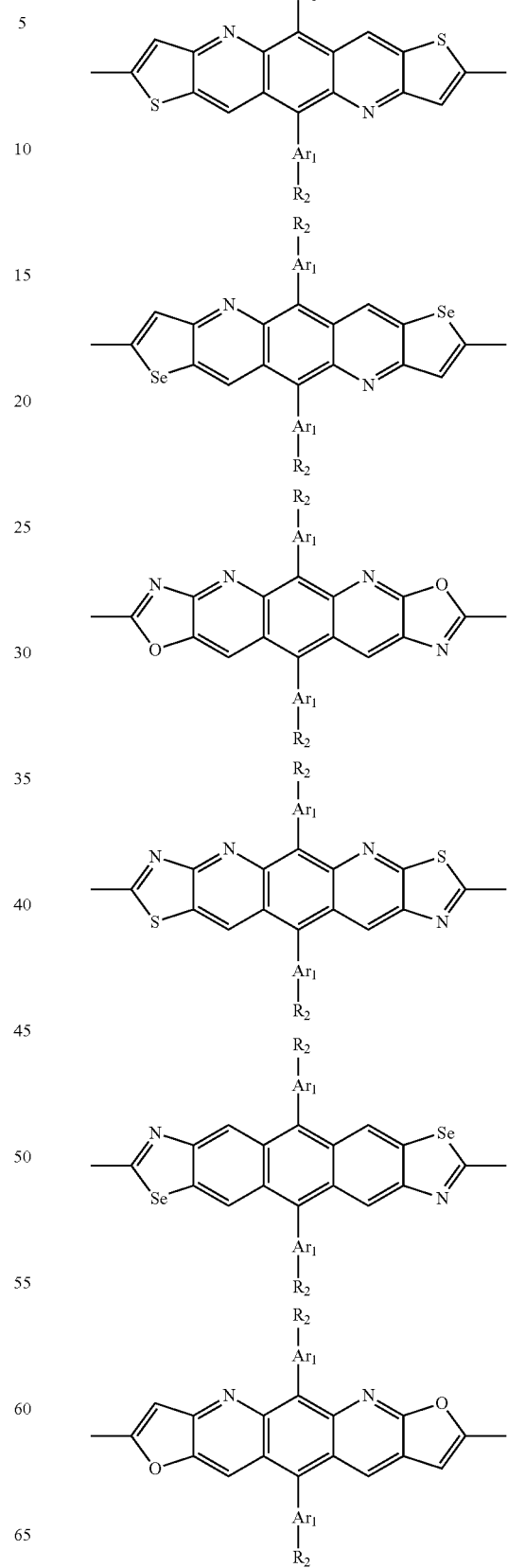

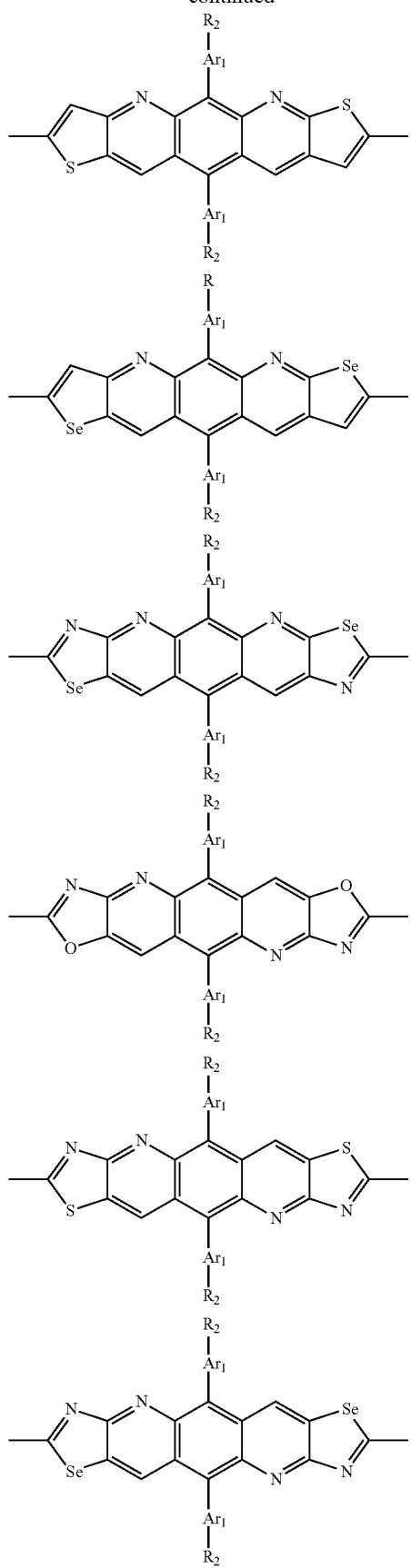
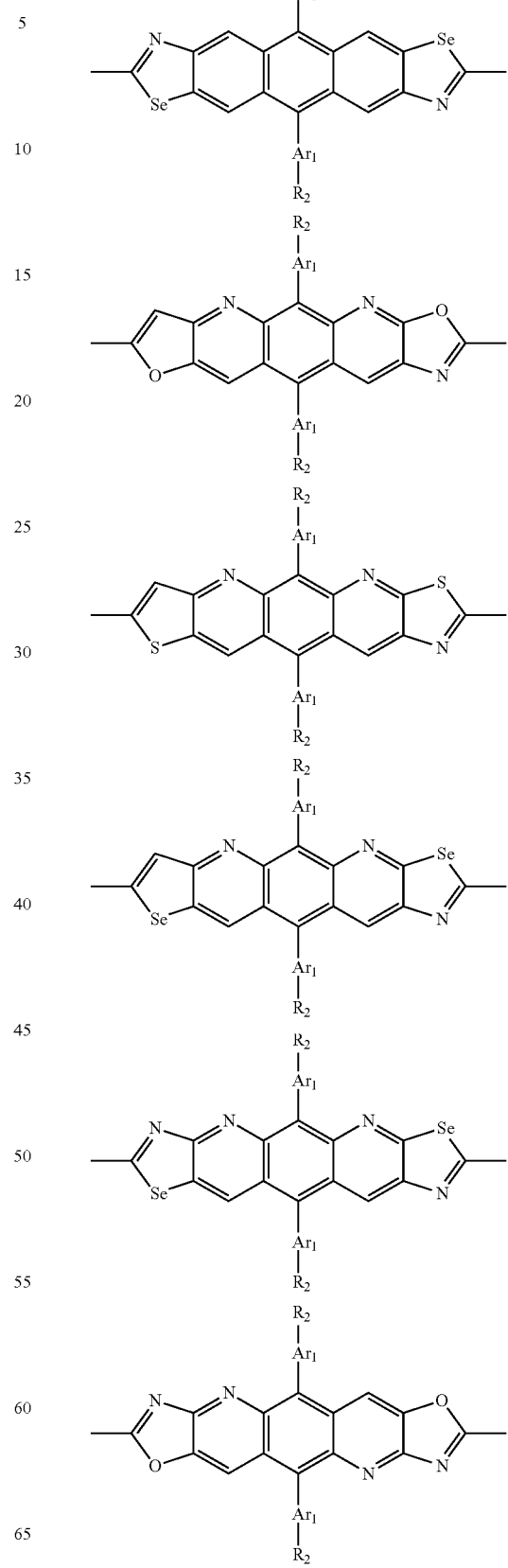

105
-continued
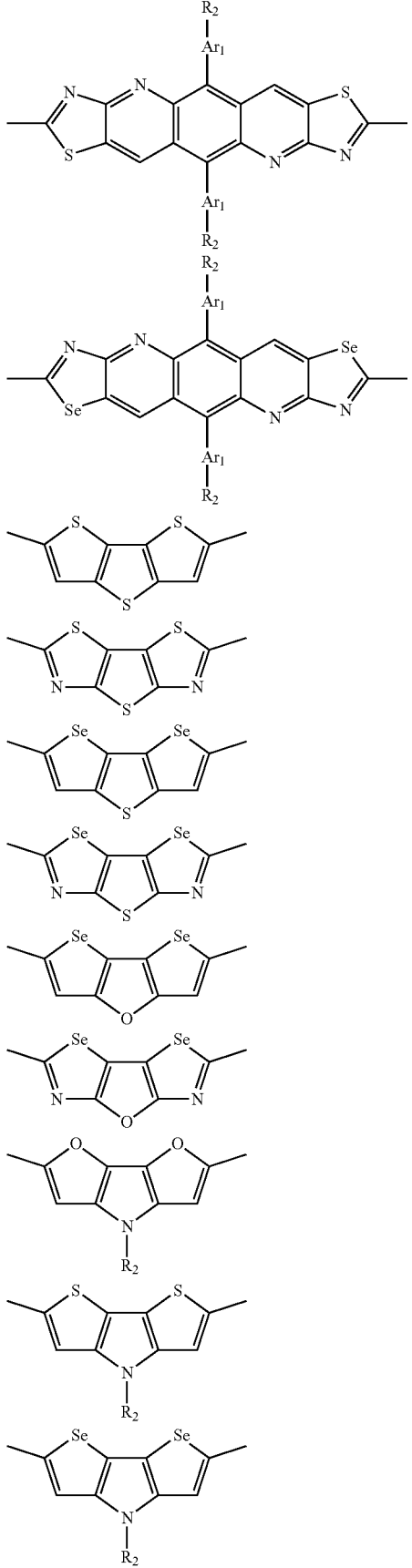
106
-continued
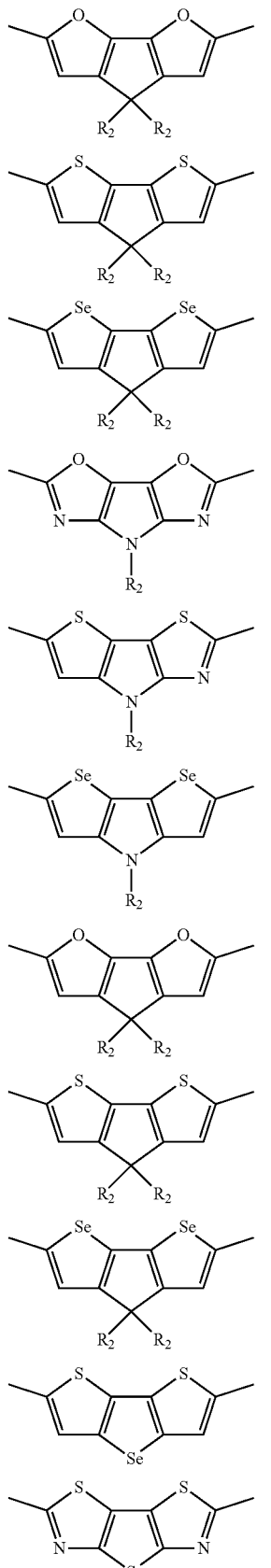

107
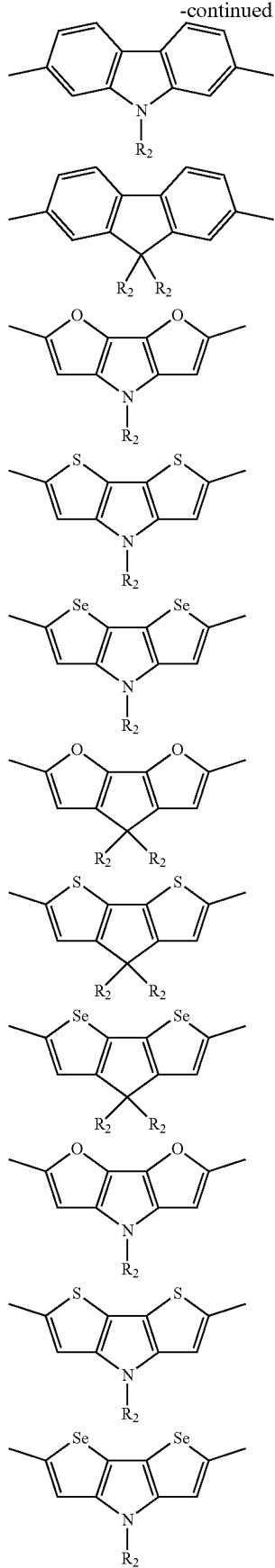
108
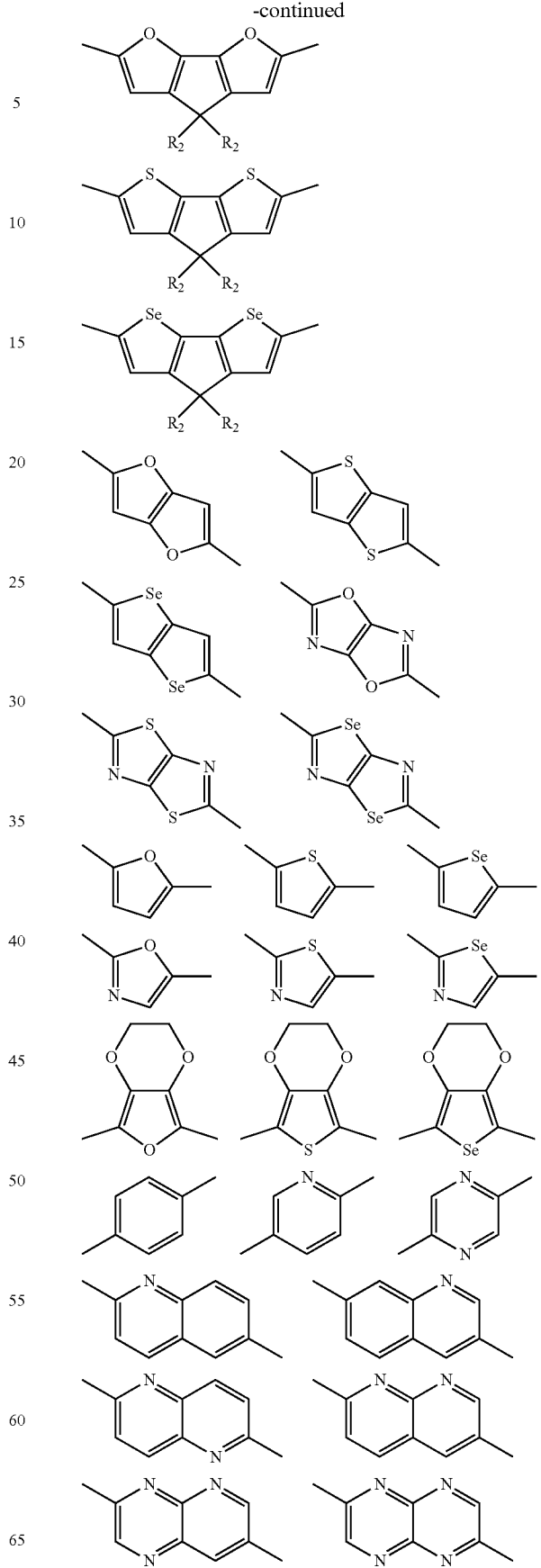

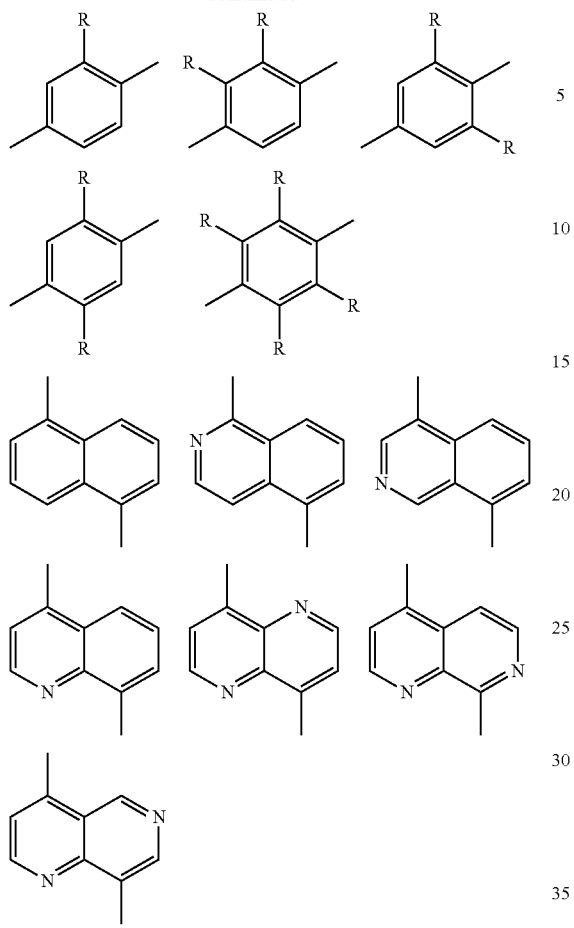
A2 is selected from the group consisting of:
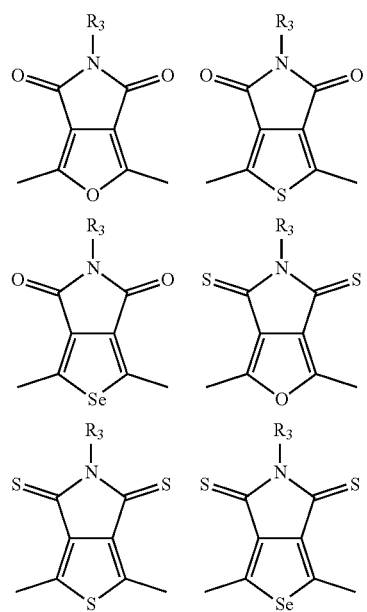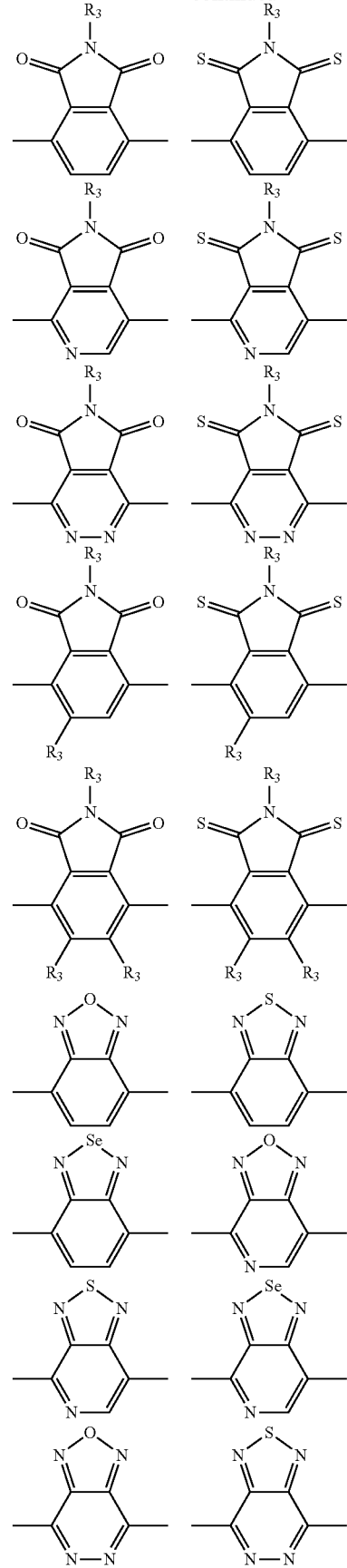

111
-continued
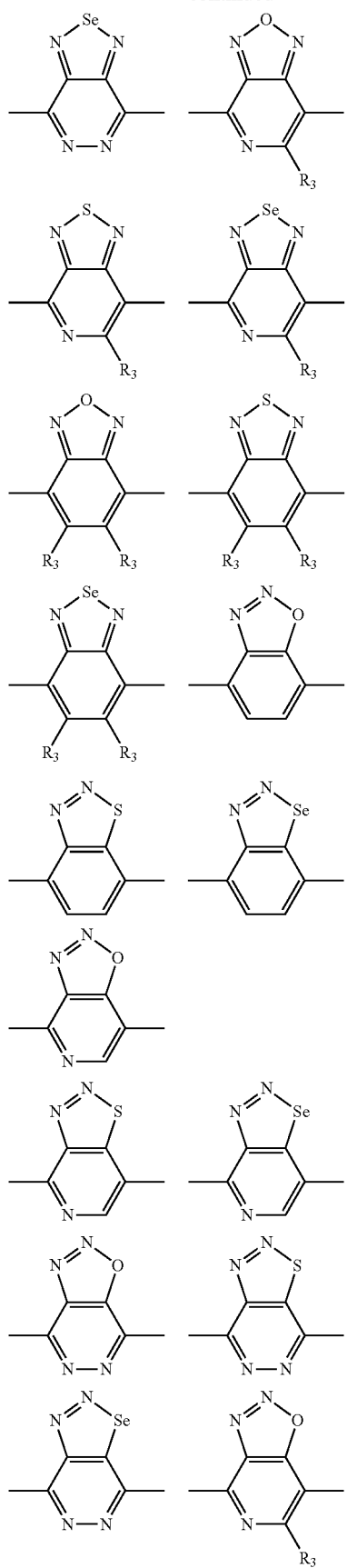
112
-continued
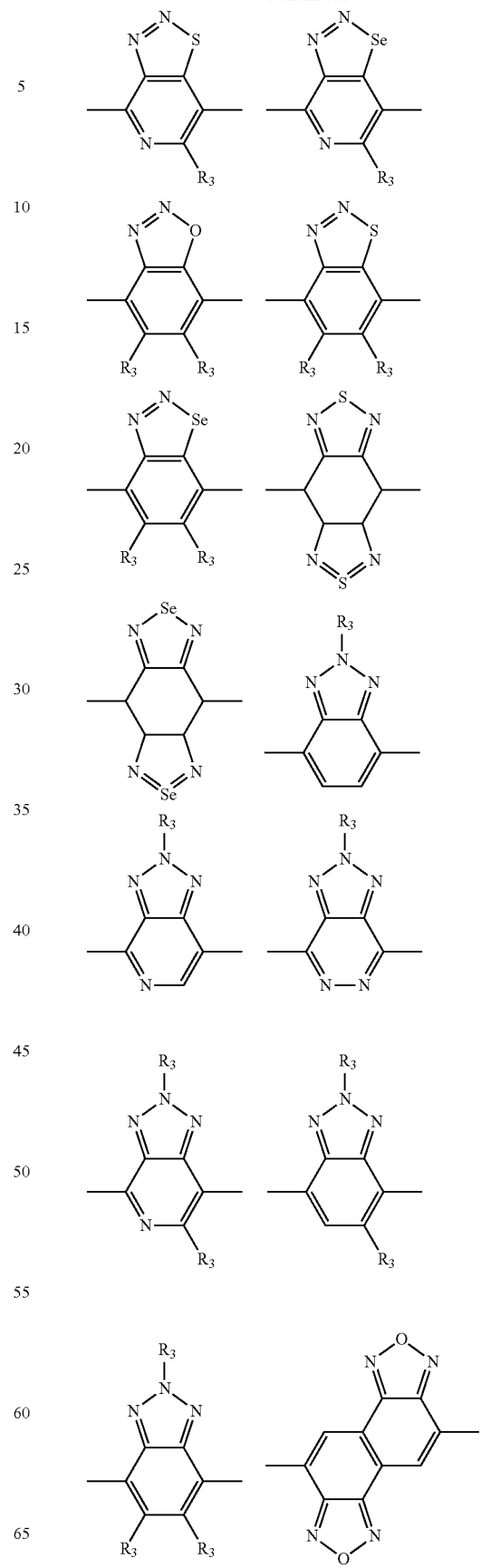

113
-continued
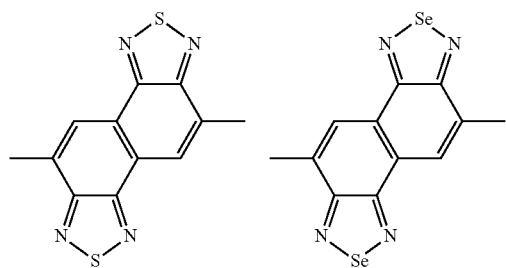
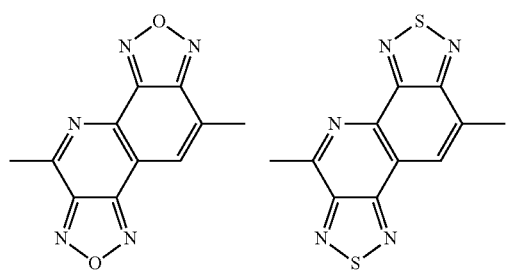
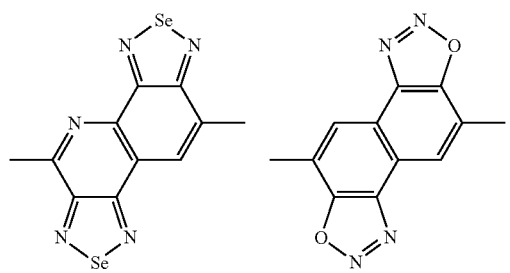
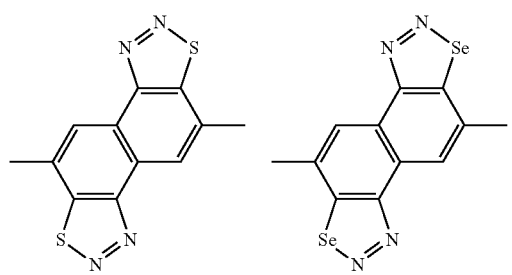
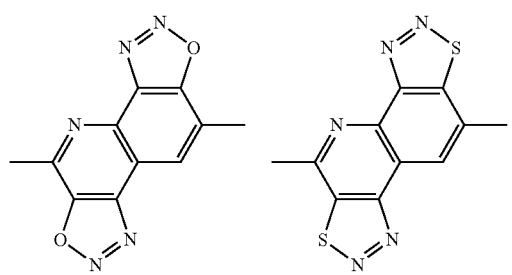
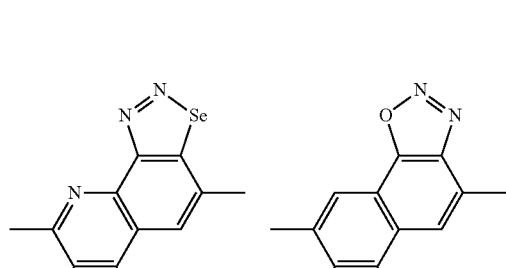
114
-continued
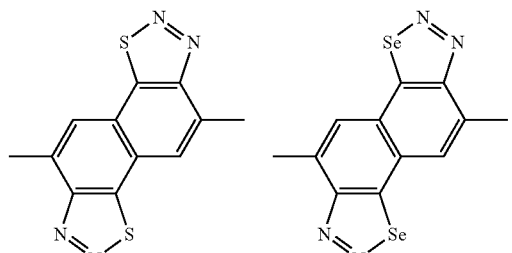
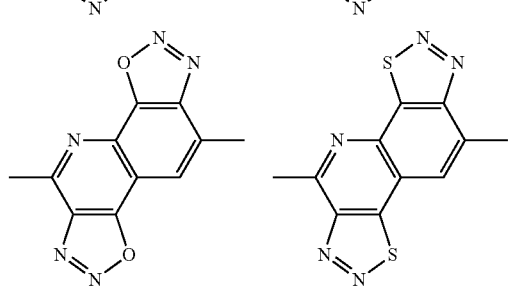
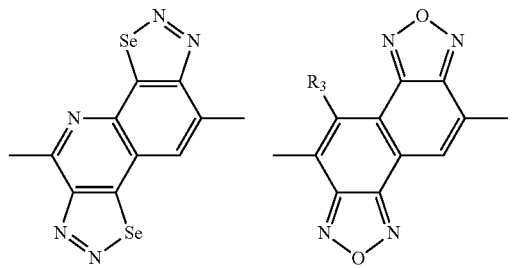
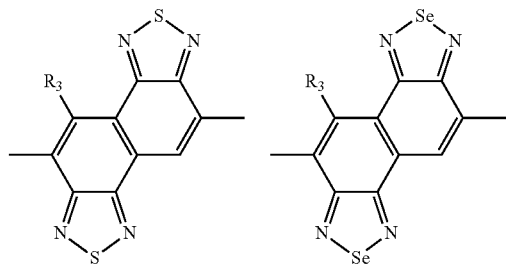
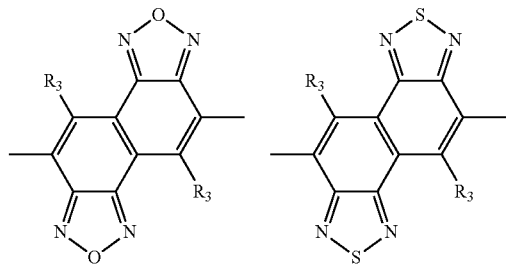
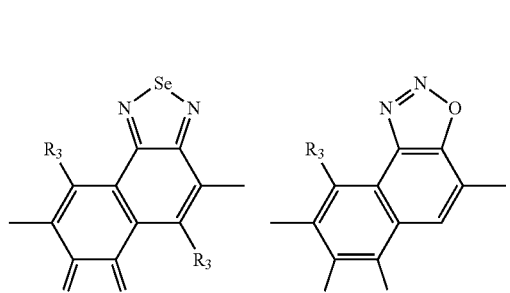

115
-continued
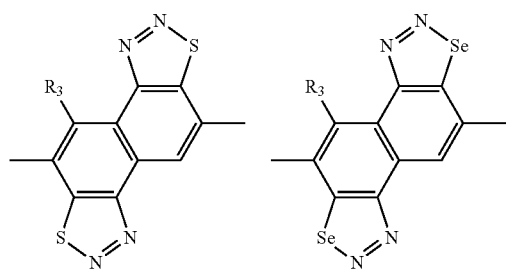
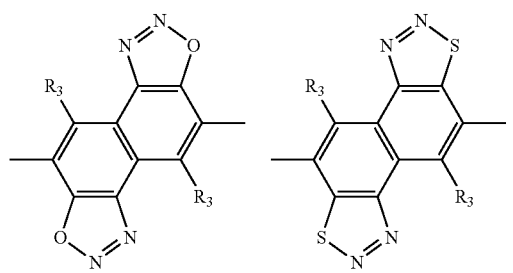
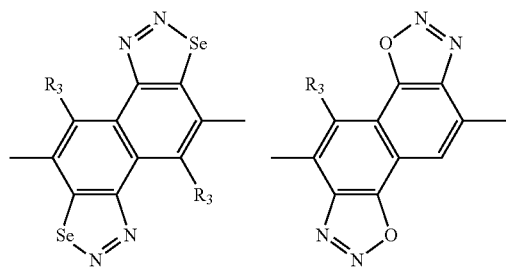
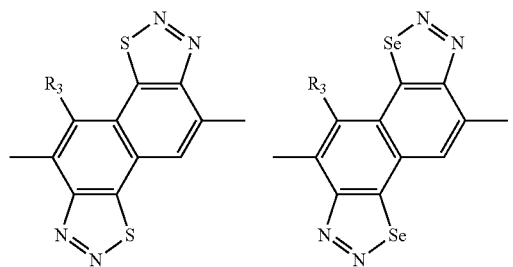
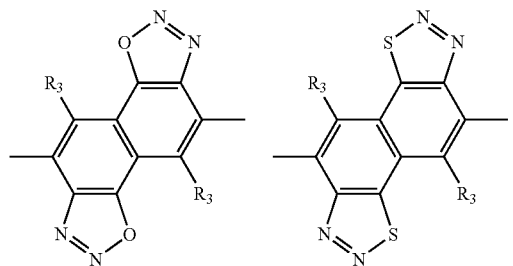
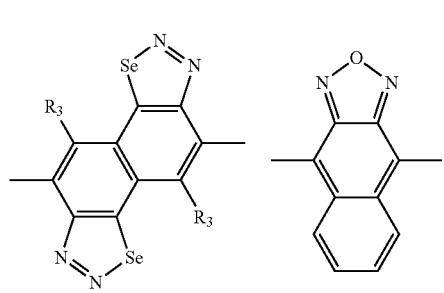
116
-continued
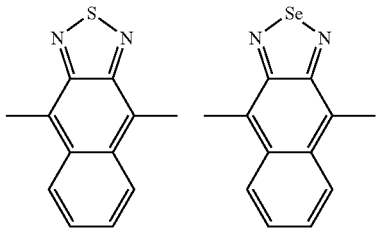
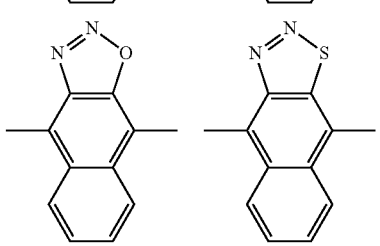
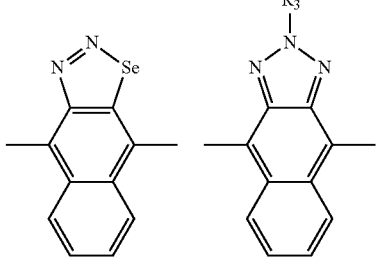
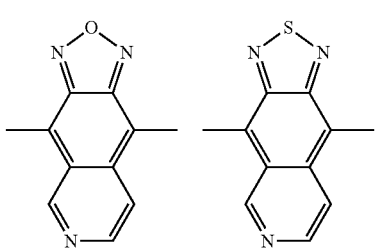
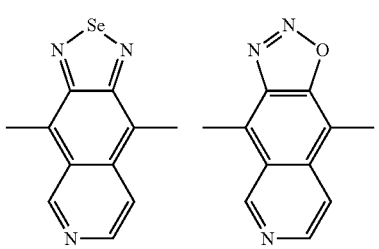
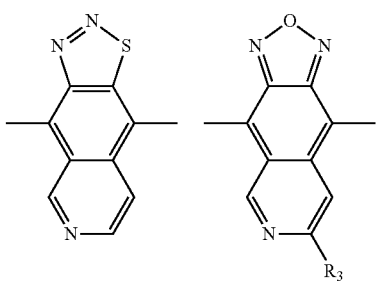

117
-continued
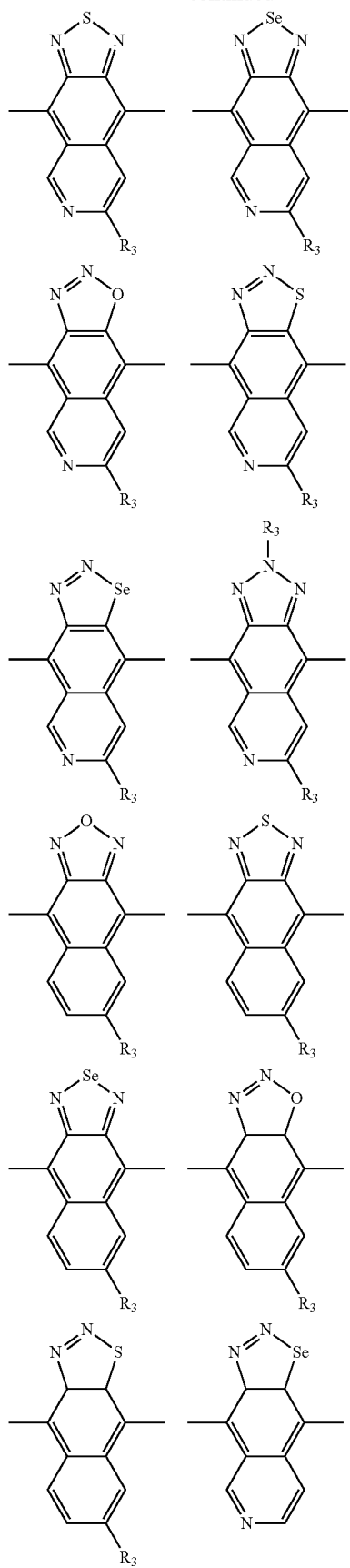
118
-continued
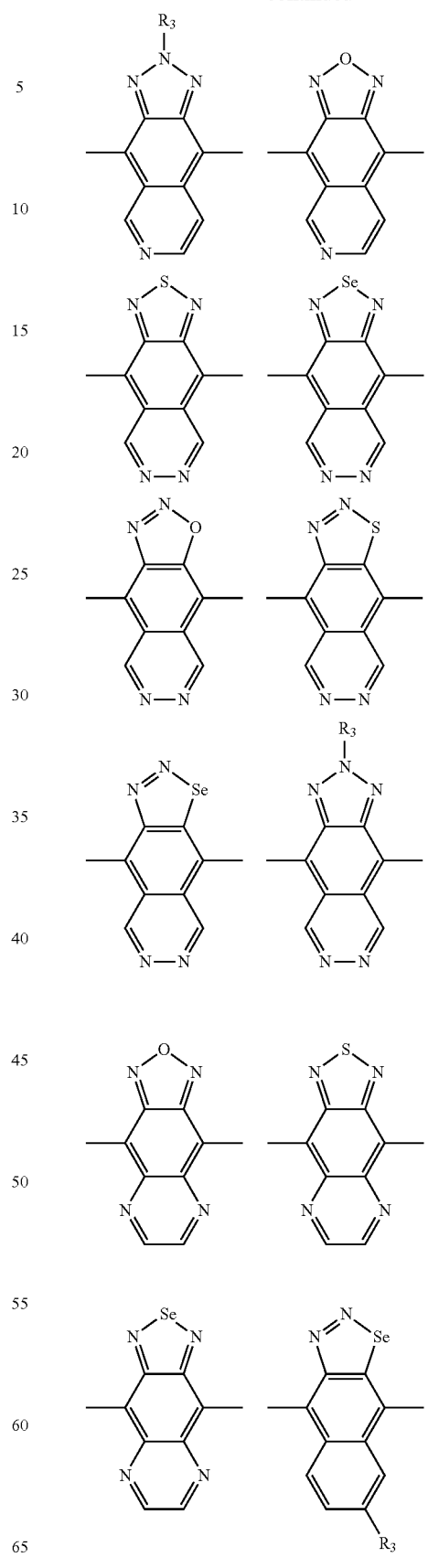

-continued
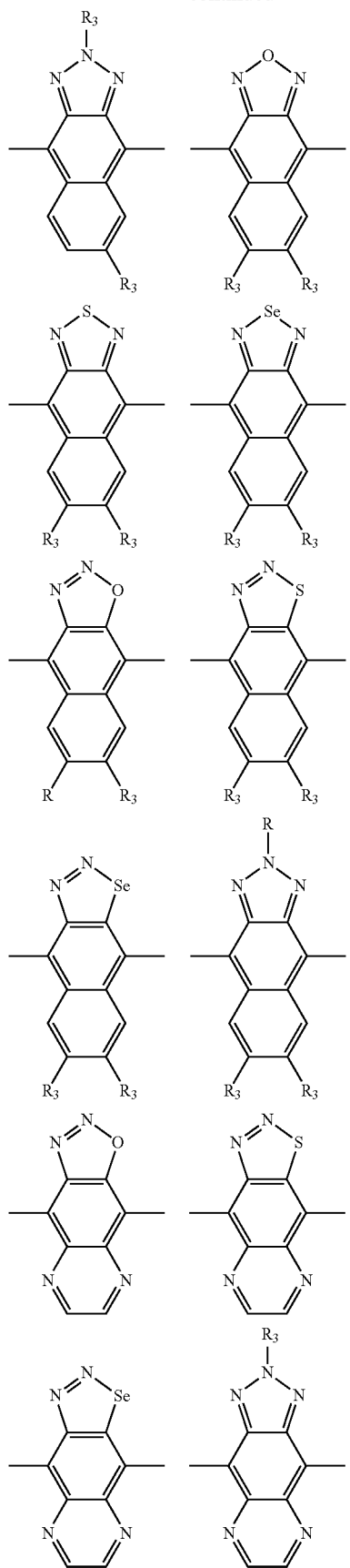
-continued
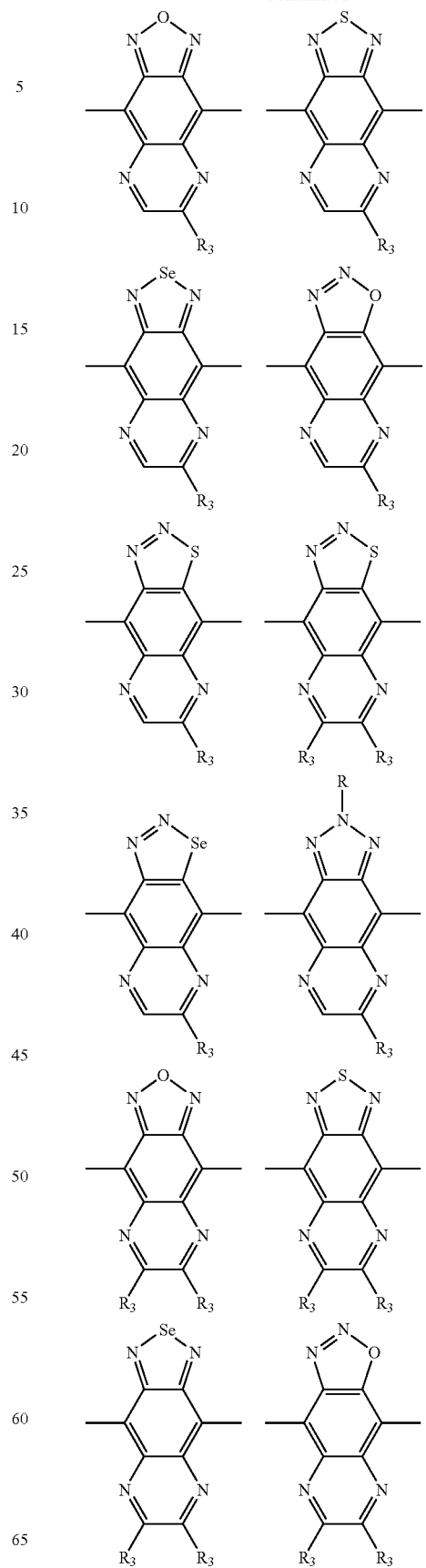

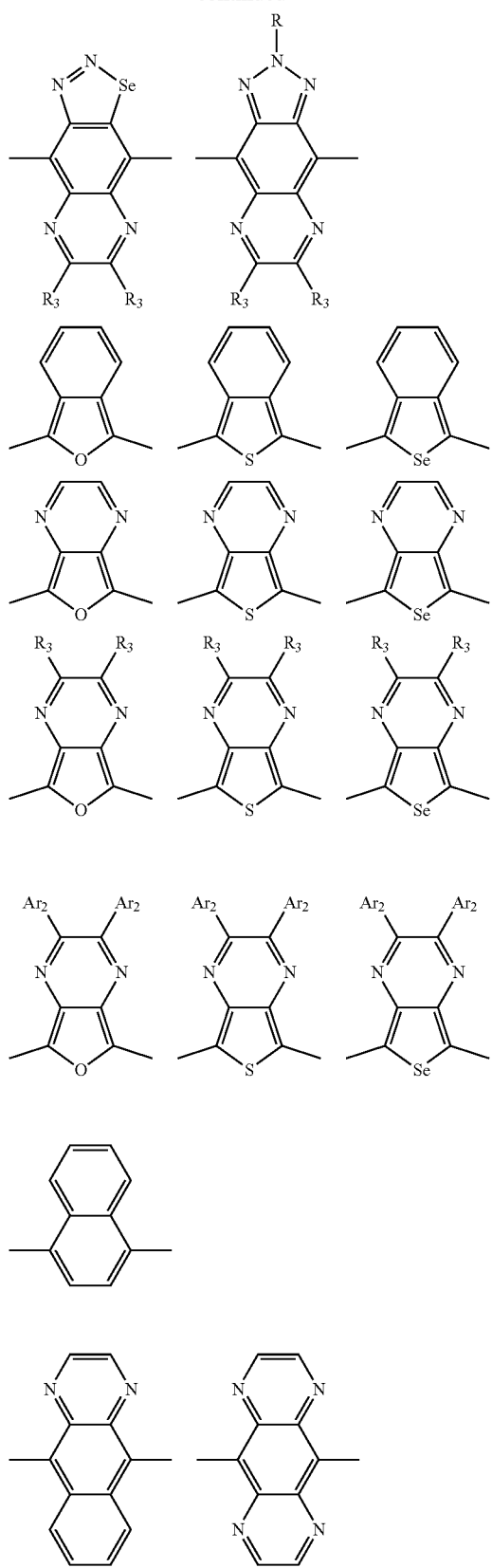
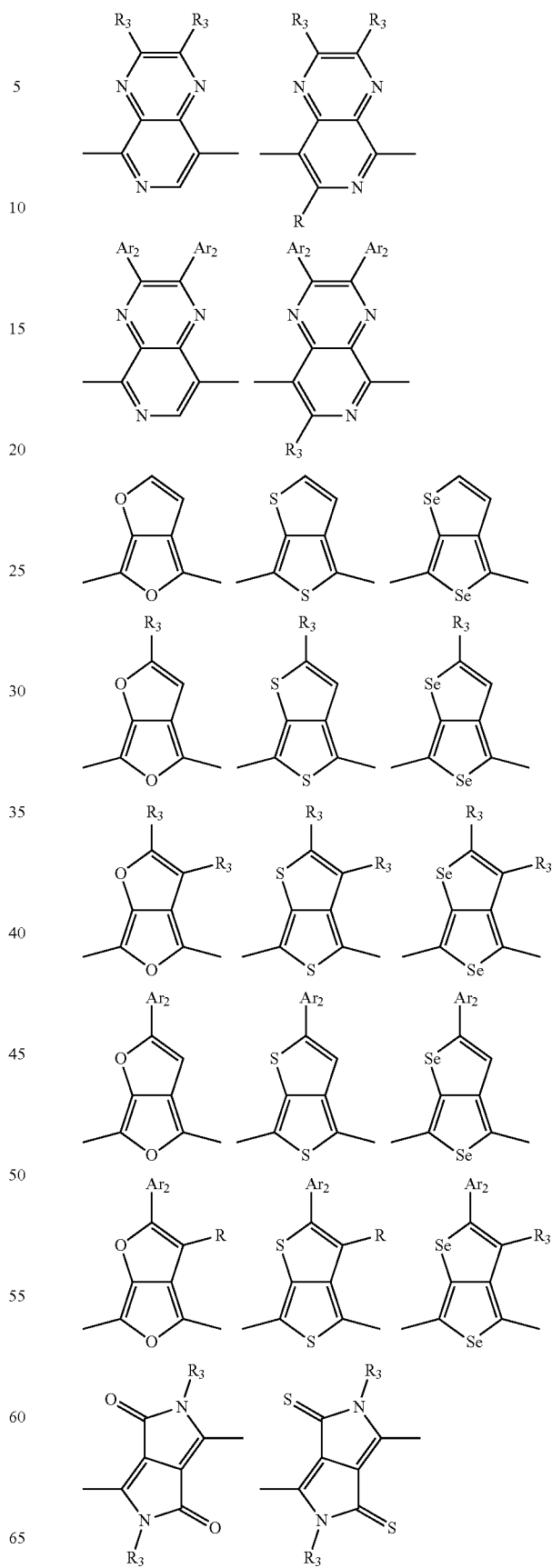

123
-continued
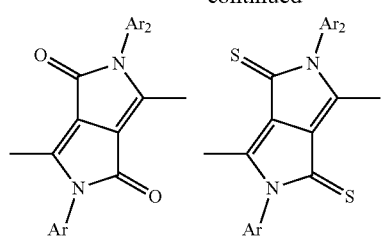
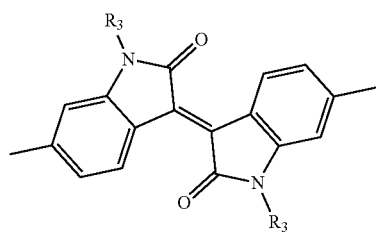
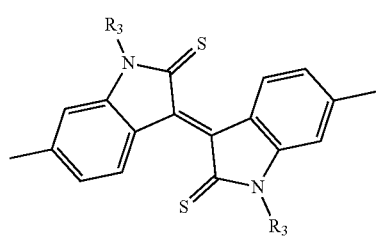
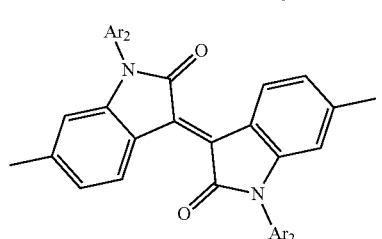
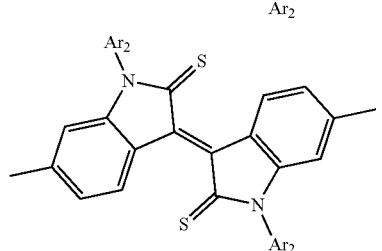
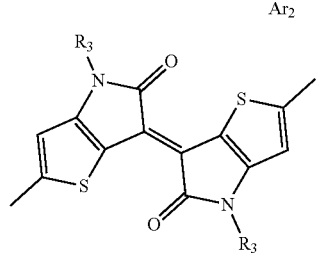
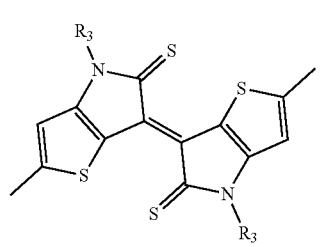
124
-continued
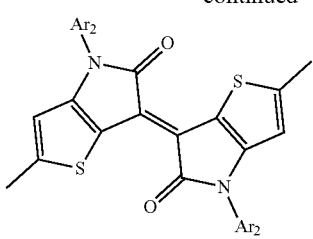
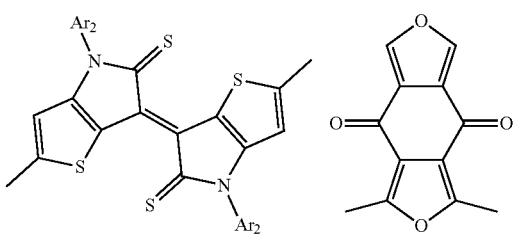
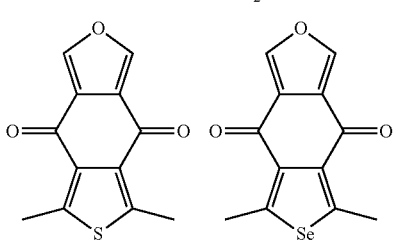
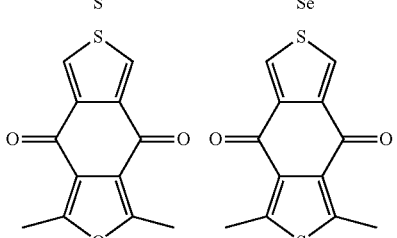
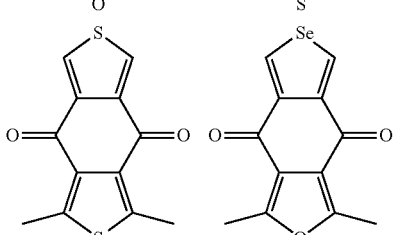
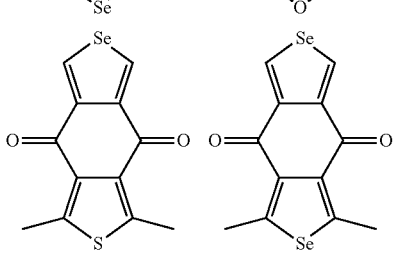
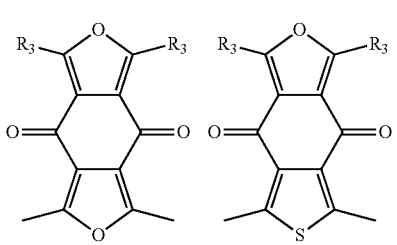

125
-continued
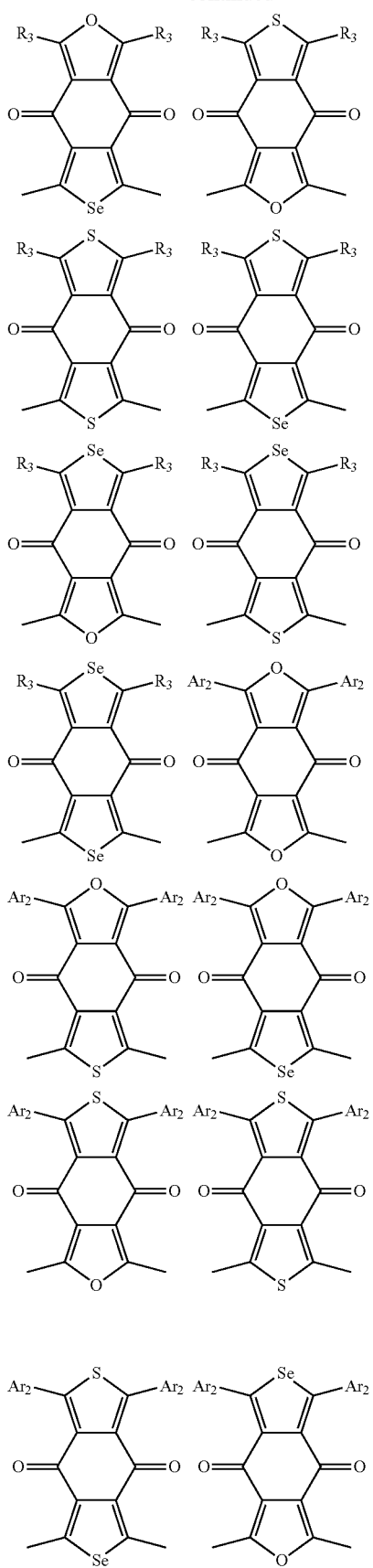
126
-continued
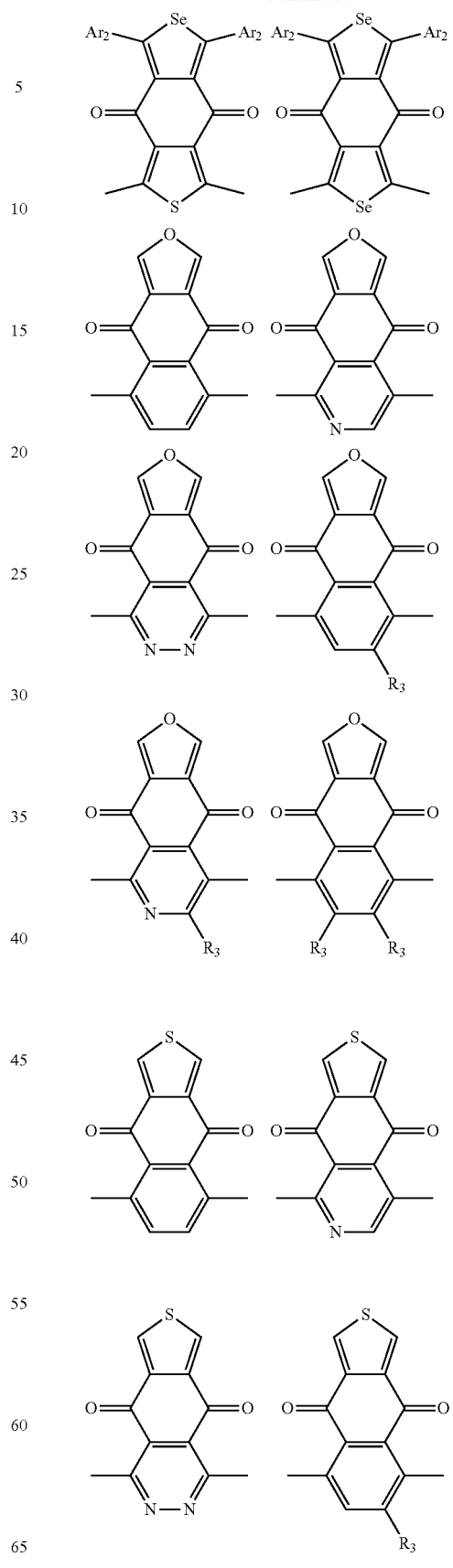

-continued
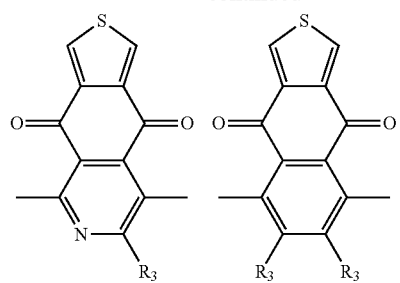
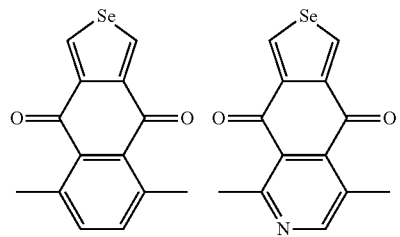
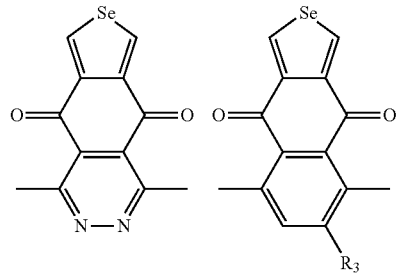
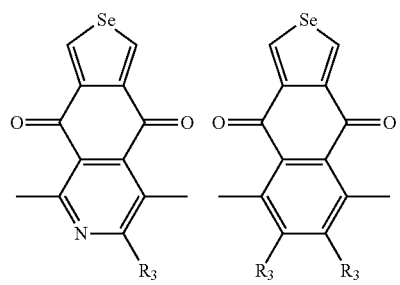
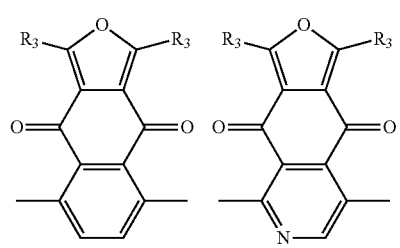
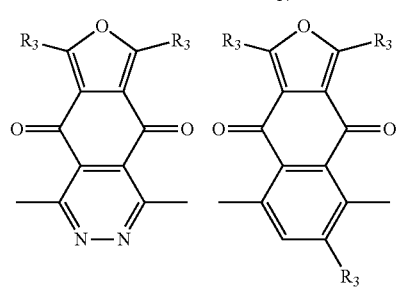
-continued
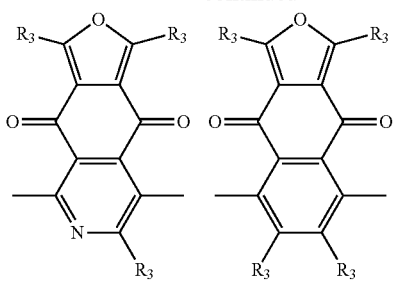
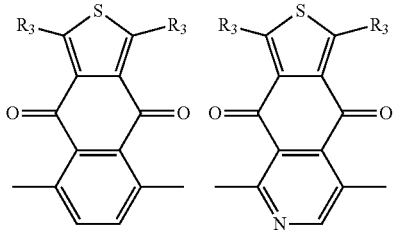
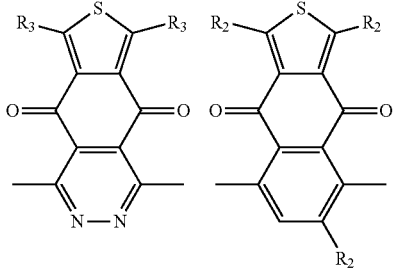
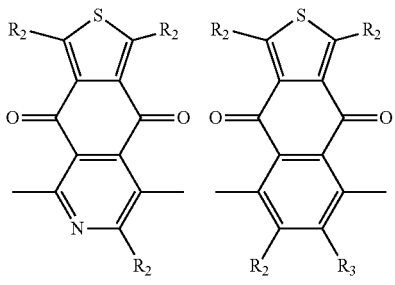
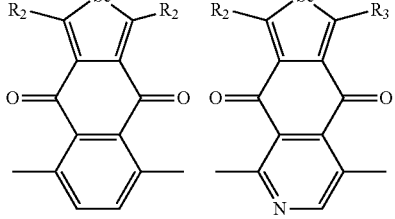
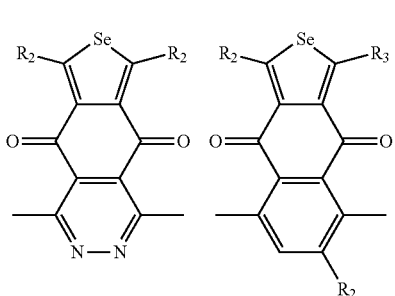

129
-continued
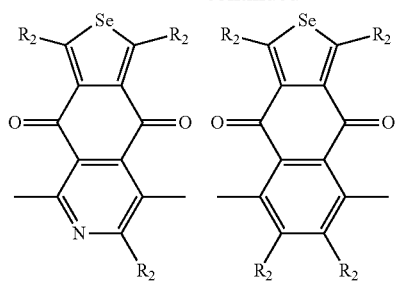
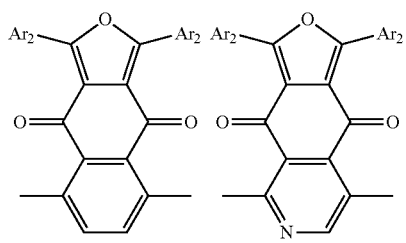
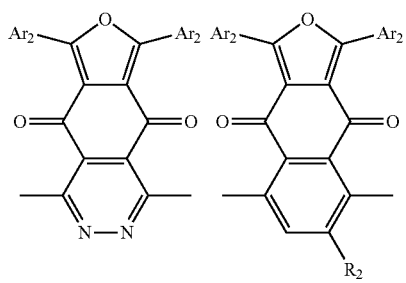
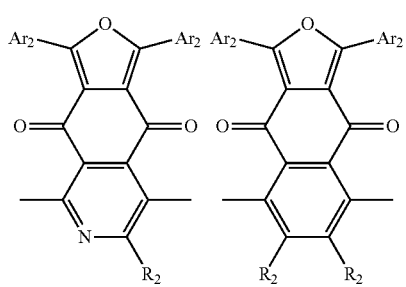
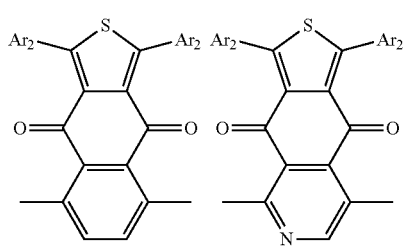
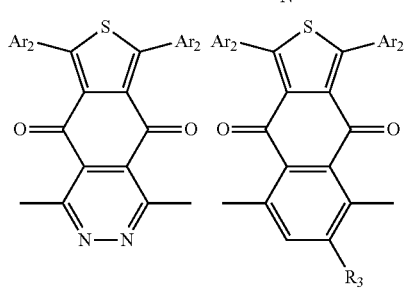
130
-continued
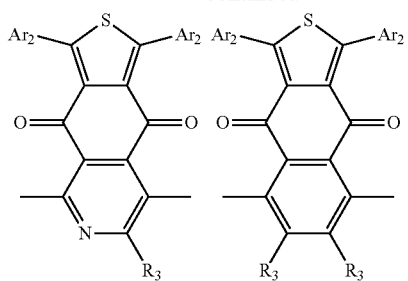
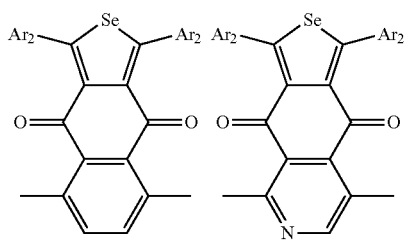
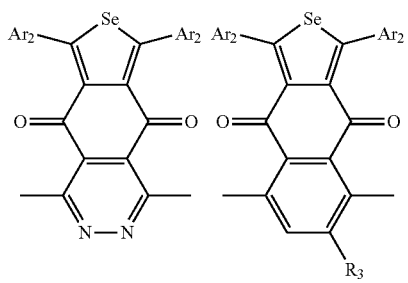
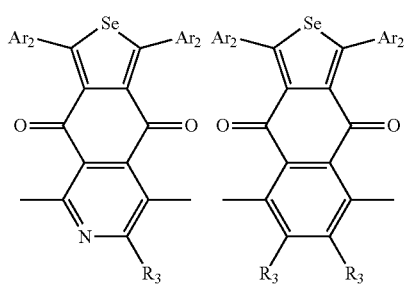
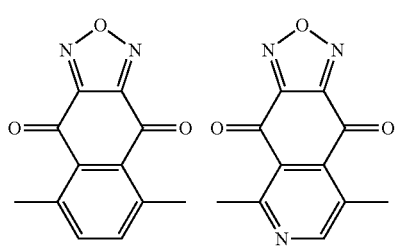
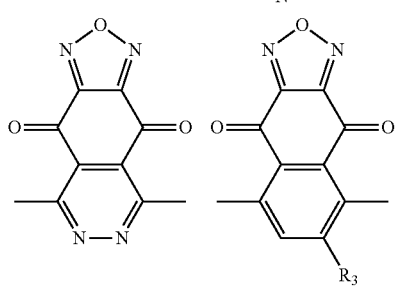

131
-continued
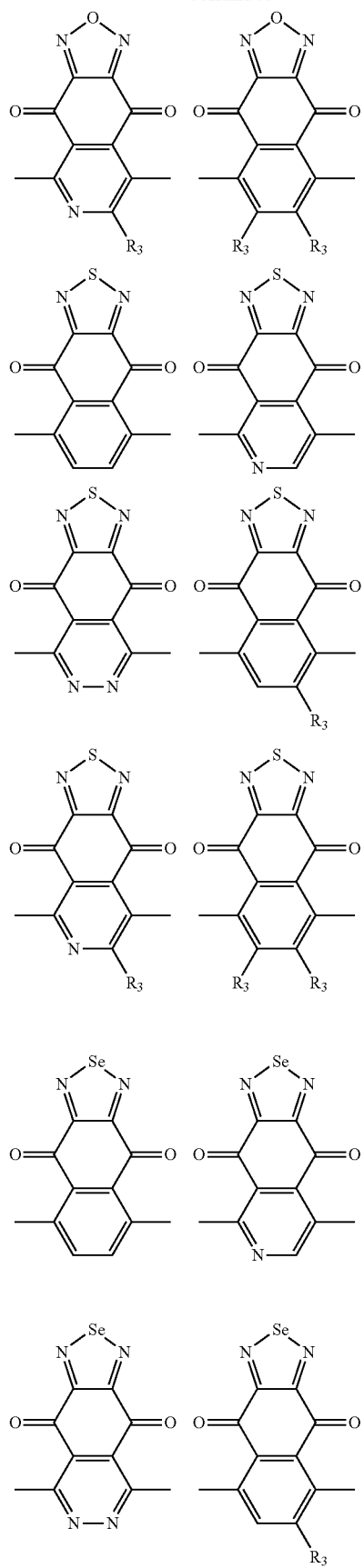
132
-continued
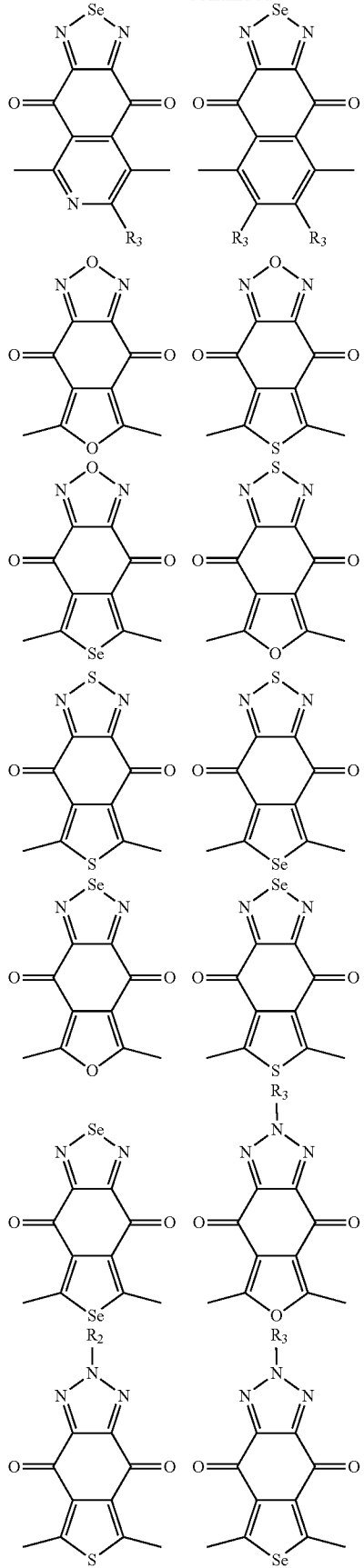

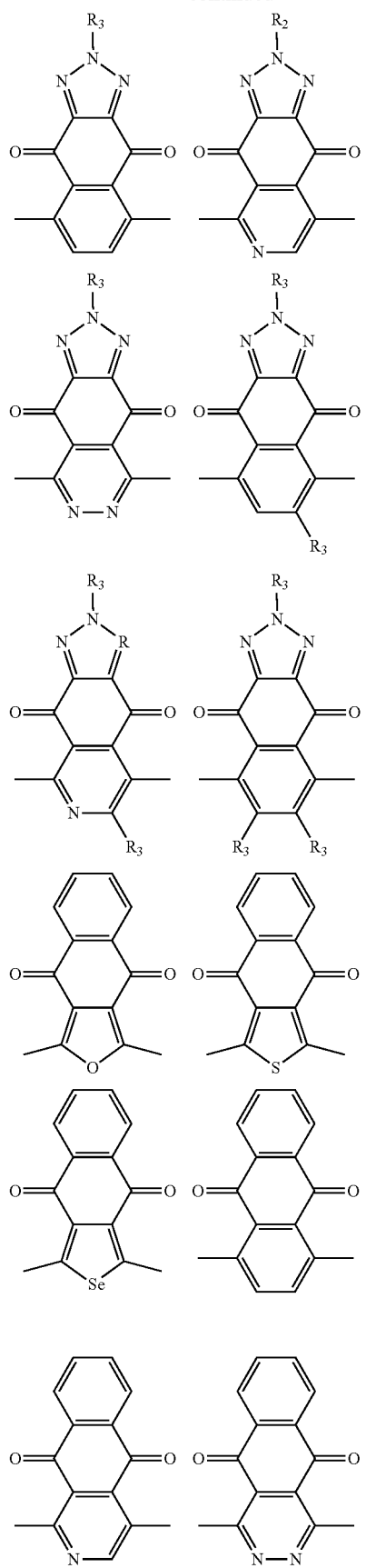
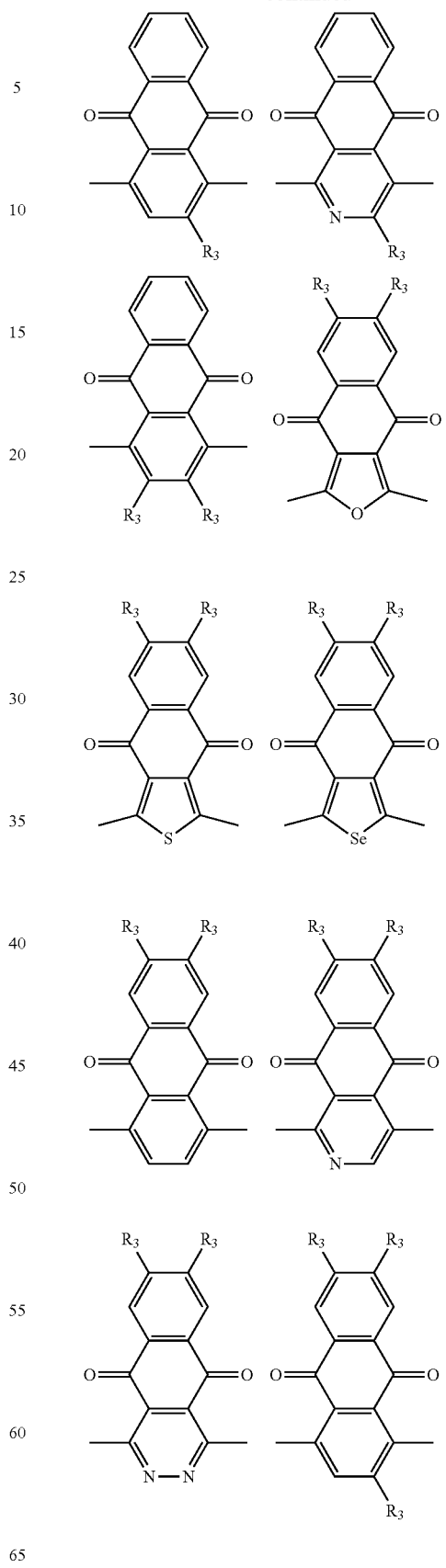

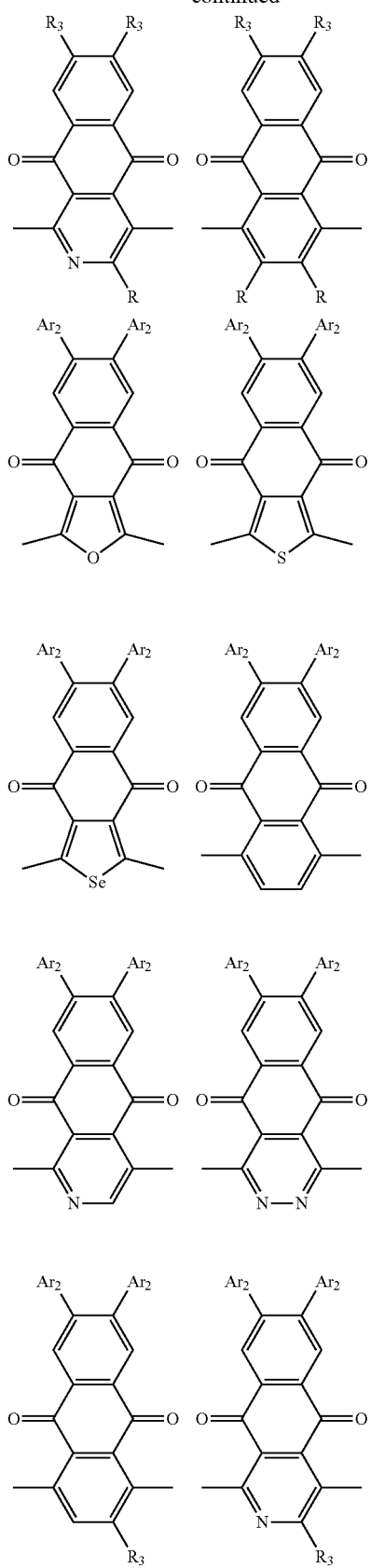
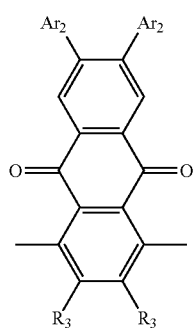
each π is independently selected from one of the following groups:
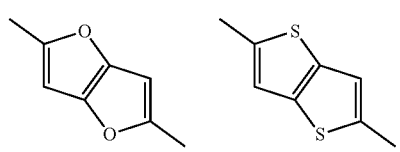
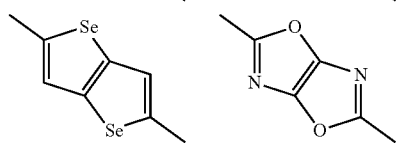
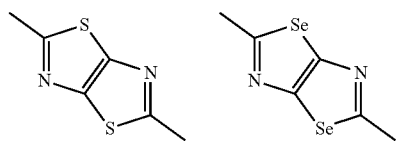
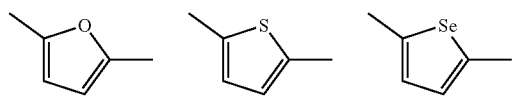
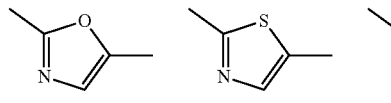
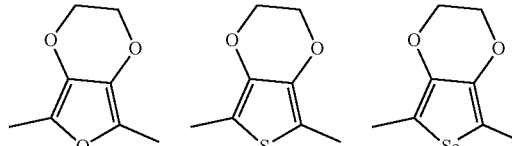
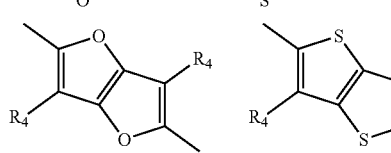
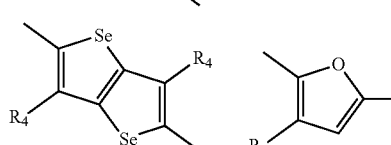
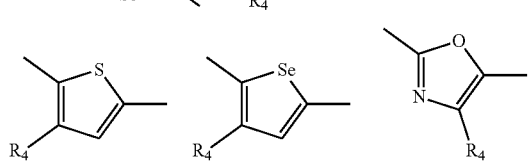

137
-continued

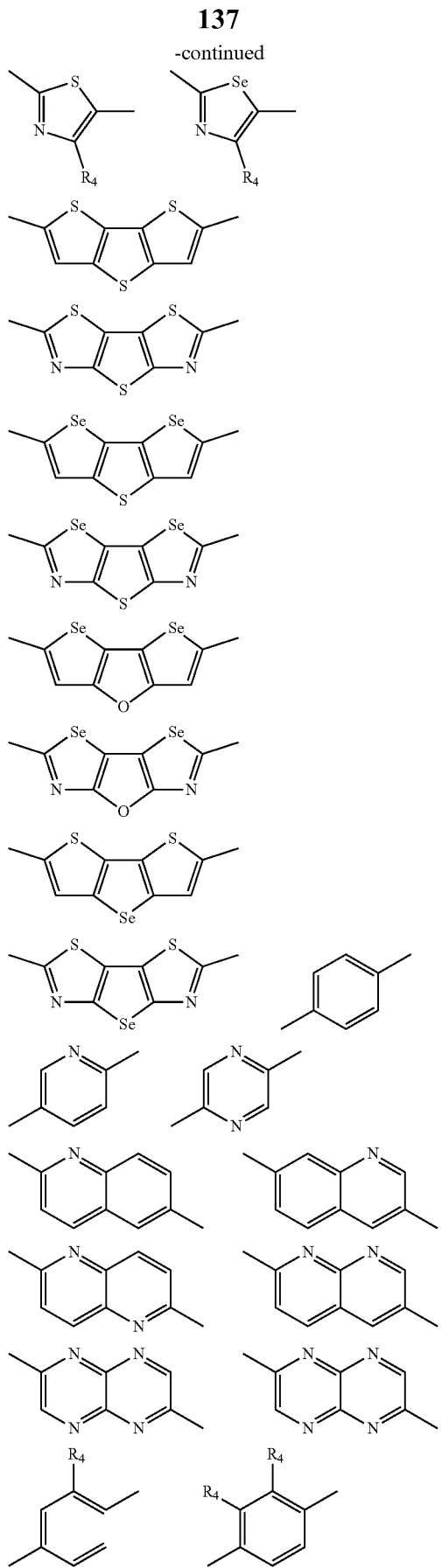

138
-continued

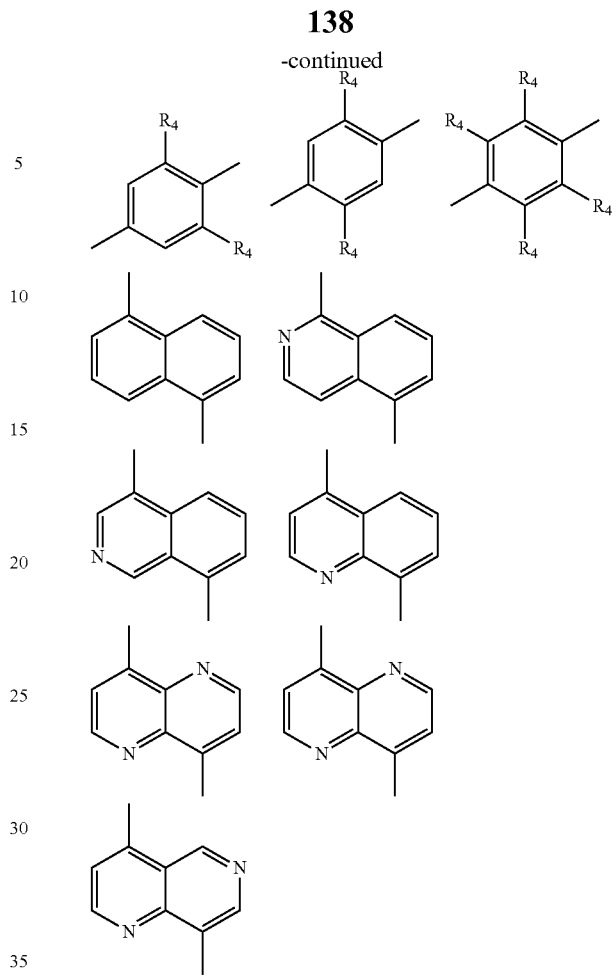

wherein $R_1$, $R_2$, $R_3$ and $R_4$ are independently selected from the group consisting of C1-C30 alkyl, C1-C30 branched alkyl, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain substituted by cyano, nitro, hydroxyl or keto, and halo group;

wherein $Ar_1$ and $Ar_2$ are independently selected from the group consisting of fused aromatic hydrocarbons, benzene fused heterocylic compounds, fused heterocyclic compounds, benzene, five-membered heterocyclic ring and six-membered heterocyclic ring, wherein the benzene, the five-membered heterocyclic ring and the six-membered heterocyclic ring comprise C1-C30 alkyl groups, C1-C30 branched alkane, C1-C30 silane, C1-C30 ester, C1-C30 alkoxy, C1-C30 alkylthio, C1-C30 haloalkyl, C1-C30 carbon chain containing double bond or triple bond, C1-C30 alkyl chain containing cyano, nitro, hydroxyl or keto, or halo group; and m and n are any integers selected from 2 to 200, respectively.

2. The conjugated polymer of the claim 1, wherein an optical energy gap of the conjugated polymer is in a range from 1.85 to 2.5 eV.

3. The conjugated polymer of the claim 1, wherein at least one of the conditions of A1≠A2 and D1≠D2 is established.

4. The conjugated polymer of the claim 1, wherein A1≠A2 and D1=D2.

5. An organic photovoltaic device comprising:
a first electrode;
a second electrode; and
an active layer material disposed between the first electrode and the second electrode, wherein the active layer material comprises a non-fullerene acceptor and a donor, and the donor is the conjugated polymer of the claim 1.

6. The organic photovoltaic device of the claim 5, wherein an optical energy gap of the non-fullerene acceptor is less than or equal to 1.7 eV.

7. The organic photovoltaic device of the claim 5, wherein an optical energy gap of the donor is in a range from 1.85 to 2.5 eV.

* * * * *